(12) United States Patent
Van Dal et al.

(10) Patent No.: US 11,728,244 B2
(45) Date of Patent: Aug. 15, 2023

(54) SEMICONDUCTOR DEVICE AND METHOD FOR FORMING THE SAME

(71) Applicant: TAIWAN SEMICONDUCTOR MANUFACTURING CO., LTD., Hsinchu (TW)

(72) Inventors: Marcus Johannes Henricus Van Dal, Linden (BE); Gerben Doornbos, Kessel-Lo (BE)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 141 days.

(21) Appl. No.: 17/196,623

(22) Filed: Mar. 9, 2021

(65) Prior Publication Data

US 2022/0020666 A1   Jan. 20, 2022

Related U.S. Application Data

(60) Provisional application No. 63/053,234, filed on Jul. 17, 2020.

(51) Int. Cl.
*H01L 23/48* (2006.01)
*H01L 21/768* (2006.01)
*H01L 21/8238* (2006.01)
*H01L 27/092* (2006.01)

(52) U.S. Cl.
CPC ...... *H01L 23/481* (2013.01); *H01L 21/76898* (2013.01); *H01L 21/823821* (2013.01); *H01L 27/0924* (2013.01)

(58) Field of Classification Search
CPC ............. H01L 23/481; H01L 21/76898; H01L 21/823821; H01L 27/0924
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |

(Continued)

*Primary Examiner* — Christine A Enad
(74) *Attorney, Agent, or Firm* — Maschoff Brennan

(57) ABSTRACT

A semiconductor device includes a substrate, a semiconductor fin, a source/drain structure, a first buried power line, a contact, a first through substrate via (TSV), and a second TSV. The substrate has a well region extending a frontside surface of the substrate into the substrate. The semiconductor fin is on the well region. The source/drain structure is on the semiconductor fin. The first buried power line is electrically coupled to the source/drain structure on the first semiconductor fin. The first buried power line has a length extending along a lengthwise direction of the first semiconductor fin and a height extending within the well region. The first TSV extends from a backside surface of the substrate through the substrate to the first buried power line. The second TSV extends from the backside surface of the substrate to the well region.

20 Claims, 59 Drawing Sheets

(56) References Cited

U.S. PATENT DOCUMENTS

| | | | |
|---|---|---|---|
| 2018/0145030 A1* | 5/2018 | Beyne | H01L 23/5283 |
| 2020/0135634 A1* | 4/2020 | Chiang | H01L 21/743 |
| 2020/0203276 A1* | 6/2020 | Hiblot | H01L 21/743 |
| 2022/0013522 A1* | 1/2022 | Li | H01L 21/743 |

* cited by examiner

SEMICONDUCTOR DEVICE AND METHOD FOR FORMING THE SAME

PRIORITY CLAIM AND CROSS-REFERENCE

This application claims priority to U.S. Provisional Application Ser. No. 63/053,234, filed Jul. 17, 2020, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
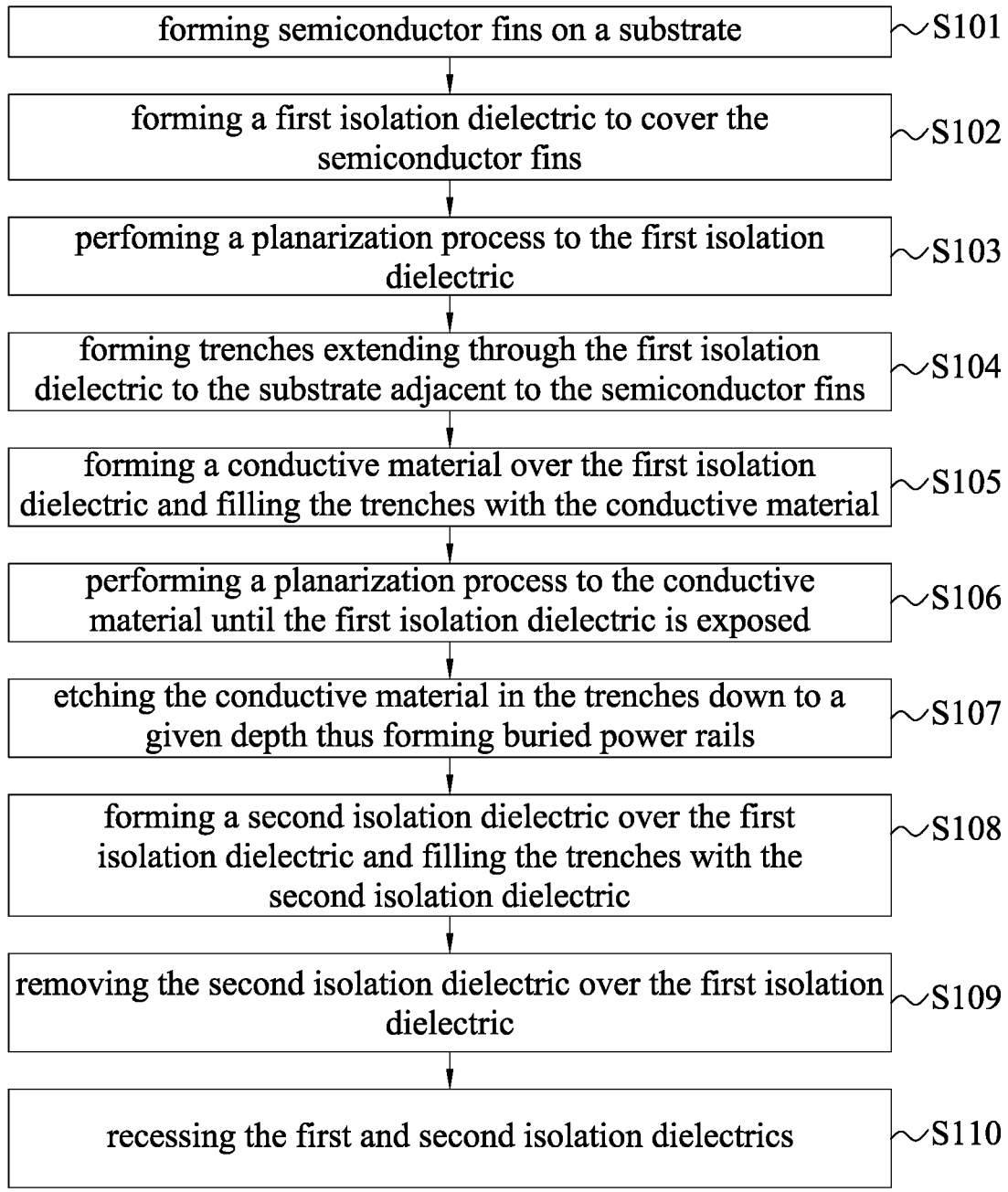
FIGS. 1A and 1B are flow charts of a method M1 for forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
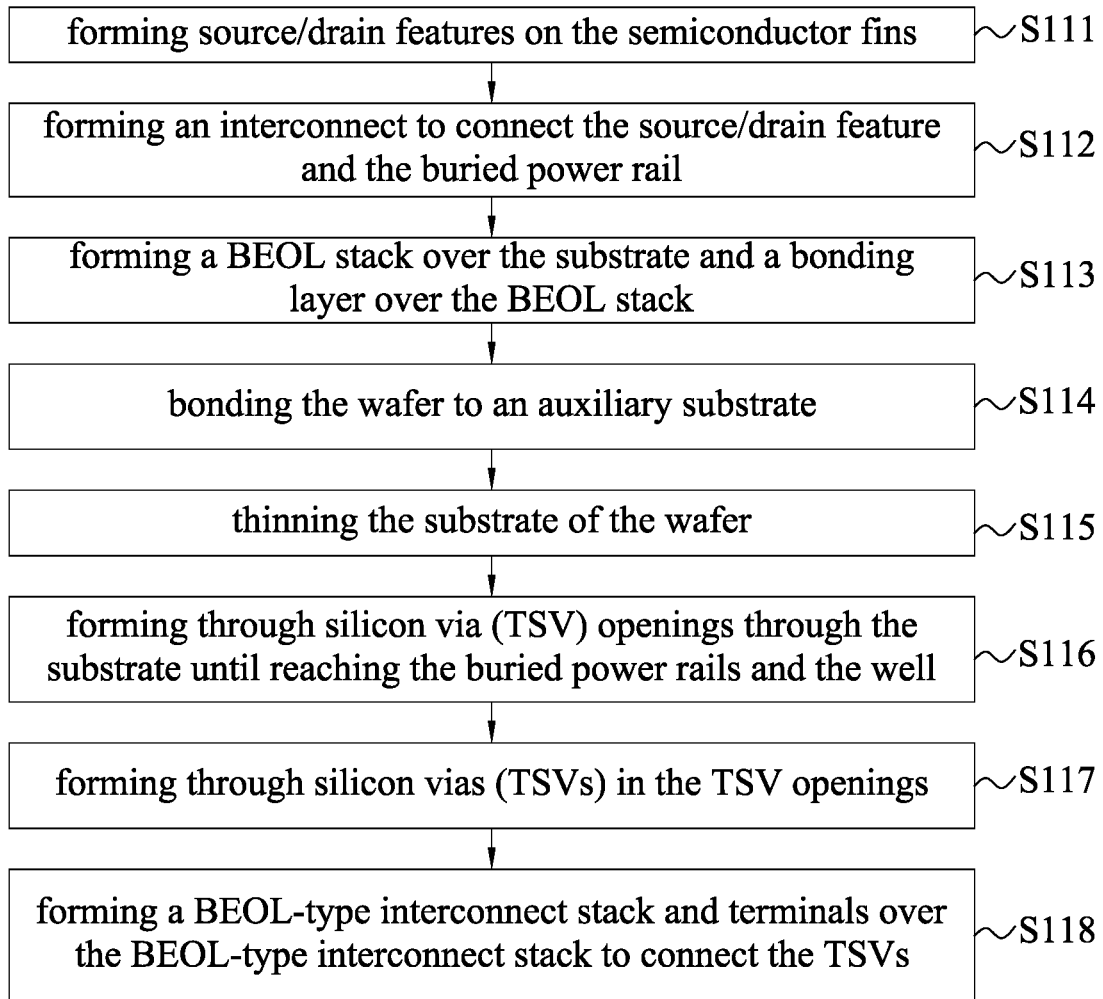

Referring now to FIGS. 1A and 1B, illustrated is an exemplary method M1 for fabrication of a semiconductor device in accordance with some embodiments. The method M1 includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M includes fabrication of a FinFET device. However, the fabrication of FinFET device is merely example for describing the manufacturing process according to some embodiments of the present disclosure.

Figure 2:
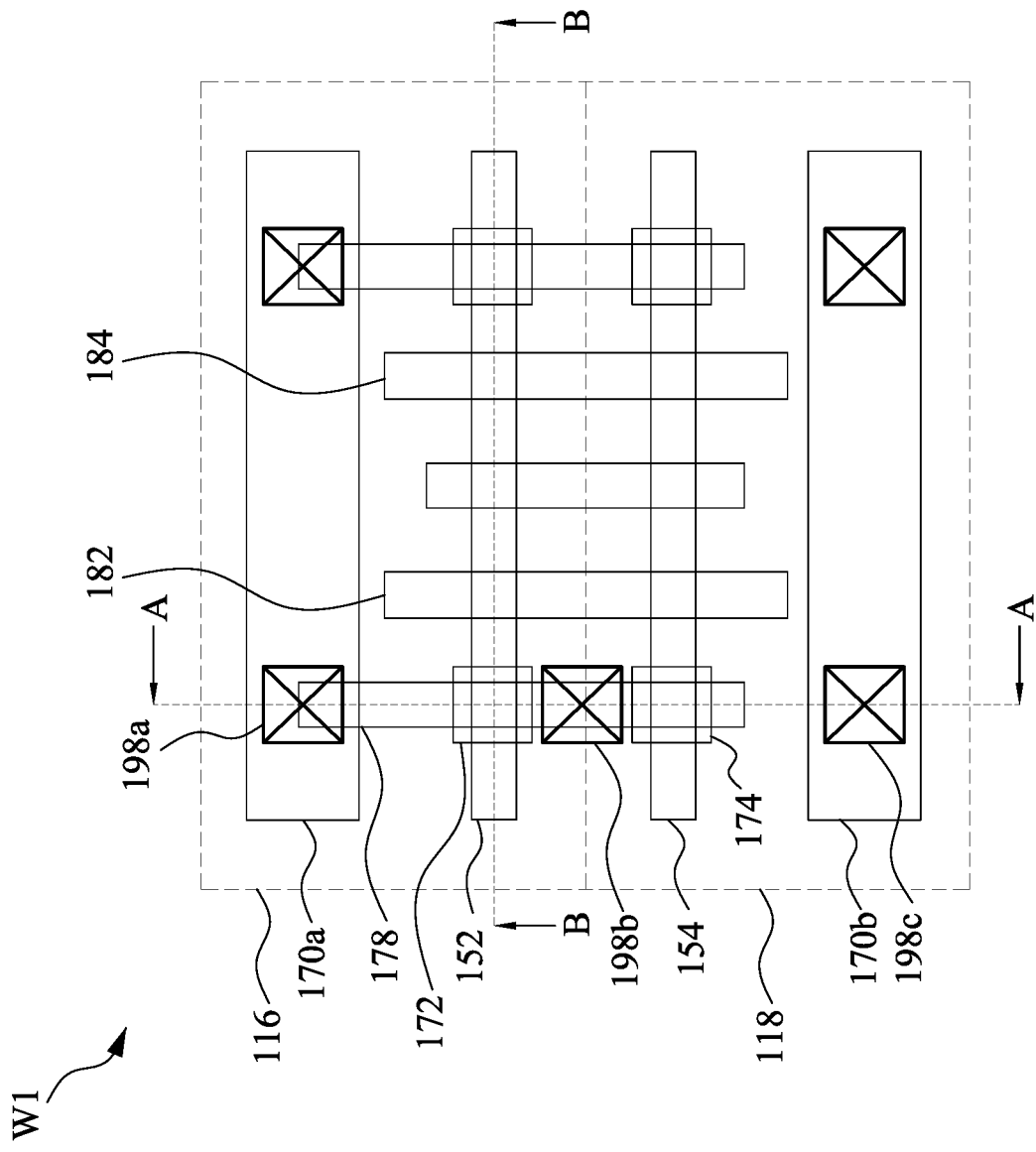
FIGS. 2-13, 14A, 15-17, 18A, 19, 20A, and 20B illustrate a method for manufacturing a semiconductor device at various stages in accordance with some embodiments of the present disclosure.
Figure 3:
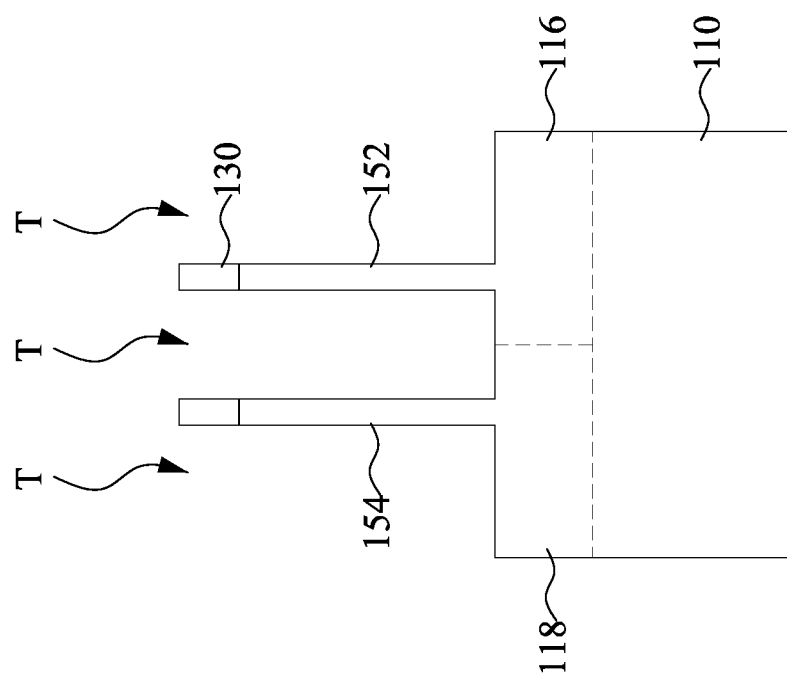
Figure 20A:
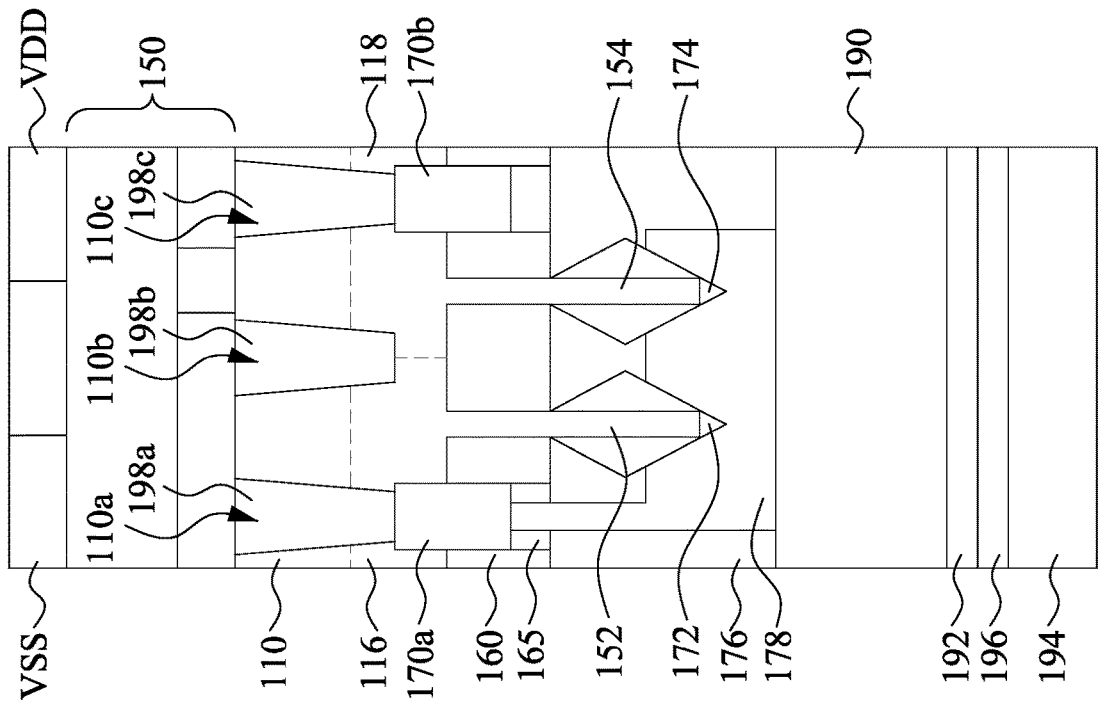
Figure 19:
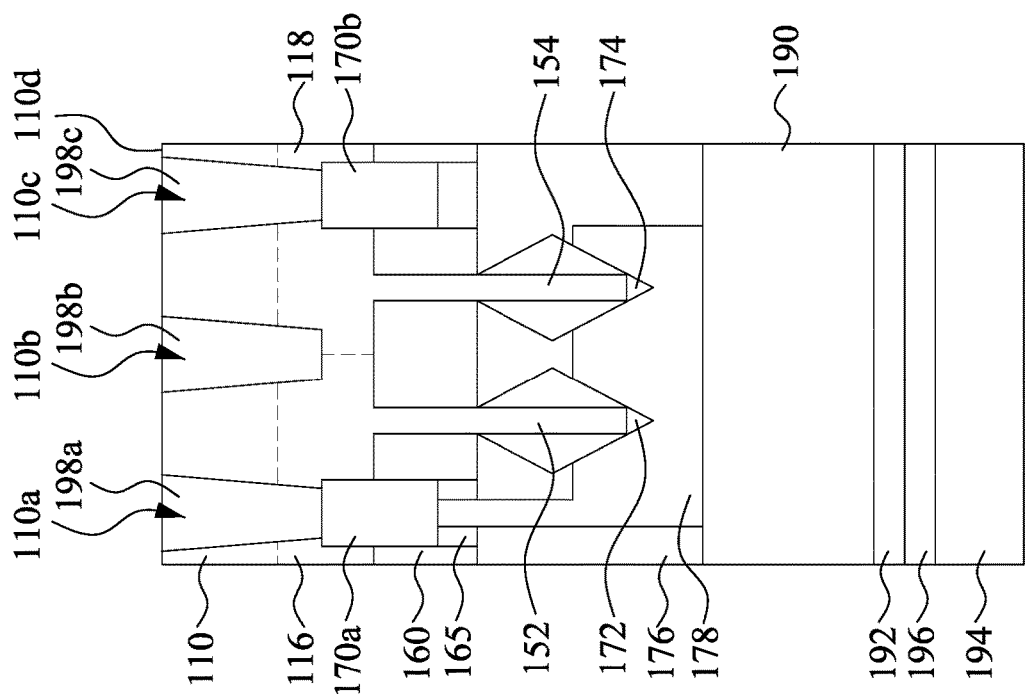
Figure 20B:
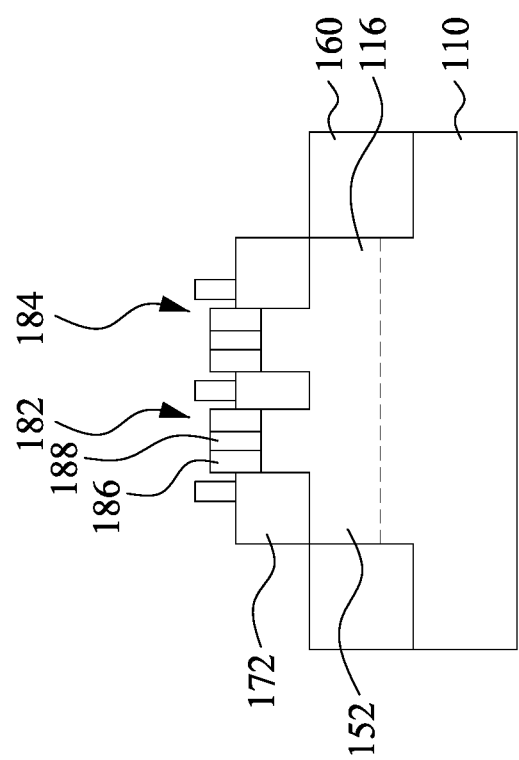

FIGS. 2-20B illustrate a wafer W1 at various stages of the method M1 according to some embodiments of the present disclosure. FIG. 2 is a top view of the wafer W1. FIGS. 2-19 and 20A are cross-sectional views corresponding to line A-A in FIG. 2. FIG. 20B is cross-sectional views along line B-B in FIG. 2 and corresponds to FIG. 20A. The method M1 begins at block S101 where semiconductor fins are formed on a substrate. Referring to FIG. 3, in some embodiments of block S101, a wafer W1 undergoes a series of deposition and photolithography processes, such that a patterned photoresist layer (not shown) and a mask layer 130 are formed on a substrate 110 of the wafer W1. In some embodiments, the mask layer 130 includes a hard mask layer and a pad layer. In some embodiments, the substrate 110 is a semiconductor substrate, such as a bulk semiconductor, a semiconductor-on-insulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 3, well regions 116 and 118 in the substrate 110 which divide the substrate 110 into separate regions for different types of devices or transistors. Example materials of the well regions 116 and 118 include, but are not limited to, semiconductor materials doped with various types of p-type dopants and/or n-type dopants. In some embodiments, the well region 116 includes a p-type dopant and may be referred to as a P-type well region, and the well region 118 includes an n-type dopant and may be referred to as an N-type well region. In the example configuration in FIG. 3, the N-type well region 118 is a region for forming p-channel metal-oxide semiconductor (PMOS) transistors, and the P-type well region 116 is a region for forming n-channel metal-oxide semiconductor (NMOS) transistors. The described conductivity of the well regions 116 and 118 herein is an example. Other arrangements are within the scope of various embodiments.

In some embodiments, the pad layer is a thin film including silicon oxide formed using, for example, a thermal oxidation process. The pad layer may act as an adhesion layer between the substrate 110 and the hard mask layer. The pad layer may also act as an etch stop layer for etching the hard mask layer. In some embodiments, the hard mask layer is formed of silicon nitride, for example, using low-pressure chemical vapor deposition (LPCVD) or plasma enhanced chemical vapor deposition (PECVD). The hard mask layer is used as a hard mask during subsequent photolithography processes. A photoresist layer is formed on the mask layer 130 and is then patterned, forming openings in the photoresist layer, so that regions of the mask layer 130 are exposed.

Then, the substrate 110 is patterned to form one or more semiconductor fins 152 and 154. The mask layer 130 is etched through the photoresist layer exposing the underlying well regions 116 and 118. The exposed well regions 116 and 118 are then etched, forming trenches T. Portions of the well regions 116 and 118 between neighboring trenches T can be referred to as semiconductor fins 152 and 154. After etching the well regions 116 and 118, the photoresist layer is removed. Next, a cleaning step may be optionally performed to remove a native oxide of the semiconductor substrate 110. The cleaning may be performed using diluted hydrofluoric (HF) acid, for example. According to the various aspects of the present disclosure, the semiconductor fins 152 and 154 extend along a first direction. In some embodiments, the semiconductor fins 152 and 154 may also be referred to as oxide-definition (OD) regions. In some embodiments, the well region 116 and/or 118 has a thickness in a range about 10 nm to about 100 nm by way of example but not limitation.

Figure 4:
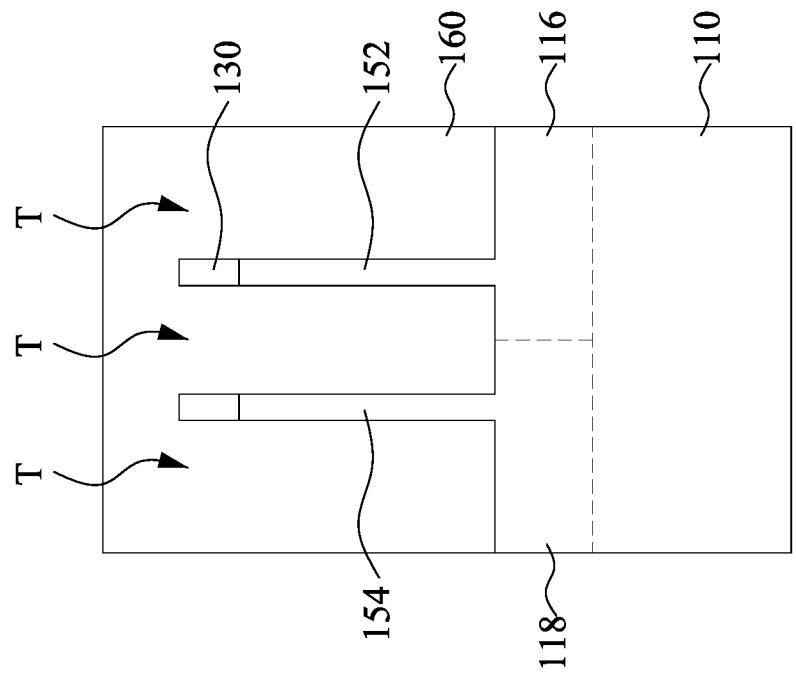

Returning to FIG. 1A, the method M1 then proceeds to block S102 where a first isolation dielectric is formed to cover the semiconductor fins. With reference to FIG. 4, in some embodiments of block S102, an isolation dielectric 160 is formed to overfill the trenches T and cover the semiconductor fins 152 and 154. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 5:
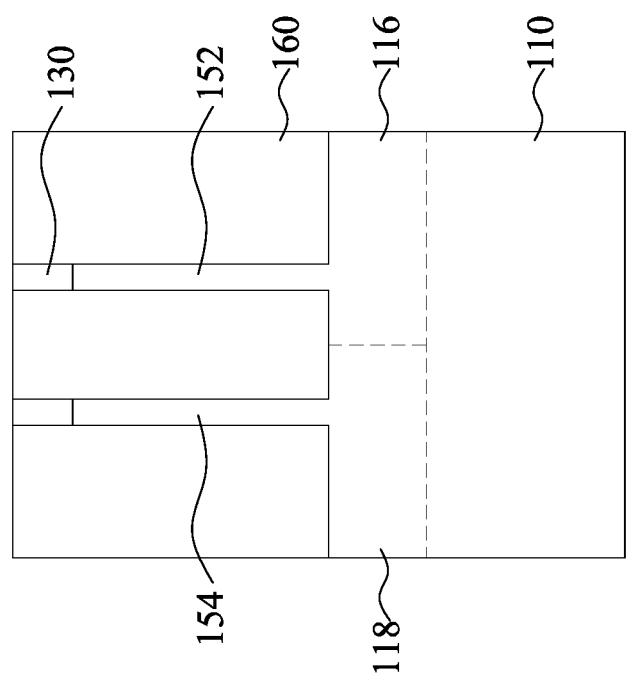

Returning to FIG. 1A, the method M1 then proceeds to block S103 where a planarization process is performed to the first isolation dielectric. With reference to FIG. 5, in some embodiments of block S103, a planarization process such as chemical mechanical polish (CMP) is performed to remove the excess isolation dielectric 160 over the semiconductor fins 152 and 154. In some other embodiments, the planarization process stops when the mask layer 130 is exposed. In such embodiments, the mask layer 130 may act as the CMP stop layer in the planarization. In some embodiments, the planarization process may also remove the mask layer 130 such that top surfaces of the semiconductor fins 152 and 154 are exposed. If the mask layer 130 is not removed by the planarization process, the mask layer 130, if formed of silicon nitride, may be remove by a wet process using hot $H_3PO_4$, and if formed of silicon oxide, may be removed using diluted HF.

Figure 6:
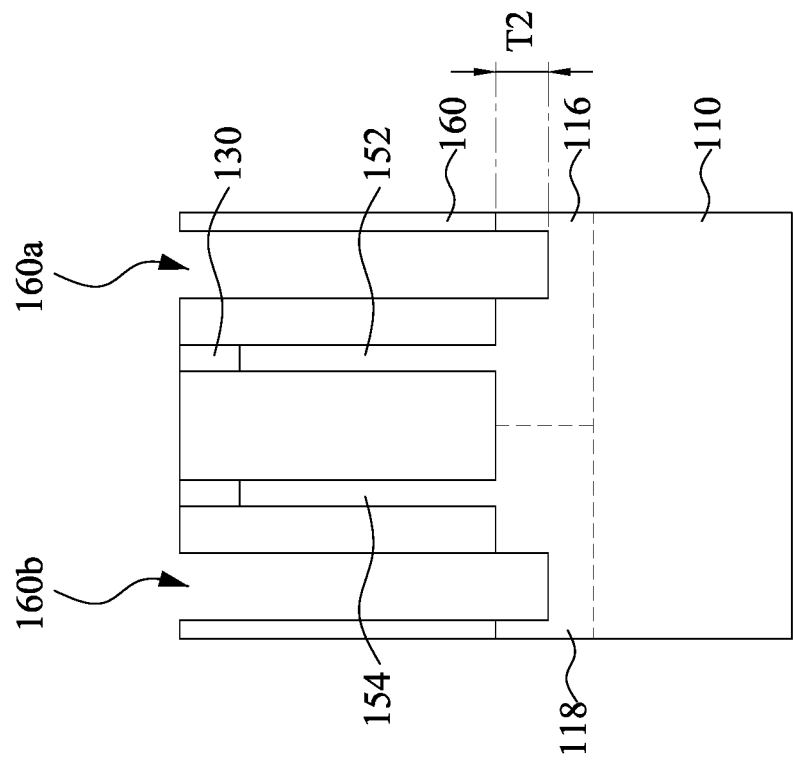

Returning to FIG. 1A, the method M1 then proceeds to block S104 where trenches are formed to extend through the first isolation dielectric into the substrate adjacent to the semiconductor fins. With reference to FIG. 6, in some embodiments of block S104, a patterned mask layer (not shown) is formed over the isolation dielectric 160. In some embodiments, the mask layer is formed by spin coating a resist material (e.g., the mask layer may be also referred to as a photo resist layer), followed by a process, such as a soft baking process and a hard baking process (may be also referred to as a pre-exposure baking). In some embodiments, the mask layer is a DUV resist such as a krypton fluoride (KrF) resist or an argon fluoride (ArF) resist. In some embodiments, the mask layer is an I-line resist, a EUV resist, an electron beam (e-beam) resist, or an ion beam resist. In some embodiments, the mask layer is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer is a negative resist. The negative resist is soluble in a developer but becomes insoluble upon radiation.

After coating the mask layer over the isolation dielectric 160, the mask layer is exposed to a radiation through a mask. After exposing the mask layer to the radiation is complete, the exposed mask layer undergoes one or more post-exposure baking (PEB) processes. Then, a developing process is performed, such that portions of the exposed mask layer are removed, and the mask layer may act as an etch mask to protect the rest of the isolation dielectric 160 from the etching process. Referring to FIG. 6, when the etching process is complete, the trenches 160a and 160b are formed to run through the isolation dielectric 160 and to have bottoms at positons in the well regions 116 and 118. In some embodiments, the trench 160a and/or 160b in the well region 116 and/or 118 has a depth T2 in a range from about 30 nm to about 200 nm by way of example but not limitation.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 7:
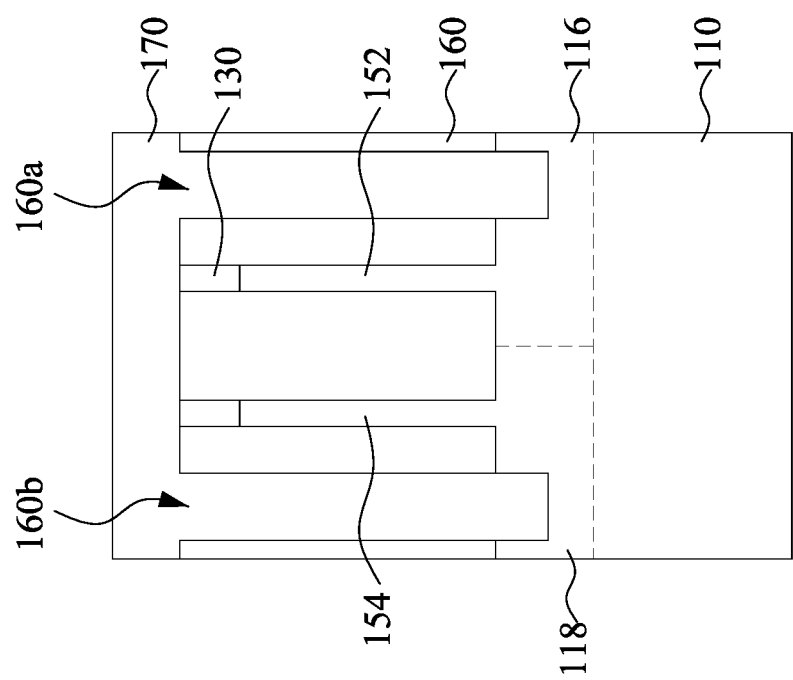

Returning to FIG. 1A, the method M1 then proceeds to block S105 where a conductive material is formed over the first isolation dielectric and filled in the trenches. With reference to FIG. 7, in some embodiments of block S105, the trenches 160a and 160b are filled with a conductive material 170. In some embodiments, the conductive material 170 may include metal, such as tungsten (W), ruthenium (Ru), aluminum (Al), copper (Cu), or other suitable conductive material. In some embodiments, the conductive material 170 may be deposited by CVD, physical vapor deposition (PVD), sputter deposition, or other techniques suitable for depositing conductive materials.

Figure 8:
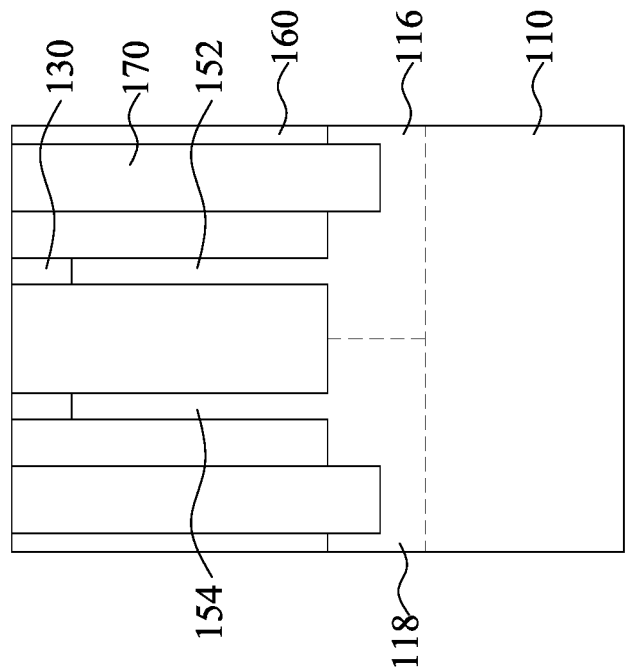

Returning to FIG. 1A, the method M1 then proceeds to block S106 where a planarization process is performed to the conductive material. With reference to FIG. 8, in some embodiments of block S106, a planarization process such as chemical mechanical polish (CMP) is performed to remove the excess conductive material 170 over the isolation dielectric 160. In some other embodiments, the planarization process stops when the isolation dielectric 160 is exposed. In such embodiments, the isolation dielectric 160 may act as the CMP stop layer in the planarization.

Figure 9:
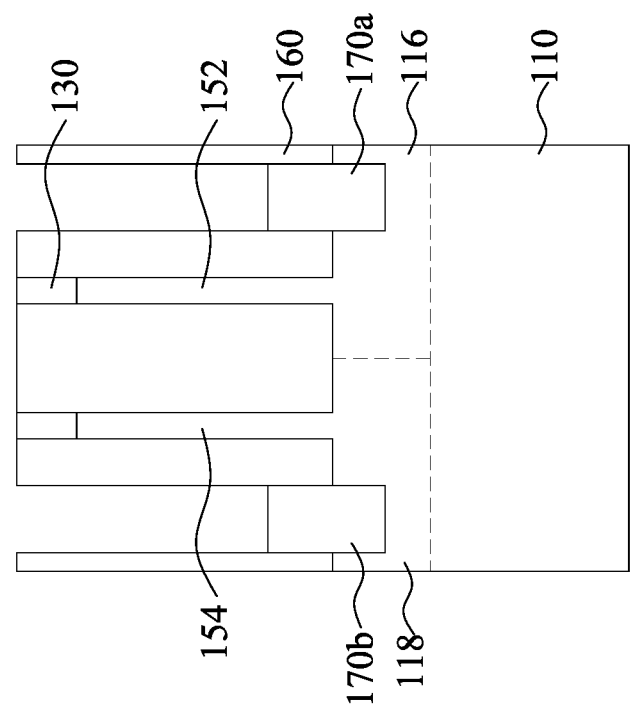

Returning to FIG. 1A, the method M1 then proceeds to block S107 where the conductive material is etched in the trenches down to a given depth, leaving a portion of conductive material in the trenches thus forming buried power rails of this height. With reference to FIG. 9, in some embodiments of block S107, an etching process is performed to thin down the conductive material 170, such that a top surface of the conductive material 170 is lowered to a level below a top surface of the isolation dielectric 160, and thus buried power rails 170a and 170b are formed. In some embodiments, the buried power rails 170a and 170b may also be referred to as conductive rails 170a and 170b. In some embodiments, the buried power rail 170a and/or 170b may also be referred to as a supply power rail and/or ground reference rail. For example, the buried power rail 170a may be referred to as a ground reference rail and the buried power rail 170b may be referred to as a supply power rail. The buried power rail 170a and/or 170b extends along a lengthwise direction of the semiconductor fin 152 and/or 154 as shown in FIG. 2. In some embodiments, the thinning down of the conductive material 170 may include a dry etching process or other suitable etching processes. In some embodiments, the etch process include using a technique and etchant selected to etch the conductive material 170 without significant etching of the surrounding structures (i.e., isolation dielectric 160).

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 10:
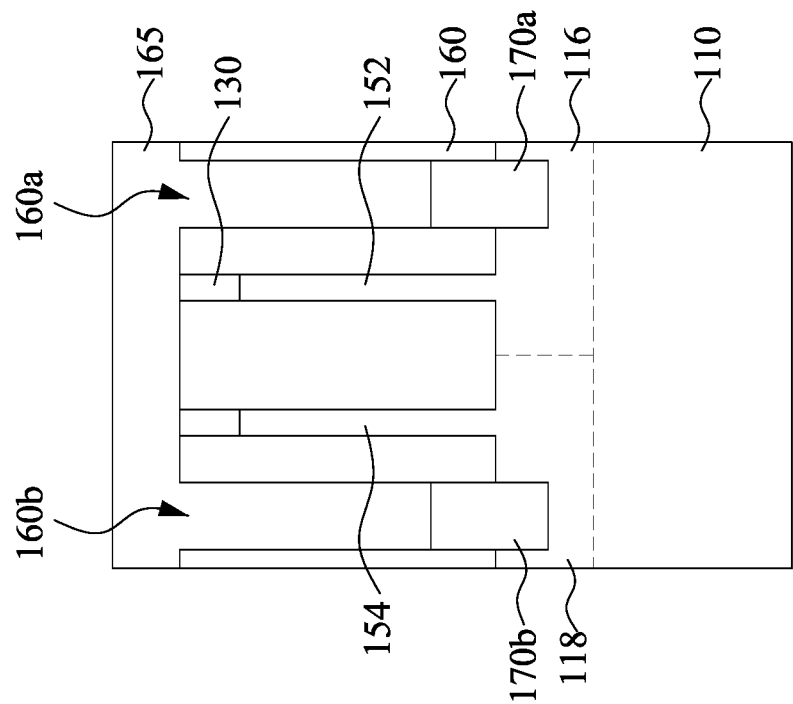

Returning to FIG. 1A, the method M1 then proceeds to block S108 where a second isolation dielectric is formed over the first isolation dielectric and filled in the trenches to land on the buried power rails. With reference to FIG. 10, in some embodiments of block S108, an isolation dielectric 165 is formed to overfill the trenches 160a and 160b to land on the buried power rails 170a and 170b and covers the isolation dielectric 160. The isolation dielectric 165 in the trenches 160a and 160b can be referred to as a shallow trench isolation (STI) structure. In some embodiments, the isolation dielectric 165 is made of silicon oxide, silicon nitride, silicon oxynitride, fluoride-doped silicate glass (FSG), or other low-K dielectric materials. In some embodiments, the isolation dielectric 165 has a material different than the isolation dielectric 160. In some embodiments, the isolation dielectric 165 has a material the same as the isolation dielectric 160.

In some embodiments, the isolation dielectric 165 may be formed using a high-density-plasma (HDP) chemical vapor deposition (CVD) process, using silane ($SiH_4$) and oxygen ($O_2$) as reacting precursors. In some other embodiments, the isolation dielectric 165 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 165 may be formed using a spin-on-dielectric (SOD) process, such as hydrogen silsesquioxane (HSQ) or methyl silsesquioxane (MSQ). Other processes and materials may be used. In some embodiments, the isolation dielectric 165 can have a multi-layer structure, for example, a thermal oxide liner layer with silicon nitride formed over the liner. Thereafter, a thermal annealing may be optionally performed to the isolation dielectric 165.

Figure 11:
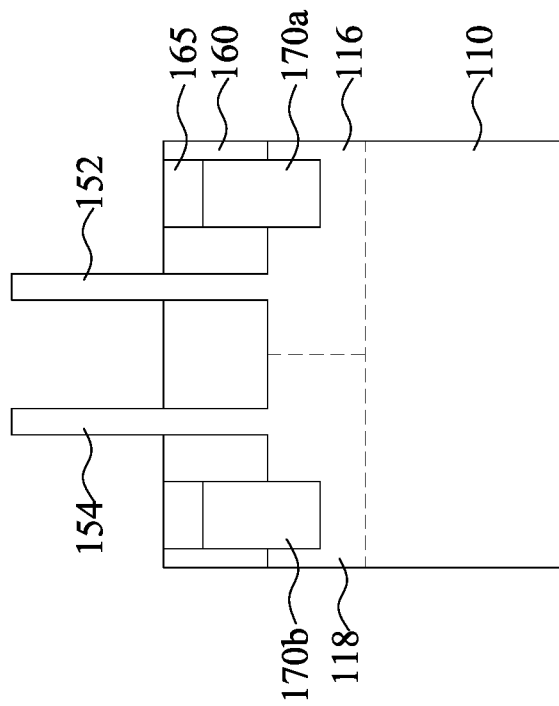

Returning to FIG. 1A, the method M1 then proceeds to block S109 where the second isolation dielectric over the first isolation dielectric is removed. With reference to FIG. 11, in some embodiments of block S109, a planarization process such as chemical mechanical polish (CMP) is performed to remove the excess isolation dielectric 165 over the isolation dielectric 160. In some other embodiments, the planarization process stops when the isolation dielectric 160 is exposed. In such embodiments, the isolation dielectric 160 may act as the CMP stop layer in the planarization. In some other embodiments, the planarization process stops when the mask layer 130 is exposed. In such embodiments, the mask layer 130 may act as the CMP stop layer in the planarization. In some embodiments, the planarization process may also remove the mask layer 130 such that top surfaces of the semiconductor fins 152 and 154 are exposed.

Figure 12:
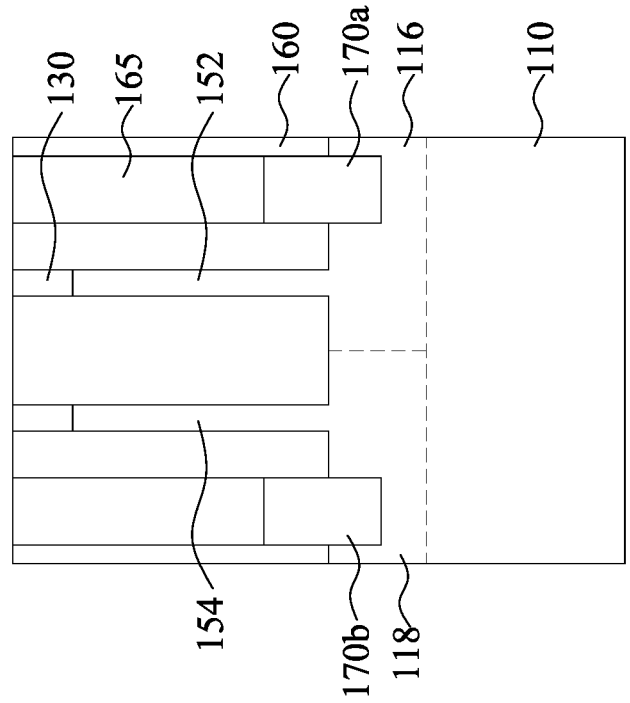

Returning to FIG. 1A, the method M1 then proceeds to block S110 where the first and second isolation dielectrics are recessed. With reference to FIG. 12, in some embodiments of block S110, the isolation dielectrics 160 and 165 are recessed, for example, through an etching operation, in which diluted HF, SiCoNi (including HF and $NH_3$), or the like, may be used as the etchant. After recessing the isolation dielectric 165, a portion of the semiconductor fin 152 and a portion of the semiconductor fin 154 are higher than a top surface of the isolation dielectric 160 and higher than a top surface of the isolation dielectric 165.

It is understood that the blocks S101-S110 described above are merely an example of how the semiconductor fins 152 and 154, the isolation dielectrics 160 and 165, and the buried power rails 170a and 170b are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fins 152 and 154 can be recessed, and a material different from the recessed semiconductor fins 152 and 154 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 152 or the semiconductor fin 154 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also be used to refer to processes in which the device or substrate being processed is not exposed to an external environment (e.g., external to the processing system).

This is followed by the gate formation which is shown in FIG. 2, and which may be done by a technique, for example a replacement gate technique. The gate structures 182 and 184 shown in FIG. 2 are formed perpendicularly to the semiconductor fins 152 and 154.

Figure 13:
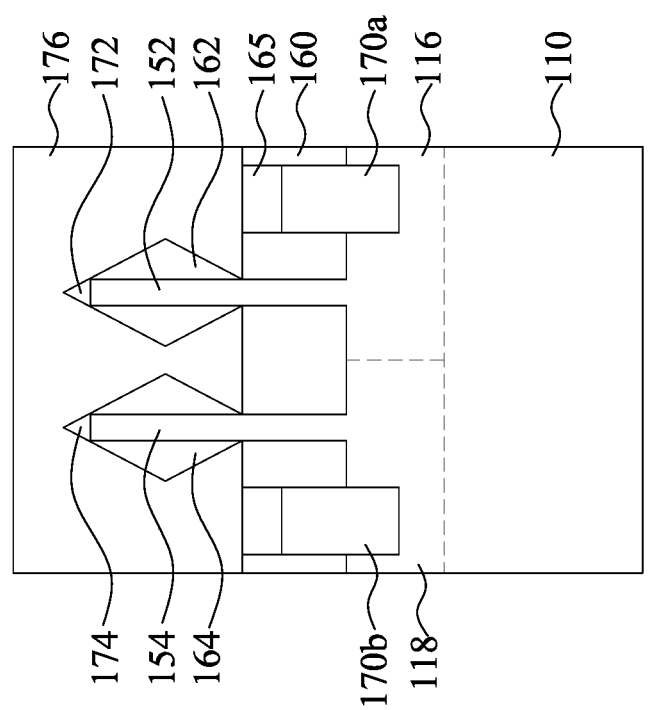

Returning to FIG. 1B, the method M1 then proceeds to block S111 where source/drain features are formed on the semiconductor fins. With reference to FIG. 13, in some embodiments of block S111, the source/drain features 172 and 174 may be formed by performing an epitaxial growth process that provides epitaxy materials 162 and 164 cladding the portions of the semiconductor fins 152 and 154. Source/drain features 172 and 174 are formed on the substrate 110 adjacent to the gate structures 182 and 184 shown in FIG. 2. The source/drain features 172 and 174 include materials 162 and 164 formed by epitaxially growing a semiconductor material on the exposed semiconductor fins 152 and 154. In other words, the materials 162 and 164 are formed around the semiconductor fins 152 and 154 adjacent the gate structures 182 and 184 shown in FIG. 2; this may be referred to as forming a "cladding" around the semiconductor fins 152 and 154. Thus, the source/drain features 172 and 174 include the semiconductor fins 152 and 154 and the epitaxially grown materials 162 and 164 are formed. It is noted that these features may be formed without recessing the semiconductor fins 152 and 154.

In various embodiments, the grown semiconductor materials 162 and 164 may include Ge, Si, GaAs, AlGaAs, SiGe, GaAsP, SiP, or other suitable material. In some embodiments, the materials 162 and 164 may be in-situ doped during the epi process. For example, in some embodiments, epitaxially grown materials 162 and 164 may be doped with boron. In some embodiments, epitaxially grown materials 162 and 164 may be doped with carbon to form Si:C source/drain features, phosphorous to form Si:P source/drain features, or both carbon and phosphorous to form SiCP source/drain features. In an embodiment, the semiconductor fins 152 and 154 are made of silicon and the epitaxially grown materials 162 and 164 also are silicon. In some embodiments, the semiconductor fins 152 and 154 and the epitaxially grown materials 162 and 164 may comprise a similar material, but be differently doped. In other embodiments, the semiconductor fins 152 and 154 include a first semiconductor material, the epitaxially grown materials 162 and 164 include a second semiconductor different than the first semiconductor material. In some embodiments, the epitaxially grown materials 162 and 164 are not in-situ doped, and, for example, instead an implantation process is performed to dope the epitaxially grown materials 162 and 164.

In some embodiments, a dummy gate structure (not shown) including a gate dielectric and a gate electrode over the gate dielectric is formed to extend across the semiconductor fins 152 and 154 prior to forming the source/drain features 172 and 174. In some embodiments, in order to form the dummy gate structure, a gate dielectric layer is formed over the semiconductor fins 152 and 154, followed by a dummy gate electrode layer. The gate dielectric layer and the dummy gate electrode layer are then patterned, respectively forming the gate dielectric and the gate electrode. Hard masks may be formed on the dummy gate structure for process reasons, in which the hard masks may include silicon nitride. The channel portions of the semiconductor fins 152 and 154 are covered by the dummy gate structure, and the source/drain portions of the semiconductor fins 152 and 154 are uncovered by the dummy gate structure. In other words, the dummy gate structure is formed over the channel portions of the semiconductor fins 152 and 154.

In some embodiments, a plurality of gate spacers 186 as shown in FIG. 20B are formed respectively on opposite sidewalls of the dummy gate structure prior to forming the source/drain features 172 and 174. In some embodiments, at least one of the gate spacers 186 includes single or multiple layers. The gate spacers 186 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other suitable methods. The gate spacers 186 may then be patterned, such as by one or more etch(es) to remove the portions of the dielectric layer(s) from the horizontal surfaces of the structure.

In FIG. 13, an interlayer dielectric (ILD) layer 176 is formed over the source/drain features 172 and 174 and the dummy gate structure. That is, the source/drain features 172 and 174 are covered and protected by the ILD layer 176 during process(es) performed later. Moreover, the ILD layer 176 is formed over the gate spacers 186 shown in FIG. 20B and the dummy gate structure. A chemical mechanical planarization (CMP) process is performed to remove portions of the ILD layer 176. During the CMP process, the dummy gate structures are exposed. The remaining portions of the ILD layer 176 cover the source/drain features 172 and 174. The ILD layer 176 may include silicon oxide, oxynitride or other suitable materials.

In some embodiments, a replacement gate (RPG) process scheme is employed. In the RPG process scheme, a dummy gate structures are formed in advance and is replaced by a metal gate. In some embodiments, the dummy gate structures (not shown) are removed to form an opening between the gate spacers 186. The dummy gate structure may be removed by dry etch, wet etch, or a combination of dry and wet etch. For example, a wet etch process may include exposure to a hydroxide containing solution (e.g., ammonium hydroxide), deionized water, and/or other suitable etchant solutions. In some embodiments, the dummy gate structures provide a constraint force on the channel portions of the semiconductor fins 152 and 154. After the dummy gate structures are removed, the constraint force applied on the channel portion of the semiconductor fins 152 and 154 disappears accordingly, such that the in-plane tensile strain on the channel portions of the semiconductor fins 152 and 154, induced by the source/drain features 172 and 174, may be enhanced.

A plurality of gate electrodes 188 as shown in FIG. 20B are formed in the openings between the gate spacers 186, respectively. In other words, the dummy gate structures are replaced by the gate electrodes 188, such that the spacers 186 are disposed on sidewalls of the gate electrode 188. The gate electrodes 188 are formed over the channel portions of the semiconductor fins 152 and 154. The gate electrodes 188 may include a metal, metal alloy, and/or metal silicide. Additionally, the formation of the gate electrodes 188 may include depositions to form various gate materials, one or more liner layers, and one or more CMP processes to remove excessive gate materials and thereby planarize top surfaces of the gate electrodes 188.

In some other embodiments, a work function metal layer included in the gate electrodes 188 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the gate electrode 188 may be a p-type metal gate including a p-type work function layer. In some embodiments, a capping layer included in the gate electrode 188 may include refractory metals and their nitrides (e.g. TiN, TaN, $W_2N$, TiSiN, TaSiN). The cap layer may be deposited by PVD, CVD, metal-organic chemical vapor deposition (MOCVD) and ALD. In some embodiments, a fill layer included in the gate electrode 188 may include tungsten (W). The metal layer may be deposited by ALD, PVD, CVD, or other suitable process.

A removing process is performed to the gate electrodes 188 to partially remove the gate electrodes 188. The etching process(es) may include a wet etch, a dry etch, and/or a combination thereof. As an example, a wet etching solution may include $HNO_3$, $NH_4OH$, KOH, HF, HCl, NaOH, $H_3PO_4$, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etching process is chosen to selectively etch the gate electrodes 188 without substantially etching the ILD layer 176 and the gate spacers 186. In some embodiments, the etching process is controlled such that top surfaces of the remaining the gate electrodes 188 are lower than the top surfaces of the ILD layer 176 and the gate spacers 186. The term "substantially" as used herein may be applied to modify any quantitative representation which could permissibly vary without resulting in a change in the basic function to which it is related.

Figure 14A:
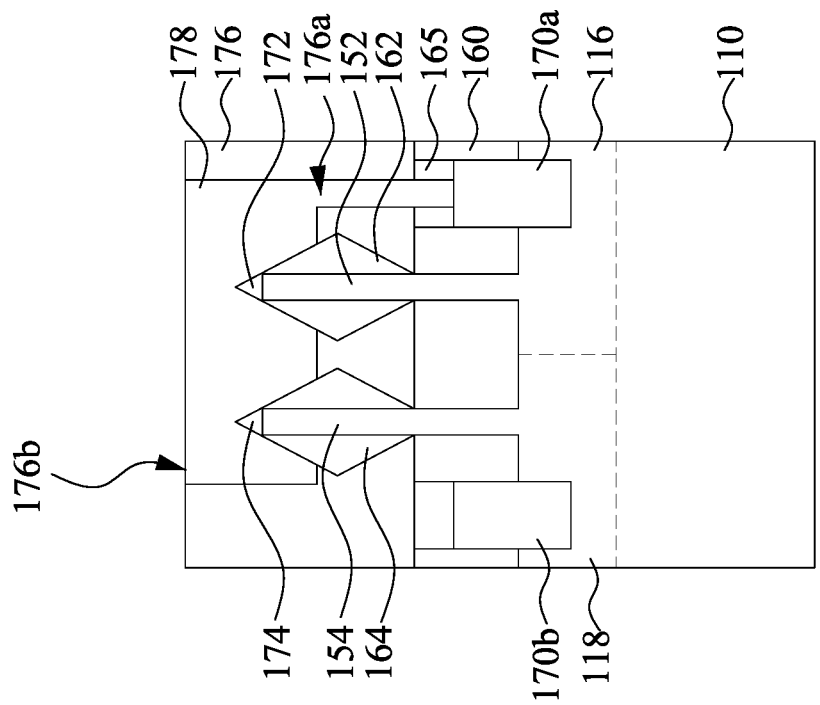

Returning to FIG. 1B, the method M1 then proceeds to block S112 where an interconnect is formed to connect the source/drain feature and the buried power rail. With reference to FIG. 14A, in some embodiments of block S112, a trench 176b is formed in the ILD layer 176 to expose the source/drain features 172 and 174, and a via opening 176a is formed extending from a bottom of the trench 176b downwardly to the buried power rail 170a. The trench 176b and the via opening 176a can be formed by dual damascene-like techniques such as, for example, a trench-first patterning method or a via-first patterning method. Suitable photolithography and etching techniques can be employed in the trench-first patterning method or the via-first patterning method. In FIG. 14A, a bottom of the trench 176b is at a position higher than maximal widths of the source/drain features 172 and 174. In some embodiments, a bottom of the trench 176b may be at a position lower than maximal widths of the source/drain features 172 and 174 and higher than a top surface of the isolation dielectric 160. In some embodiments, a bottom of the trench 176b may be level with the top surface of the isolation dielectric 160. Then, a conductive material is formed to fill in the via opening 176a and the trench 176b of the ILD layer 176 to form an interconnect 178a that connects the source/drain features 172 and 174 to the buried power rail 170a. In some embodiments, a conductive material is formed to fill in a trench of the ILD layer 176 to form an interconnect 178b that connects the source/drain features as shown in FIG. 2.

Figure 14B:
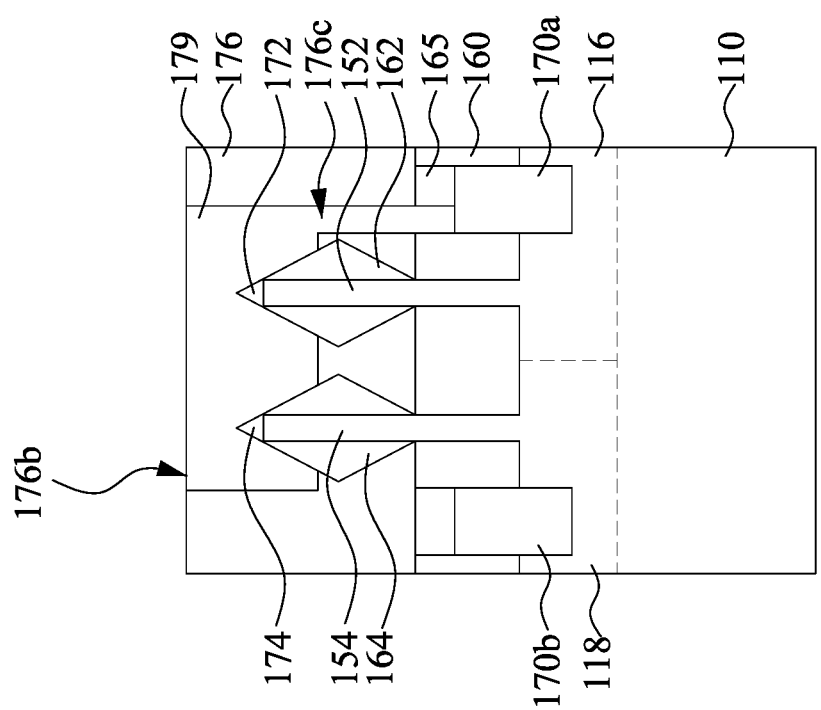
FIG. 14B illustrates another wafer at a stage corresponding to FIG. 14A according to some alternative embodiments of the present disclosure.

FIG. 14B illustrates another wafer at a stage corresponding to FIG. 14A according to some alternative embodiments of the present disclosure to illustrate a different profile of an interconnect. As shown in FIG. 14B, a via opening 176c is formed extending from a bottom of the trench 176b straightly downwardly to the buried power rail 170a. A difference between FIGS. 14A and 14B is that the via opening 176c exposes a side surface of the isolation dielectric 160. Therefore, the interconnect 179 formed therein is in contact with the isolation dielectric 160.

Figure 15:
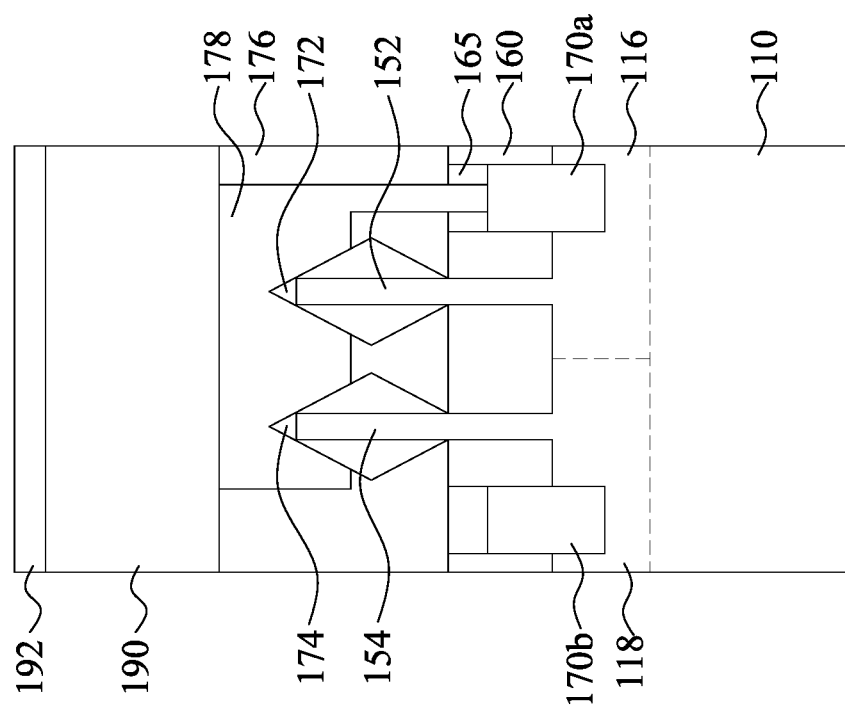

Returning to FIG. 1B, the method M1 then proceeds to block S113 where a BEOL stack is formed over the substrate and a bonding layer is formed over the BEOL stack. A wafer is fabricated by FEOL (front end of line) and BEOL (back end of line) processing on a semiconductor wafer, the FEOL process including the above-described steps for producing the buried power rails 170a and 170b and the interconnect 178a. The buried power rails 170a/170b which is to be connected to VDD, VSS, and interconnects 178a as described above. With reference to FIG. 15, in some embodiments of block S113, the BEOL stack 190 is formed over the substrate 110 and is illustrated in a schematic manner, without detailing the interconnections. The BEOL stack 190 is formed using a BEOL process. The BEOL process involves forming the metal wiring between the device structures in the wafer W1 in order to interconnect them including forming contacts, interconnect wires, via structures, and dielectric structures. Then, a bonding layer 192 is formed over the BEOL stack 190. In some embodiments, the bonding layer 192 may include silicon oxide, SiCN, or any other material for achieving direct dielectric-to-dielectric bonding.

Figure 16:
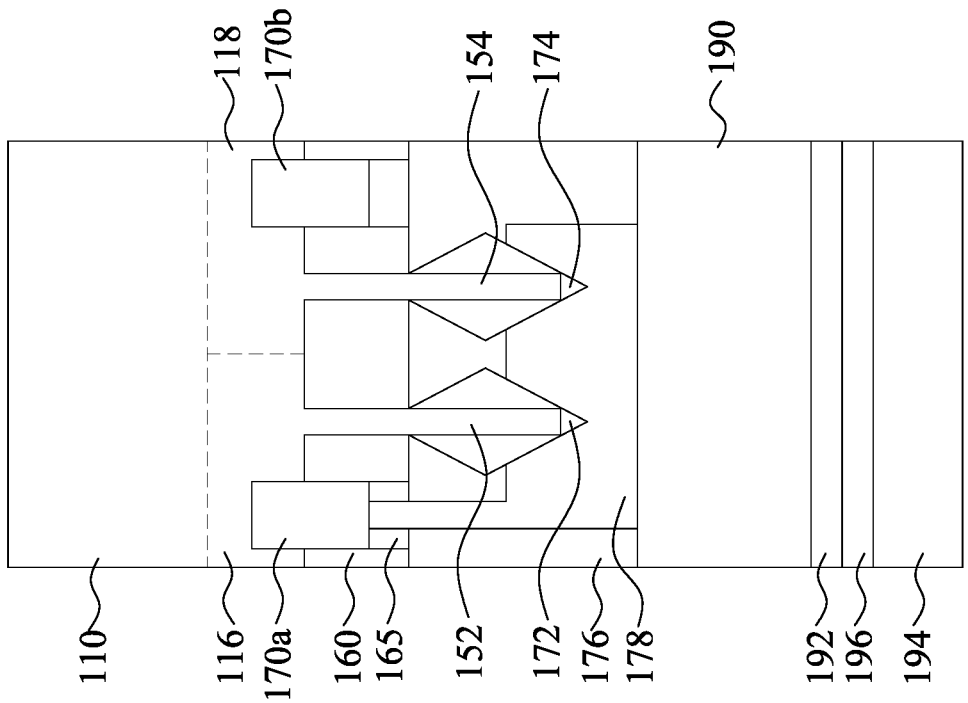

Returning to FIG. 1B, the method M1 then proceeds to block S114 where the wafer is bonded to a carrier substrate. With reference to FIG. 16, in some embodiments of block S114, the wafer W1 is bonded to a carrier substrate 194 through the bonding layer 192. In some embodiments, the carrier substrate 194 substrate is also provided with a bonding layer 196 thereon. The bonding layer 196 may include silicon oxide, SiCN, or any other material for achieving direct dielectric-to-dielectric bonding. Bonding of the wafer W1 to the carrier substrate 194 takes place by a direct bonding techniques, thus obtaining a bonded wafer stack as shown in FIG. 16.

Figure 17:
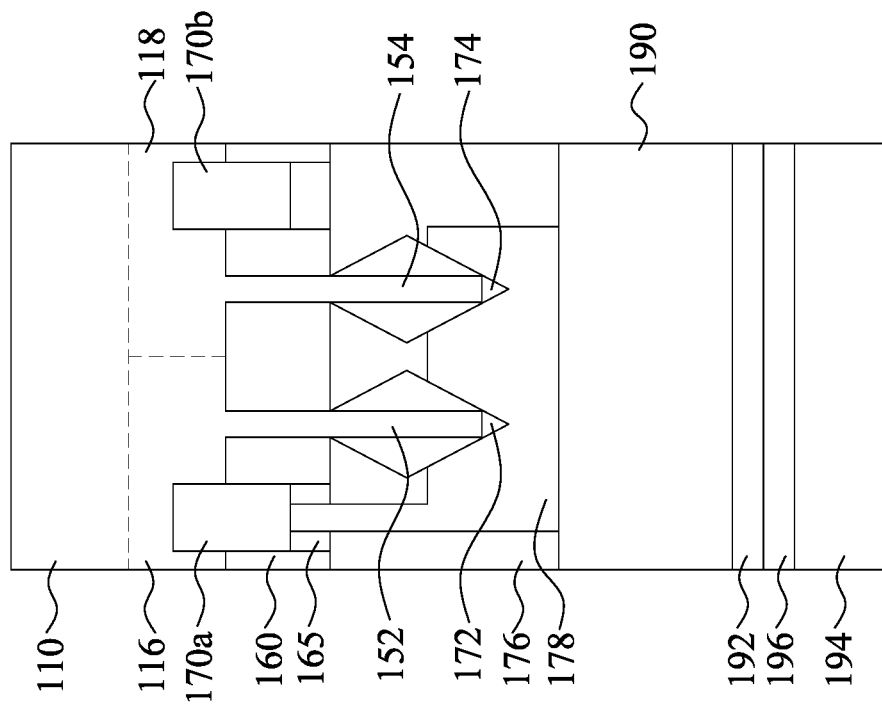

Returning to FIG. 1B, the method M1 then proceeds to block S115 where the substrate of the wafer is thinned. With reference to FIG. 17, in some embodiments of block S115, the substrate 110 of the wafer W1 may be thinned using grinding and/or wet or dry etching techniques by way of example but not limitation. The remaining substrate thickness is in a range from about 50 nm to about 500 nm, by way of example but not limitation. In some embodiments, further reduction of the thickness is then performed, down to a semiconductor thickness of about 1 μm, by way of example but not limitation. In some embodiments, the thinning may be achieved by incorporating in the device wafer a doped layer which can act as an etch stop layer. A selective wet etching step stopping on the doped layer is then applied for thinning the semiconductor wafer to the required thickness of about 1 μm by way of example but not limitation.

Figure 18A:
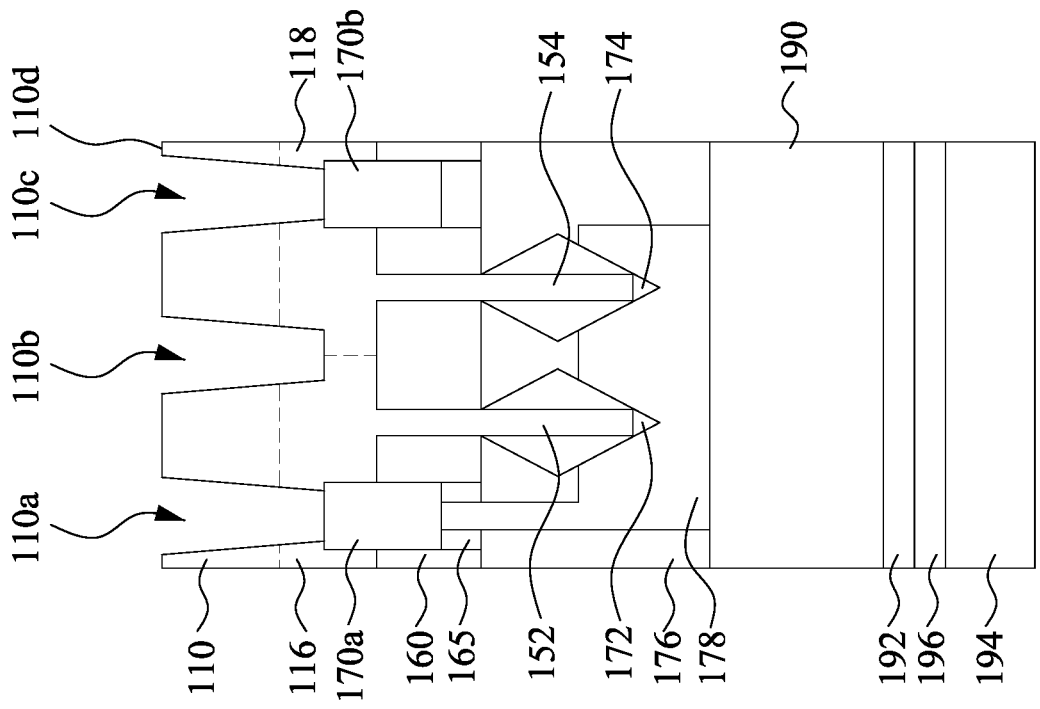

Returning to FIG. 1B, the method M1 then proceeds to block S116 where through substrate via (TSV) openings are formed through the substrate until reaching the buried power rails and the well region. With reference to FIG. 18A, in some embodiments of block S116, the TSV opening 110a and/or 110c is formed through the substrate 110 until reaching the buried power rail 170a and/or 170b that is connected to power or ground. The TSV opening 110b is formed through the substrate 110 until reaching the well region 116 and/or 118 and may be used act as a conduction path to relieve the high currents and current densities during an electrostatic discharge (ESD) event to avoid breakdown of the circuits.

In greater detail, the TSV opening 110a, 110b, and/or 110c is formed with a high aspect ratio greater than about 5 in the substrate 110 by way of example but not limitation. In defining the TSV opening 110a, 110b, and/or 110c, a hard mask layer (not shown) is formed over the substrate 110 followed by forming a patterned photoresist layer (not shown) thereon. The hard mask layer may be a silicon nitride layer, a silicon oxynitride layer or the like by way of example but not limitation. The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 110, forming the TSV opening 110a, 110b, and/or 110c passing through the substrate 110. The buried power rails 170a and 170b may also act as an etch stop layer for etching the substrate 110 until the buried power rails 170a and 170b are exposed. Because the TSV opening 110a, 110b, and/or 110c are formed simultaneously, a bottom of the TSV opening 110b may be level with a bottom of the TSV opening 110a and/or 110c and level with a surface of the power rail 170a and/or 170b exposing by the TSV opening 110a and/or 110c.

In some embodiments, the TSV opening 110a, 110b, and/or 110c may be etched using any suitable etching method including, for example, a plasma etch, a chemical wet etch, a laser drill, and/or other processes. In some embodiments, the etching process includes a deep reactive ion etching (RIE) process to etch the substrate 110. The etching process may be such that the TSV opening 110a, 110b, and/or 110c is etched from a backside surface 110d of the wafer W1 to reach approximately from tens of micron to hundreds of micron in depth. In some embodiments, the etching process may result in a series of etched macro-scallops on the substrate 110 adjacent to a sidewall of the TSV opening 110a, 110b, and/or 110c. The micro-scallop sidewalls will be smoothened in subsequent process. By way of example but not limitation, the TSV opening 110a, 110b, and/or 110c has a depth in a range from about 1 μm to about 100 μm, and a diameter in a range from about 0.1 μm to about 10 μm. By way of example but not limitation, the TSV opening 110a, 110b, and/or 110c has an aspect ratio in a range from about 5 to about 10. In some embodiments, the aspect ratio of the TSV opening 110a, 110b, and/or 110c may be greater than about 10. In some embodiments, in creating the TSV opening 110a, 110b, and/or 110c with a high aspect ratio in the substrate 110, a series of etched macro-scallops (not shown) may be created on the sidewall of the substrate 110, which can vary in size depending on process parameter. The micro-scallop sidewalls will be smoothened in subsequent thermal oxidation process.

In some embodiments, the TSV opening 110a, 110b, and/or 110c has a rectangular plan-view profile (or top-view profile) as shown in FIG. 2, with a width less than the widths of the buried power rails 170a and 170b. In some embodiments, the TSV opening 110a, 110b, and/or 110c is formed with a width greater than the width of the buried power rails 170a and 170b. Alternatively, the TSV opening 110a, 110b, and/or 110c may have a circular plan-view profile, with a diameter that is less than the widths of the buried power rails 170a and 170b. In some embodiments, the TSV opening 110a, 110b, and/or 110c is formed with a diameter greater than the width of the buried power rails 170a and 170b.

Figure 18B:
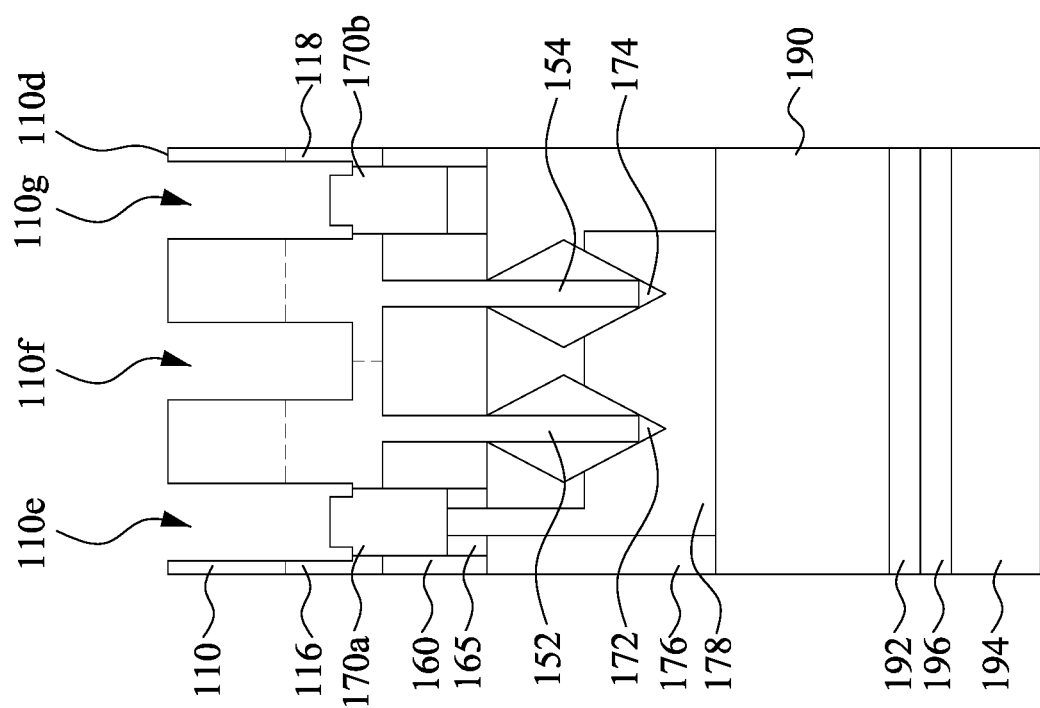
FIG. 18B illustrates another wafer at a stage corresponding to FIG. 18A according to some alternative embodiments of the present disclosure.

FIG. 18B illustrates another wafer at a stage corresponding to FIG. 18A according to some alternative embodiments of the present disclosure to illustrate a different profile of a TSV opening. As shown in FIG. 18B, TSV openings 110e, 110f, and/or 110g are formed to extend from a backside surface 110d of the substrate 110 straightly downwardly to the buried power rail 170a. A difference between FIGS. 18A and 18B is that the TSV opening 110e and/or 110f has a backside bottom end lower than backside end portion 170c and/or 170d of the buried power rail 170a and/or 170b, such that sidewall of the buried power rail 170a and/or 170c is exposed by the TSV opening 110e and/or 110f, which in turn allows for increasing a contact area between the buried power rail 170a and/or 170b and the TSV which will be formed in the TSV opening 110e and/or 110f. Because the TSV opening 110e, 110f, and/or 110g are formed simultaneously, a bottom of the TSV opening 110f may be level with a bottom of the TSV opening 110e and/or 110g and lower than the backside end portion 170c and/or 170d of the buried power rail 170a and/or 170b.

Returning to FIG. 1B, the method M1 then proceeds to block S117 where through substrate vias (TSVs) are formed in the TSV openings. With reference to FIG. 19, in some embodiments of block S117, the TSV 198a and/or 198c are formed in the TSV opening 110a and/or 110c of the substrate 110 and in contact with the buried power rail 170a and/or 170b to connect to the power or ground. The TSV 198b is formed in the TSV opening 110b and in contact with the well region 116 and/or 118. In some embodiments, the TSV 198b may be used act as a conduction path to relieve the high currents and current densities during the ESD event to avoid breakdown of the circuits. Thus, the functional density can be increased while geometry size can be decreased due to without forming an ESD device on the front side of the wafer W1. In some embodiments, the TSV 198b may be used act as a heat sink for the wafer W1 to discharge the heat generated by the semiconductor device from the well region to outside of the wafer W1.

In greater detail, the TSVs 198a, 198b, and/or 198c is formed by using a metallization process as well as the use of metal electroplating techniques to fill high aspect ratio openings to avoid a seam or void defect. In some embodiments, in order to avoid diffusion of metal from the TSV metal into the silicon substrate, a barrier layer (not shown) is used between the insulation layer and the TSV metal. The barrier layer may line the TSV opening 110a, 110b, and/or 110c. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Then, the wafer W1 may be transferred to a plating tool, such as an electrochemical plating (ECP) tool, and a conductive layer is plated on the wafer W1 by the plating process to fill the TSV opening 110a, 110b, and/or 110c. While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may comprise various materials, such as tungsten, ruthenium, aluminum, gold, silver, and the like. In some embodiments, the conductive layer is a copper-containing layer formed over the copper seed layer.

Subsequently, the excess portions of the conductive layer, the metal seed layer, and the barrier layer are removed, either through etching, chemical mechanical polishing (CMP), or the like, forming the upper surface of the metal-filled opening substantially coplanar with the backside surface 110d of the substrate 110. The remaining portions of the conductive layer and the barrier layer in the TSV opening 110a, 110b, and/or 110c forms the TSV 198a, 198b, and/or 198c.

The TSV 198b is in contact with the well region 116 and/or 118 and electrically coupled between the buried power rails 170a and 170b. When an ESD event occurs on the buried power rails 170b, the TSV 198b is configured to provide a conductive path between the buried power rails 170a and 170b, which in turn allows for relieving the high currents and current densities during the ESD event, so as to avoid breakdown of the circuits. In some embodiments, the TSV 198b may also be referred to as an electrostatic discharge (ESD) protection circuit.

Returning to FIG. 1B, the method M1 then proceeds to block S118 where a BEOL-type interconnect stack and terminals over the BEOL-type interconnect stack are formed to connect the buried power rails. With reference to FIGS. 20A and 20B, in some embodiments of block S118, a BEOL-type interconnect stack 150 and terminals VDD and VSS over the BEOL-type interconnect stack 150 are formed to connect the buried power rails 170a and 170b. In greater detail, a series of damascene process steps are performed for producing a BEOL-type interconnect stack 150 that connects the TSVs 198a and 198c through a low resistive circuit to terminals VDD and VSS on the backside of the wafer W1. In some embodiments, BEOL-type interconnect stack 150 may be also referred to as a power delivery network of the wafer W1.

Figure 21:
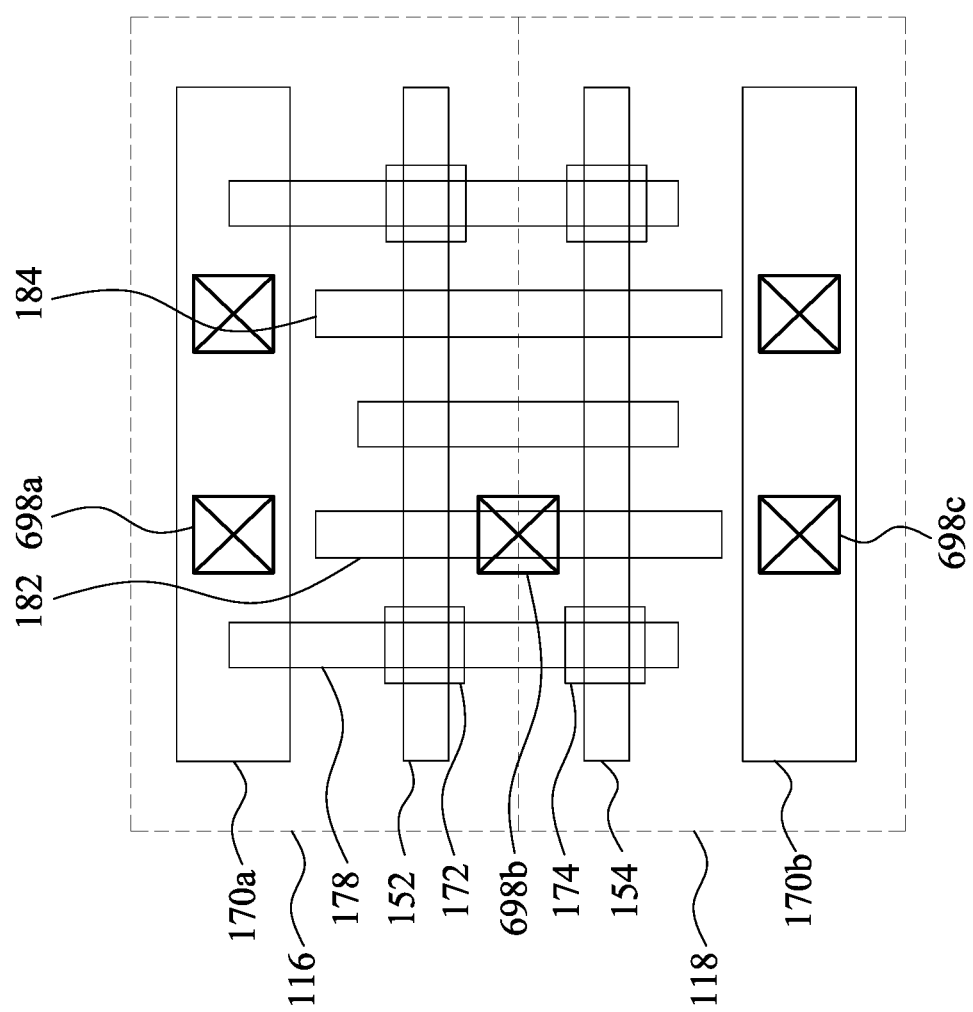
FIG. 21 illustrates a top view of a wafer according to some alternative embodiments of the present disclosure.

FIG. 21 illustrates a top view of another wafer corresponding to FIG. 2 according to some alternative embodiments of the present disclosure to illustrate a different profile of TSVs. As shown in FIG. 21, TSV 698a and/or 698c are formed to be in contact with the buried power rail 170a and/or 170b so as to connect to the power or ground. The TSV 698b is formed to be in contact with the well region 116 and/or 118. Operations for forming the TSV 698a, 698b, and/or 698c shown in FIG. 21 is substantially the same as the operations for forming the TSV 198a, 198b, and/or 198c of the wafer W1 shown in FIGS. 2-20B at stages S101-S118 of the method M1, and reference may be made to the foregoing paragraphs for the related detailed descriptions and such descriptions are not provided again herein.

As shown in FIG. 21, the TSV 698b vertically overlaps the gate structure 182, is laterally between the semiconductor fins 152 and 154 along a lengthwise direction of the gate structure 182, and/or is laterally between the interconnects 178a and 178b along a lengthwise direction of the semiconductor fin 152. In some embodiments, the TSV 698b non-overlaps with the source/drain features 172 and 174. The TSV 698a and/or 698c non-overlaps with the interconnect 178a and/or 178b. In some embodiments, the TSVs 698a, 698b, and 698c are arranged along the lengthwise direction of the gate structure 182. In some embodiments, the TSV 698b may be used act as a conduction path to relieve the high currents and current densities during the ESD event to avoid breakdown of the circuits. Thus, the functional density can be increased while geometry size can be decreased due to without forming an ESD device on the front side of the wafer. In some embodiments, the TSV 698b may be used act as a heat sink for the wafer to discharge the heat generated by the semiconductor device from the well region to outside of the wafer. In some embodiments, the TSV 698b may also be referred to as an electrostatic discharge (ESD) protection circuit.

Figure 22:
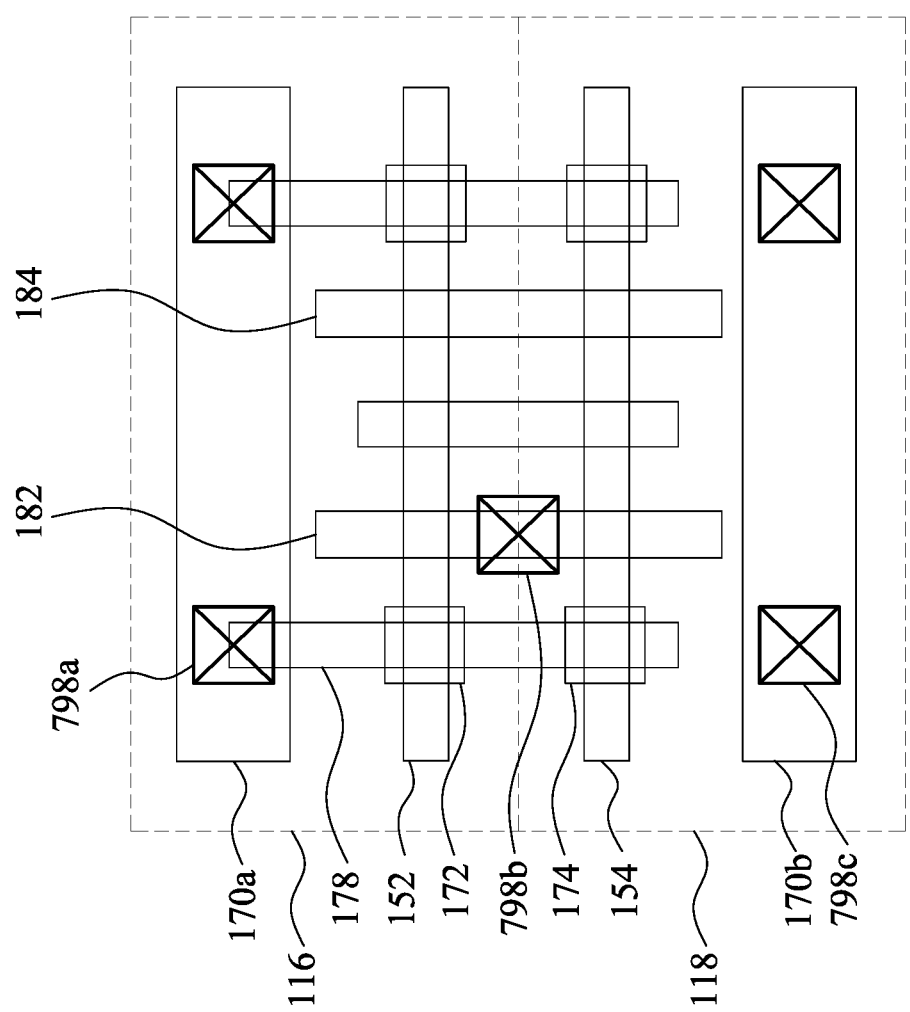
FIG. 22 illustrates a top view of a wafer according to some alternative embodiments of the present disclosure.

FIG. 22 illustrates a top view of another wafer corresponding to FIG. 2 according to some alternative embodiments of the present disclosure to illustrate a different profile of TSVs. As shown in FIG. 22, TSV 798a and/or 798c are formed to be in contact with the buried power rail 170a and/or 170b so as to connect to the power or ground. The TSV 798b is formed to be in contact with the well region 116 and/or 118. Operations for forming the TSV 798a, 798b, and/or 798c shown in FIG. 22 is substantially the same as the operations for forming the TSV 198a, 198b, and/or 198c of the wafer W1 shown in FIGS. 2-20B at stages S101-S118 of the method M1, and reference may be made to the foregoing paragraphs for the related detailed descriptions and such descriptions are not provided again herein.

As shown in FIG. 22, the TSV 798b vertically overlaps the gate structure 182, is laterally between the semiconductor fins 152 and 154 along a lengthwise direction of the gate structure 182, and/or is laterally between the interconnects 178a and 178b along a lengthwise direction of the semiconductor fin 152. In some embodiments, the TSV 798b non-overlaps with the source/drain features 172 and 174. The TSV 798a and/or 798c overlaps with the interconnect 178a and/or 178b. In some embodiments, the TSVs 798a, 798b, and 798c are misaligned in the lengthwise direction of the gate structure 182. In some embodiments, the TSV 798b may be used act as a conduction path to relieve the high currents and current densities during the ESD event to avoid breakdown of the circuits. Thus, the functional density can be increased while geometry size can be decreased due to without forming an ESD device on the front side of the wafer. In some embodiments, the TSV 798b may be used act as a heat sink for the wafer to discharge the heat generated by the semiconductor device from the well region to outside of the wafer. In some embodiments, the TSV 798b may also be referred to as an electrostatic discharge (ESD) protection circuit.

Figure 23:
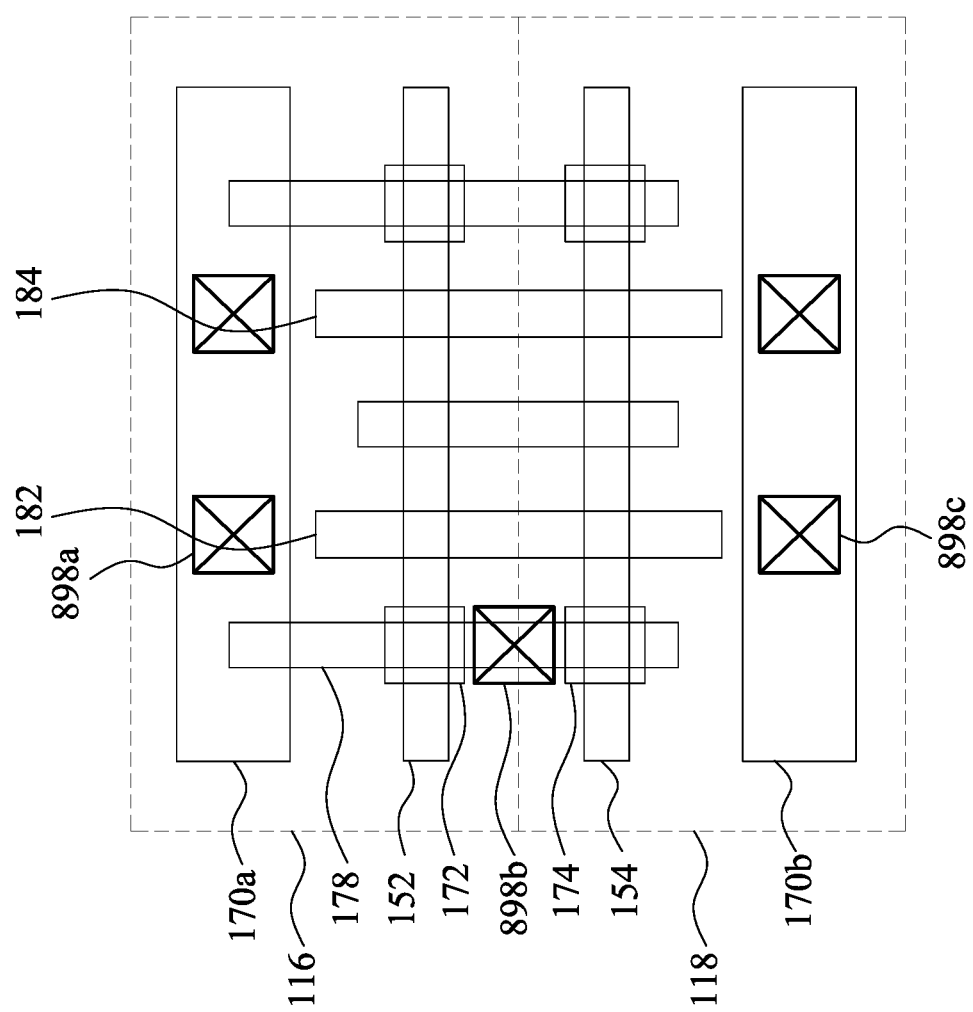
FIG. 23 illustrates a top view of a wafer according to some alternative embodiments of the present disclosure.

FIG. 23 illustrates a top view of another wafer corresponding to FIG. 2 according to some alternative embodiments of the present disclosure to illustrate a different profile of TSVs. As shown in FIG. 23, TSV 898a and/or 898c are formed to be in contact with the buried power rail 170a and/or 170b so as to connect to the power or ground. The TSV 898b is formed to be in contact with the well region 116 and/or 118. Operations for forming the TSV 898a, 898b, and/or 898c shown in FIG. 23 is substantially the same as the operations for forming the TSV 198a, 198b, and/or 198c of the wafer W1 shown in FIGS. 2-20B at stages S101-S118 of the method M1, and reference may be made to the foregoing paragraphs for the related detailed descriptions and such descriptions are not provided again herein.

As shown in FIG. 23, the TSV 898b vertically overlaps the interconnect 178a and/or is laterally between the semiconductor fins 152 and 154 along a lengthwise direction of the gate structure 182. In some embodiments, the TSV 698b non-overlaps with the gate structure 182. The TSV 698a and/or 698c non-overlaps with the interconnect 178a and/or 178b. In some embodiments, the TSVs 898a, 898b, and 898c are misaligned in the lengthwise direction of the gate structure 182. In some embodiments, the TSV 898b may be used act as a conduction path to relieve the high currents and current densities during the ESD event to avoid breakdown of the circuits. Thus, the functional density can be increased while geometry size can be decreased due to without forming an ESD device on the front side of the wafer. In some embodiments, the TSV 898b may be used act as a heat sink for the wafer to discharge the heat generated by the semiconductor device from the well region to outside of the wafer. In some embodiments, the TSV 898b may also be referred to as an electrostatic discharge (ESD) protection circuit.

Figure 24:
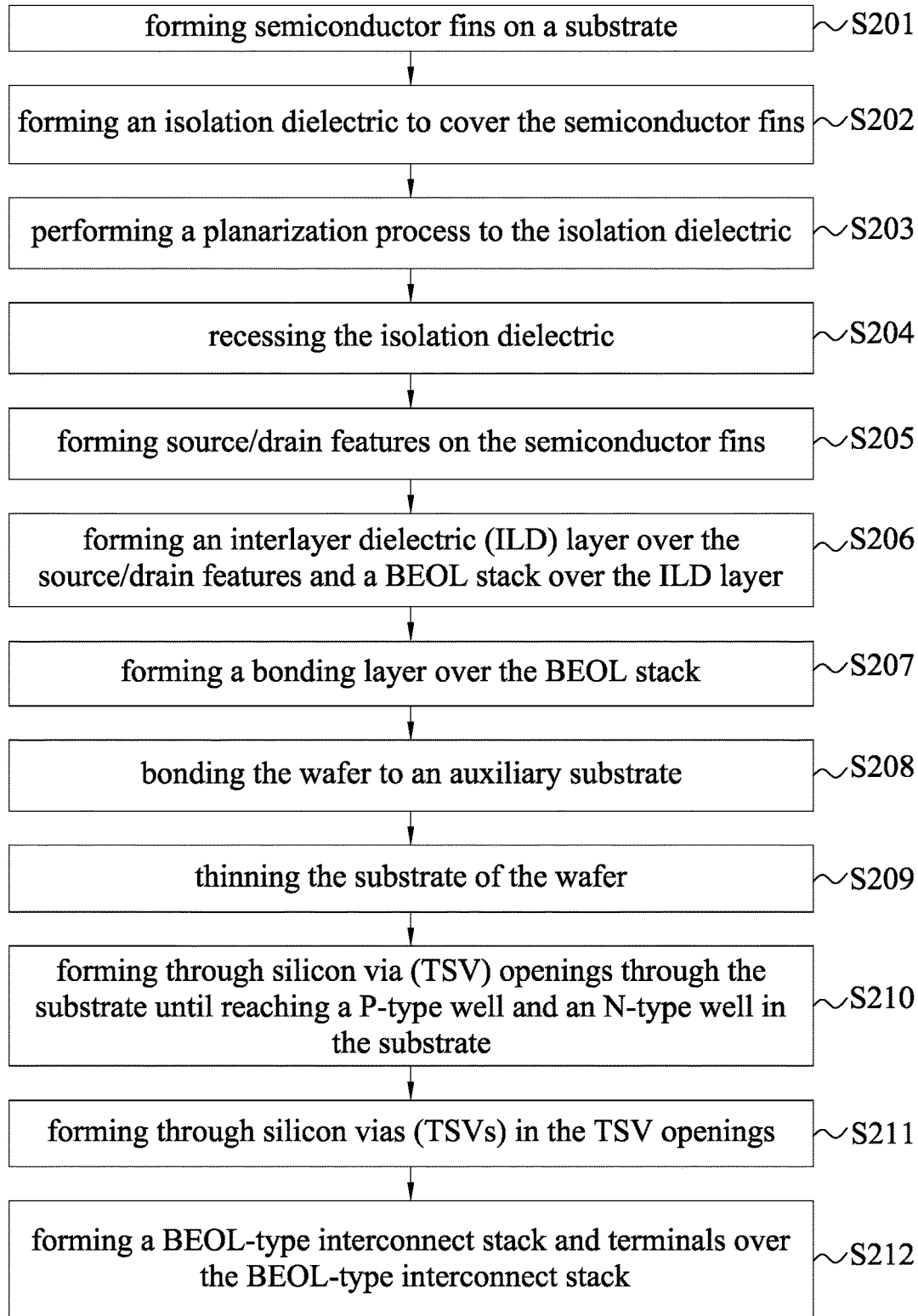
FIG. 24 is a flow chart of a method M2 for forming a semiconductor device in accordance with some embodiments of the present disclosure.

Referring now to FIG. 24, illustrated is an exemplary method M2 for fabrication of a semiconductor device in accordance with some embodiments. The method M2 includes a relevant part of the entire manufacturing process. It is understood that additional operations may be provided before, during, and after the operations shown by FIG. 24, and some of the operations described below can be replaced or eliminated for additional embodiments of the method. The order of the operations/processes may be interchangeable. It is noted that FIG. 24 has been simplified for a better understanding of the disclosed embodiment.

Figure 25:
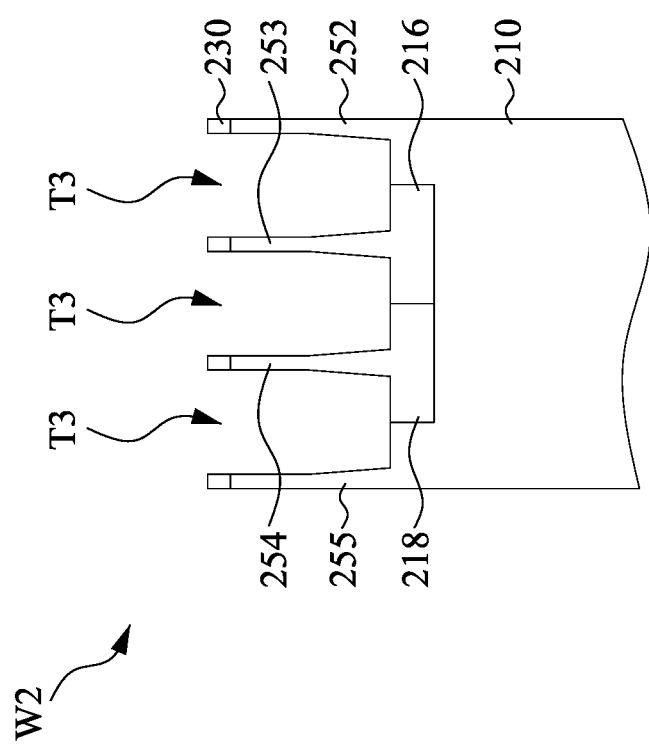
FIGS. 25-36 illustrate a method for manufacturing a semiconductor device at various stages in accordance with some embodiments of the present disclosure.

FIGS. 25-36 illustrate a wafer W2 at various stages of the method M2 according to some embodiments of the present disclosure. The method M2 begins at block S201 where semiconductor fins are formed on a substrate. Referring to FIG. 25, in some embodiments of block S201, a wafer W2 undergoes a series of deposition and photolithography processes, such that a patterned photoresist layer (not shown) and a mask layer 230 are formed on a substrate 210 of the wafer W2. In some embodiments, the mask layer 230 includes a hard mask layer and a pad layer. In some embodiments, the substrate 210 is a semiconductor substrate, such as a bulk semiconductor, a semiconductor-oninsulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 25, a P-type well region 216 and an N-type well region 218 in the substrate 210 which divide the substrate 210 into separate regions for different types of devices or transistors. Example materials of the P-type well region 216 and the N-type well region 218 include, but are not limited to, semiconductor materials doped with various types of p-type dopants and/or n-type dopants. In some embodiments, the P-type well region 216 includes p-type dopants, and the N-type well region 218 includes n-type dopants. In the example configuration in FIG. 25, the N-type well region 218 is a region for forming p-channel metal-oxide semiconductor (PMOS) transistors, and the P-type well region 216 is a region for forming n-channel metal-oxide semiconductor (NMOS) transistors. The described conductivity of the well regions 216 and 218 herein is an example. Other arrangements are within the scope of various embodiments.

In some embodiments, the pad layer is a thin film including silicon oxide formed using, for example, a thermal oxidation process. The pad layer may act as an adhesion layer between the substrate 210 and the hard mask layer. The pad layer may also act as an etch stop layer for etching the hard mask layer. In some embodiments, the hard mask layer is formed of silicon nitride, for example, using low-pressure chemical vapor deposition (LPCVD) or plasma enhanced chemical vapor deposition (PECVD). The hard mask layer is used as a hard mask during subsequent photolithography processes. A photoresist layer is formed on the mask layer 230 and is then patterned, forming openings in the photoresist layer, so that regions of the mask layer 230 are exposed.

Then, the substrate 210 is patterned to form one or more semiconductor fins 252, 253, 254 and 255. The mask layer 230 is etched through the photoresist layer exposing the underlying substrate 210. The exposed substrate 210 is then etched, forming trenches T3. A portion of the P-type well region 216 between neighboring trenches T3 can be referred to as a semiconductor fin 253. A portion of the N-type well region 218 between neighboring trenches T3 can be referred to as a semiconductor fin 254. Portions of the substrate 210 laterally surrounding the P-type well region 216 and the N-type well region 218 and adjacent to neighboring trenches T3 can be referred to as semiconductor fins 252 and 255. After etching the substrate 210, the photoresist layer is removed. Next, a cleaning step may be optionally performed to remove a native oxide of the semiconductor substrate 210. The cleaning may be performed using diluted hydrofluoric (HF) acid, for example. According to the various aspects of the present disclosure, the semiconductor fins 252-255 extend along a first direction. In some embodiments, the semiconductor fins 252-255 may also be referred to as oxide-definition (OD) regions. In some embodiments, the P-type well region 216 and/or the N-type well region 218 has a thickness in a range about 10 nm to about 100 nm by way of example but not limitation.

Figure 26:
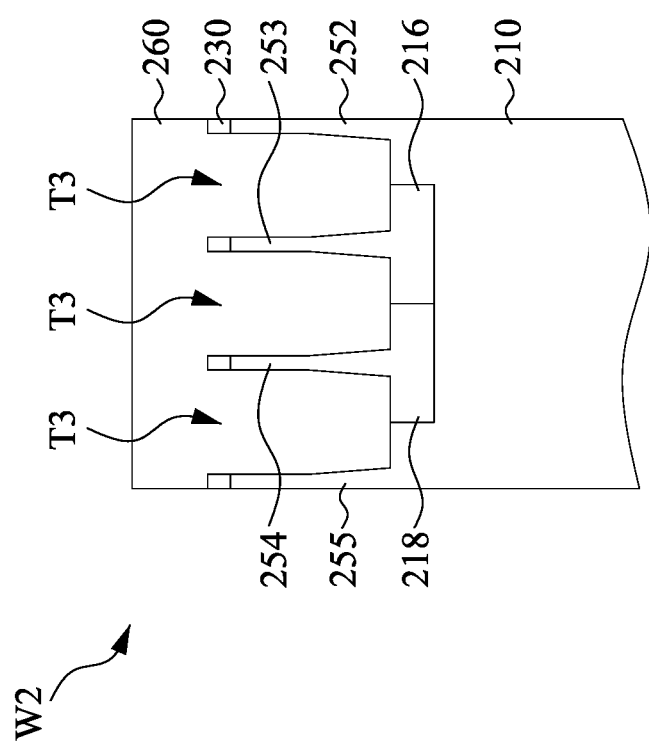

Returning to FIG. 24, the method M2 then proceeds to block S202 where an isolation dielectric is formed to cover the semiconductor fins. With reference to FIG. 26, in some embodiments of block S202, an isolation dielectric 260 is formed to overfill the trenches T3 and cover the semiconductor fins 252-255. The isolation dielectric 160 in the trenches T3 can be referred to as a shallow trench isolation (STI) structure. In some embodiments, the isolation dielectric 260 is made of silicon oxide, silicon nitride, silicon oxynitride, fluoride-doped silicate glass (FSG), or other low-K dielectric materials. In some embodiments, the isolation dielectric 260 may be formed using a high-density-plasma (HDP) chemical vapor deposition (CVD) process, using silane ($SiH_4$) and oxygen ($O_2$) as reacting precursors. In some other embodiments, the isolation dielectric 260 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 260 may be formed using a spin-on-dielectric (SOD) process, such as hydrogen silsesquioxane (HSQ) or methyl silsesquioxane (MSQ). Other processes and materials may be used. In some embodiments, the isolation dielectric 260 can have a multi-layer structure, for example, a thermal oxide liner layer with silicon nitride formed over the liner. Thereafter, a thermal annealing may be optionally performed to the isolation dielectric 260.

Figure 27:
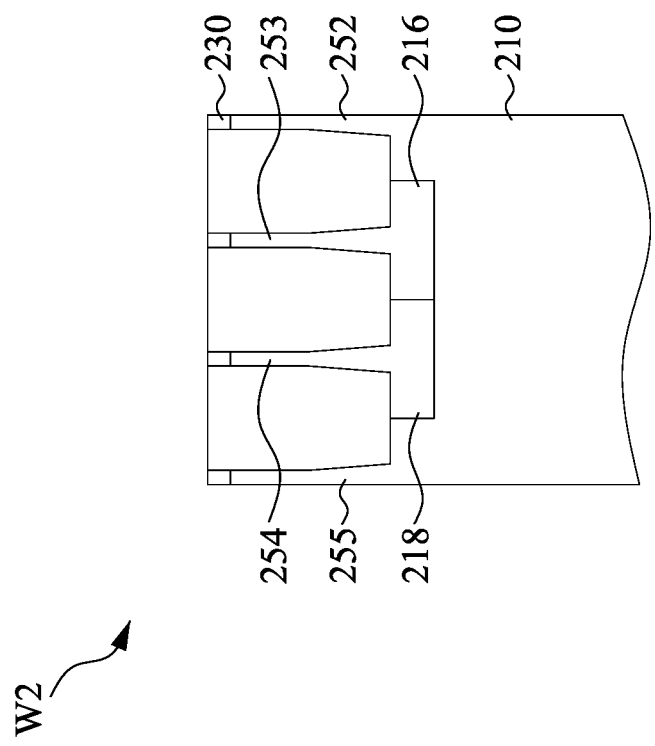

Returning to FIG. 24, the method M2 then proceeds to block S203 where a planarization process is performed to the first isolation dielectric. With reference to FIG. 27, in some embodiments of block S203, a planarization process such as chemical mechanical polish (CMP) is performed to remove the excess isolation dielectric 260 over the semiconductor fins 252-255. In some other embodiments, the planarization process stops when the mask layer 230 is exposed. In such embodiments, the mask layer 230 may act as the CMP stop layer in the planarization. In some embodiments, the planarization process may also remove the mask layer 230 such that top surfaces of the semiconductor fins 252-255 are exposed. If the mask layer 230 is not removed by the planarization process, the mask layer 230, if formed of silicon nitride, may be remove by a wet process using hot $H_3PO_4$, and if formed of silicon oxide, may be removed using diluted HF.

Figure 28:
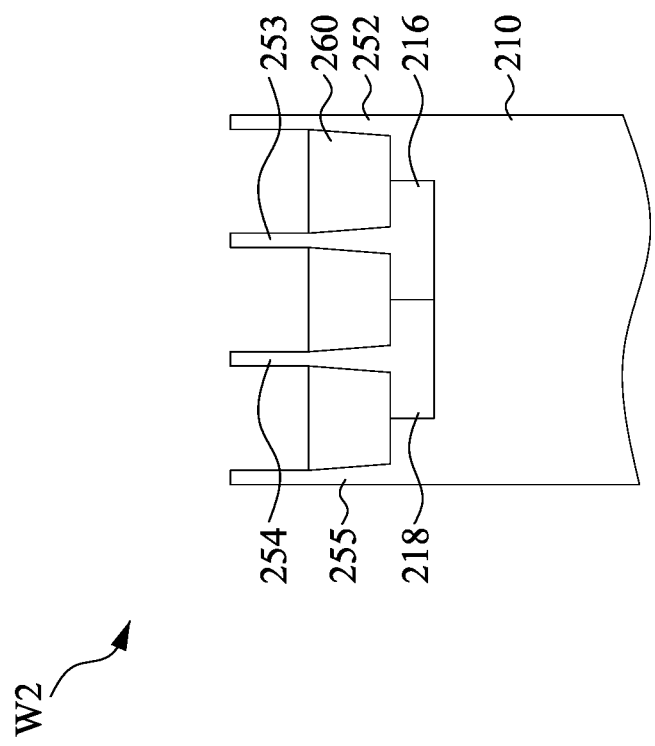

Returning to FIG. 24, the method M2 then proceeds to block S204 where the isolation dielectric is recessed. With reference to FIG. 28, in some embodiments of block S204, the isolation dielectric 260 is recessed, for example, through an etching operation, in which diluted HF, SiCoNi (including HF and $NH_3$), or the like, may be used as the etchant. After recessing the isolation dielectric 260, portions of the semiconductor fins 252-255 are higher than a top surface of the isolation dielectric 260.

It is understood that the blocks S201-S204 described above are merely an example of how the semiconductor fins 252-255 and the isolation dielectric 260 are formed. In other embodiments, a dielectric layer can be formed over a top surface of the substrate 210; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fins 252-255 can be recessed, and a material different from the recessed semiconductor fins 252-255 is epitaxially grown in its place. In even further embodiments, a dielectric layer can be formed over a top surface of the substrate 210; trenches can be etched through the dielectric layer; heteroepitaxial structures can be epitaxially grown in the trenches using a material different from the substrate 210; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 252, 253, 254, or 255 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Figure 29:
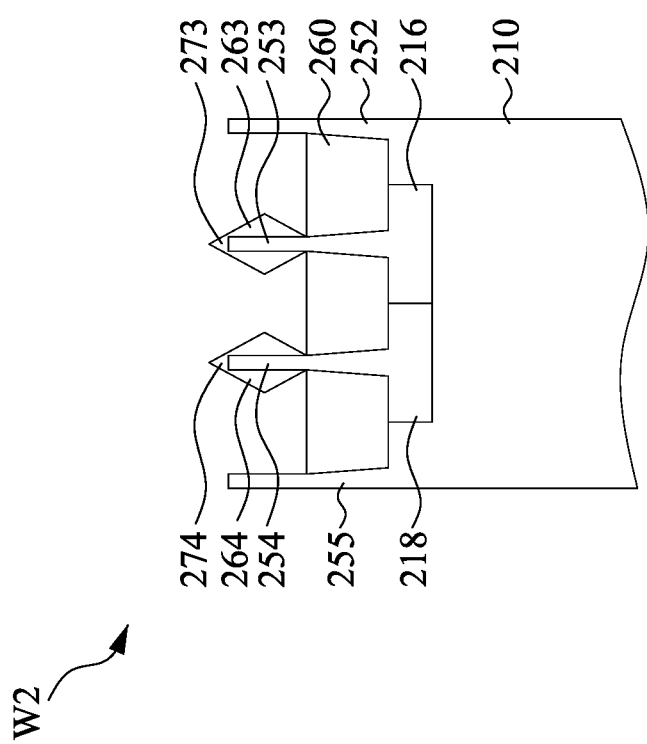

Returning to FIG. 24, the method M2 then proceeds to block S205 where source/drain features are formed on the semiconductor fins. With reference to FIG. 29, in some embodiments of block S205, a patterned mask layer (not shown) is formed over the semiconductor fins 252, 253, 254, and 255. In some embodiments, the mask layer is formed by spin coating a resist material (e.g., the mask layer may be also referred to as a photo resist layer), followed by a process, such as a soft baking process and a hard baking process (may be also referred to as a pre-exposure baking). In some embodiments, the mask layer is a DUV resist such as a krypton fluoride (KrF) resist or an argon fluoride (ArF) resist. In some embodiments, the mask layer is an I-line resist, a EUV resist, an electron beam (e-beam) resist, or an ion beam resist. In some embodiments, the mask layer is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer is a negative resist. The negative resist is soluble in a developer but becomes insoluble upon radiation.

After coating the mask layer over the semiconductor fins 252, 253, 254, and 255, the mask layer is exposed to a radiation through a mask. After exposing the mask layer to the radiation is complete, the exposed mask layer undergoes one or more post-exposure baking (PEB) processes. Then, a developing process is performed, such that portions of the exposed mask layer are removed, and the mask layer acts as a mask to protect the semiconductor fins 252 and 255 from a subsequent epitaxial growth process. When the etching process is complete, a trench is formed to run through the mask layer and to expose the semiconductor fins 253 and 254 and the top surface of the isolation dielectric 260. In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Then, the source/drain features 273 and 274 may be formed by performing an epitaxial growth process that provides epitaxy materials 263 and 264 cladding the portions of the semiconductor fins 253 and 254. The source/drain features 273 and 274 include materials 263 and 264 formed by epitaxially growing a semiconductor material on the exposed semiconductor fins 253 and 254. In other words, the materials 263 and 264 are formed around the semiconductor fins 253 and 254; this may be referred to as forming a "cladding" around the semiconductor fins 253 and 254. Thus, the source/drain features 273 and 274 include the semiconductor fins 253 and 254 and the epitaxially grown materials 263 and 264 are formed. It is noted that these features may be formed without recessing the semiconductor fins 253 and 254. After forming the source/drain features 273 and 274, the patterned mask layer covering the semiconductor fins 252 and 255 is removed.

In various embodiments, the grown semiconductor materials 263 and 264 may include Ge, Si, GaAs, AlGaAs, SiGe, GaAsP, SiP, or other suitable material. In some embodiments, the materials 263 and 264 may be in-situ doped during the epi process. For example, in some embodiments, epitaxially grown materials 263 and 264 may be doped with boron. In some embodiments, epitaxially grown materials 263 and 264 may be doped with carbon to form Si:C source/drain features, phosphorous to form Si:P source/drain features, or both carbon and phosphorous to form SiCP source/drain features. In an embodiment, the semiconductor fins 253 and 254 are made of silicon and the epitaxially grown materials 263 and 264 also are silicon. In some embodiments, the semiconductor fins 253 and 254 and the epitaxially grown materials 263 and 264 may comprise a similar material, but be differently doped. In other embodiments, the semiconductor fins 253 and 254 include a first semiconductor material, the epitaxially grown materials 263 and 264 include a second semiconductor different than the first semiconductor material. In some embodiments, the epitaxially grown materials 263 and 264 are not in-situ doped, and, for example, instead an implantation process is performed to dope the epitaxially grown materials 263 and 264.

In some embodiments, a dummy gate structure (not shown) including a gate dielectric and a gate electrode over the gate dielectric is formed to extend across the semiconductor fins 253 and 254 prior to forming the source/drain features 273 and 274. In some embodiments, in order to form the dummy gate structure, a gate dielectric layer is formed over the semiconductor fins 253 and 254, followed by a dummy gate electrode layer. The gate dielectric layer and the dummy gate electrode layer are then patterned, respectively forming the gate dielectric and the gate electrode. Hard masks may be formed on the dummy gate structure for process reasons, in which the hard masks may include silicon nitride. The channel portions of the semiconductor fins 253 and 254 are covered by the dummy gate structure, and the source/drain portions of the semiconductor fins 253 and 254 are uncovered by the dummy gate structure. In other words, the dummy gate structure is formed over the channel portions of the semiconductor fins 253 and 254.

Figure 30:
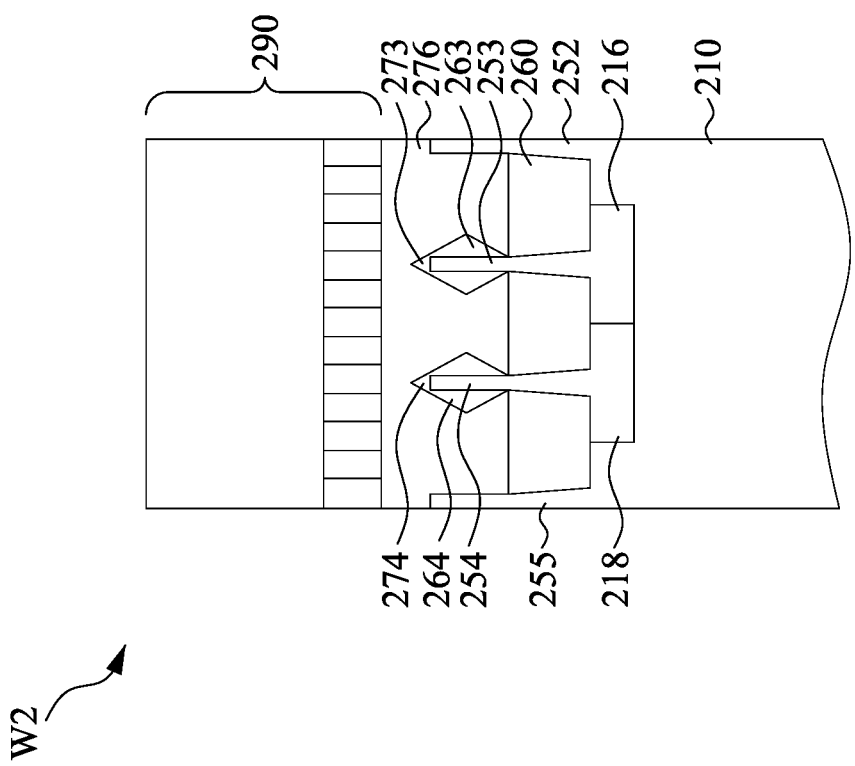

Returning to FIG. 24, the method M2 then proceeds to block S206 where an interlayer dielectric (ILD) layer is formed over the source/drain features and a BEOL stack is formed over the ILD layer. With reference to FIG. 30, in some embodiments of block S206, an interlayer dielectric (ILD) layer 276 is formed over the semiconductor fins 252, 253, 254 and 255, the source/drain features 273 and 274 and the dummy gate structure. That is, the source/drain features 273 and 274 are covered and protected by the ILD layer 276 during process(es) performed later. Moreover, the ILD layer 276 is formed over the dummy gate structure. A chemical mechanical planarization (CMP) process is performed to remove portions of the ILD layer 276. During the CMP process, the dummy gate structures are exposed. The remaining portions of the ILD layer 276 cover the source/drain features 273 and 274, respectively. The ILD layer 276 may include silicon oxide, oxynitride or other suitable materials.

A replacement gate (RPG) process scheme is employed. In the RPG process scheme, a dummy gate structures are formed in advance and is replaced by a metal gate. In some embodiments, the dummy gate structures (not shown) are removed. The dummy gate structure may be removed by dry etch, wet etch, or a combination of dry and wet etch. For example, a wet etch process may include exposure to a hydroxide containing solution (e.g., ammonium hydroxide), deionized water, and/or other suitable etchant solutions. In some embodiments, the dummy gate structures provide a constraint force on the channel portions of the semiconductor fins 253 and 254. After the dummy gate structures are removed, the constraint force applied on the channel portion of the semiconductor fins 253 and 254 disappears accordingly, such that the in-plane tensile strain on the channel portions of the semiconductor fins 253 and 254, induced by the source/drain features 273 and 274, may be enhanced.

Then, gate electrodes are form to replace the dummy gate structures. The gate electrodes are formed over the channel portions of the semiconductor fins 252-254. The gate electrodes 188 may include a metal, metal alloy, and/or metal silicide. Additionally, the formation of the gate electrodes may include depositions to form various gate materials, one or more liner layers, and one or more CMP processes to remove excessive gate materials and thereby planarize top surfaces of the gate electrodes.

In some other embodiments, a work function metal layer included in the gate electrodes may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the gate electrode may be a p-type metal gate including a p-type work function layer. In some embodiments, a capping layer included in the gate electrode 188 may include refractory metals and their nitrides (e.g. TiN, TaN, $W_2N$, TiSiN, TaSiN). The cap layer may be deposited by PVD, CVD, metal-organic chemical vapor deposition (MOCVD) and ALD. In some embodiments, a fill layer included in the gate electrode may include tungsten (W). The metal layer may be deposited by ALD, PVD, CVD, or other suitable process.

A removing process is performed to the gate electrodes to partially remove the gate electrodes. The etching process(es) may include a wet etch, a dry etch, and/or a combination thereof. As an example, a wet etching solution may include $HN_3$, $NH_4OH$, KOH, HF, HCl, NaOH, $H_3PO_4$, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etching process is chosen to selectively etch the gate electrodes without substantially etching the ILD layer 276. In some embodiments, the etching process is controlled such that top surfaces of the remaining the gate electrodes are lower than the top surfaces of the ILD layer 276.

The FEOL process including the above-described steps. Then, a BEOL stack 290 is formed over the substrate 210 and connects the source/drain features 273 and 274 in a schematic manner, without detailing the interconnections. The BEOL stack 290 is formed using a BEOL process. The BEOL process involves forming the metal wiring between the device structures in the wafer W2 in order to interconnect them including forming contacts, interconnect wires, via structures, and dielectric structures.

Figure 31:
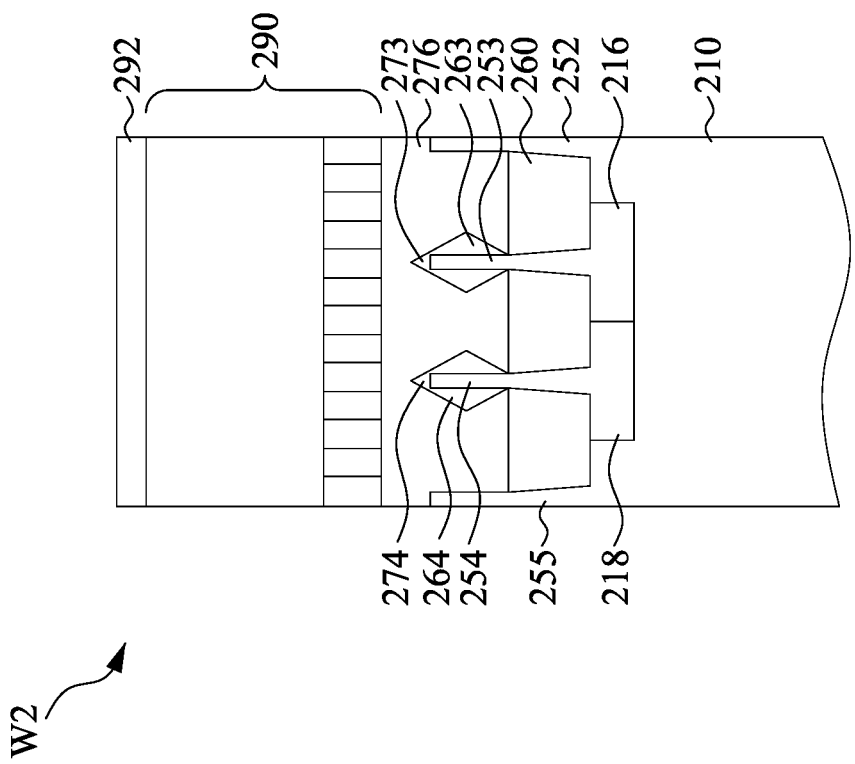

Returning to FIG. 24, the method M2 then proceeds to block S207 where bonding layer is formed over the BEOL stack. With reference to FIG. 31, in some embodiments of block S207, a bonding layer 292 is formed over the BEOL stack 290. In some embodiments, the bonding layer 292 may include silicon oxide, SiCN, or any other material applicable in the direct bonding technology applied in state of the art packaging techniques.

Figure 32:
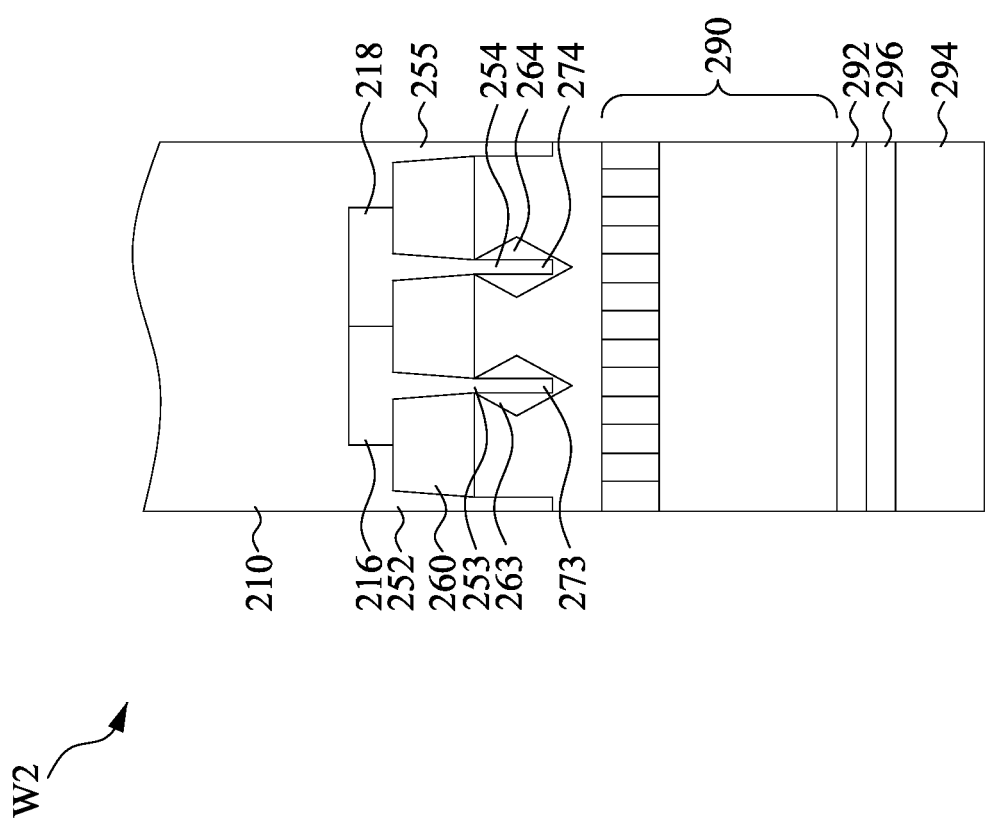

Returning to FIG. 24, the method M2 then proceeds to block S208 where the wafer is bonded to an carrier substrate. With reference to FIG. 32, in some embodiments of block S208, the wafer W2 is bonded to an carrier substrate 294 through the bonding layer 292. In some embodiments, the carrier substrate 294 substrate is also provided with a bonding layer 296 thereon. The bonding layer 296 may include silicon oxide, SiCN, or any other material applicable in the direct bonding technology applied in state of the art packaging techniques. Bonding of the wafer W2 to the carrier substrate 294 takes place by a direct bonding techniques, thus obtaining a bonded wafer stack as shown in FIG. 32.

Figure 33:
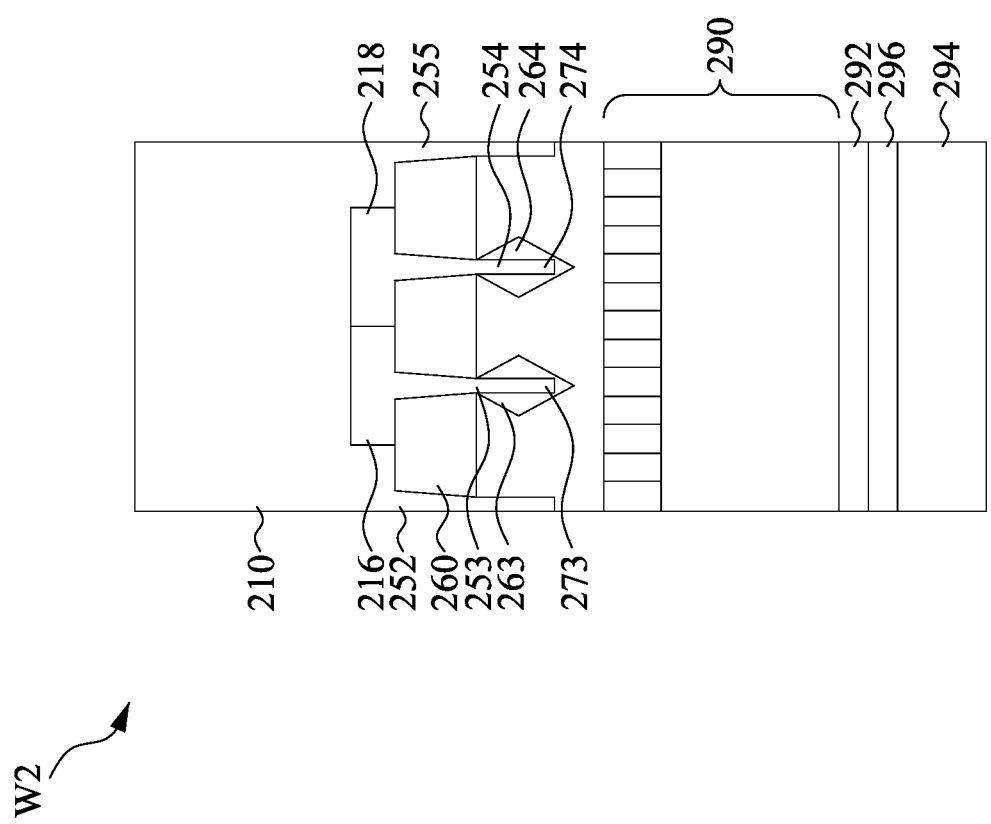

Returning to FIG. 24, the method M2 then proceeds to block S209 where the substrate of the wafer is thinned. With reference to FIG. 33, in some embodiments of block S209, the substrate 210 of the wafer W2 may be thinned using grinding and/or wet or dry etching techniques by way of example but not limitation. The remaining substrate thickness is in a range from about 50 nm to about 500 nm, by way of example but not limitation. In some embodiments, further reduction of the thickness is then performed, down to a semiconductor thickness of about 1 μm, by way of example but not limitation. In some embodiments, the thinning may be achieved by incorporating in the device wafer a doped layer which can act as an etch stop layer. A selective wet etching step stopping on the doped layer is then applied for thinning the semiconductor wafer to the required thickness of about 1 μm by way of example but not limitation.

Figure 34:
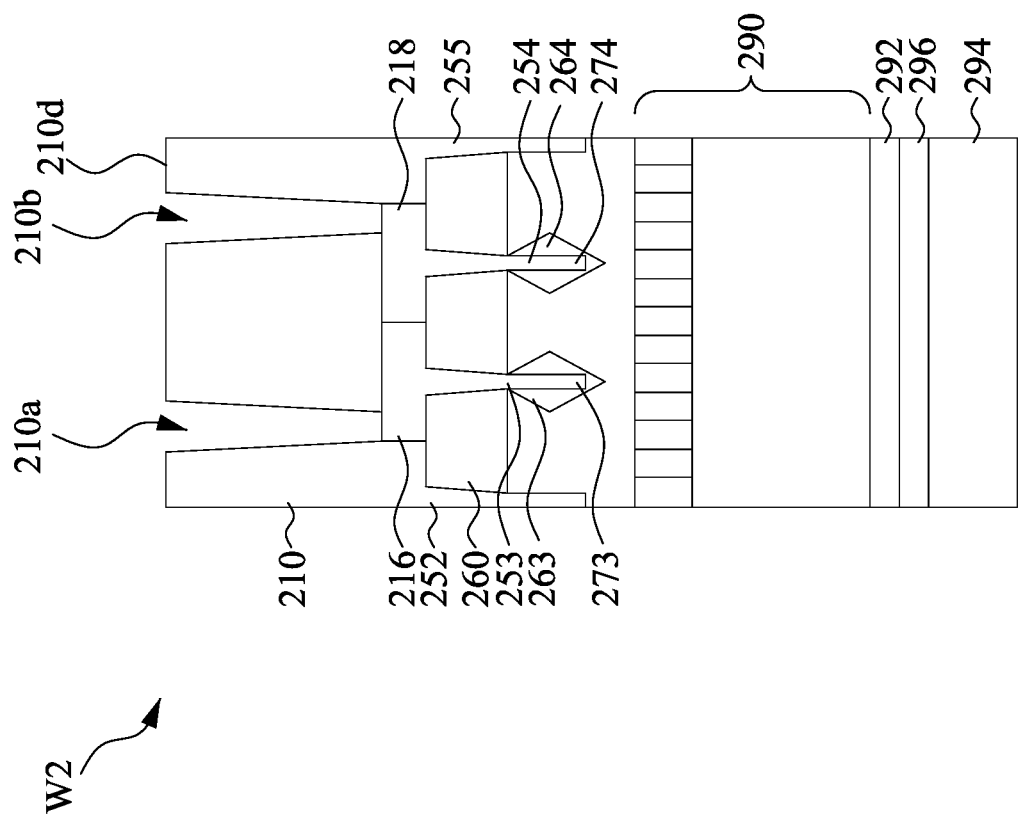

Returning to FIG. 22, the method M2 then proceeds to block S210 where through substrate via (TSV) openings are formed through the substrate until reaching a P-type well region and an N-type well region in the substrate. With reference to FIG. 34, in some embodiments of block S210, the TSV opening 210a and 210b are formed through the substrate 210 until reaching the P-type well region 216 and the N-type well region 218 and may be used act as a conduction path to relieve the high currents and current densities during an electrostatic discharge (ESD) event to avoid breakdown of the circuits.

In greater detail, the TSV openings 210a and 110b are formed with a high aspect ratio greater than about 5 in the substrate 210 by way of example but not limitation. In defining the TSV openings 210a and 210b, a hard mask layer (not shown) is formed over the substrate 210 followed by forming a patterned photoresist layer (not shown) thereon. The hard mask layer may be a silicon nitride layer, a silicon oxynitride layer or the like by way of example but not limitation. The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 210, forming the TSV openings 210a and 210b passing through the substrate 210.

In some embodiments, the TSV openings 210a and 210b may be etched using any suitable etching method including, for example, a plasma etch, a chemical wet etch, a laser drill, and/or other processes. In some embodiments, the etching process includes a deep reactive ion etching (RIE) process to etch the substrate 210. The etching process may be such that the TSV openings 210a and 210b are etched from a backside surface 210d of the wafer W2 to reach approximately from tens of micron to hundreds of micron in depth. In some embodiments, the etching process may result in a series of etched macro-scallops on the substrate 210 adjacent to a sidewall of the TSV openings 210a and 210b. The microscallop sidewalls will be smoothened in subsequent process. By way of example but not limitation, the TSV opening 210a and/or 210b has a depth in a range from about 1 µm to about 100 µm, and a diameter in a range from about 0.1 µm to about 10 µm. By way of example but not limitation, the TSV opening 210a and/or 210b has an aspect ratio in a range from about 5 to about 10. In some embodiments, the aspect ratio of the TSV opening 210a and/or 210b may be greater than about 10. In some embodiments, in creating the TSV opening 210a and/or 210b with a high aspect ratio in the substrate 210, a series of etched macro-scallops (not shown) may be created on the sidewall of the substrate 210, which can vary in size depending on process parameter. The micro-scallop sidewalls will be smoothened in subsequent thermal oxidation process. In some embodiments, the TSV opening 210a and/or 210b has a rectangular plan-view profile (or top-view profile) as shown in FIG. 2. Alternatively, the TSV opening 210a and/or 210b may have a circular cross-section.

Figure 35:
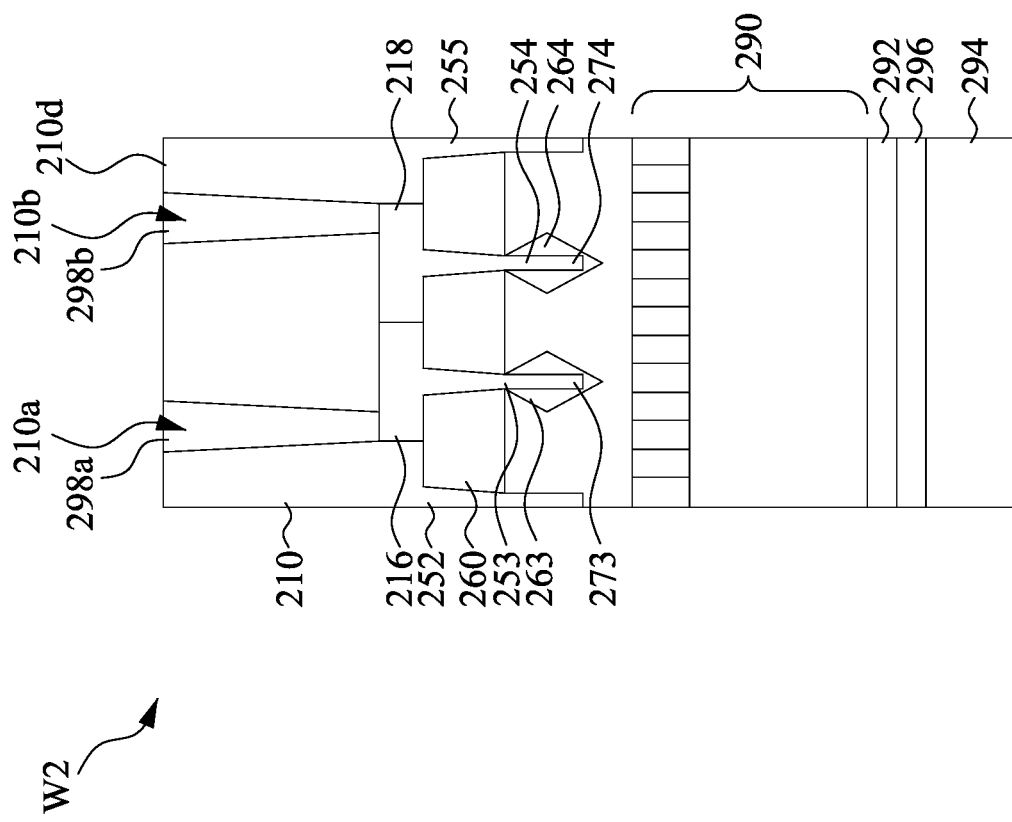

Returning to FIG. 24, the method M2 then proceeds to block S211 where through substrate vias (TSVs) are formed in the TSV openings. With reference to FIG. 35, in some embodiments of block S211, the TSV 298a and/or 298b are formed in the TSV opening 210a and/or 210b of the substrate 210 and in contact with the P-type well region 216 and/or the N-type well region 218. In some embodiments, the TSV 298a and/or 298b may be used act as a conduction path to relieve the high currents and current densities during the ESD event to avoid breakdown of the circuits. Thus, the functional density can be increased while geometry size can be decreased due to without forming an ESD device on the front side of the wafer W2. In some embodiments, the TSV 298a and/or 298b may be used act as a heat sink for the wafer W2 to discharge the heat generated by the semiconductor device from the well region to outside of the wafer W2.

In greater detail, the TSV 298a and/or 298b is formed by using a metallization process as well as the use of metal electroplating techniques to fill high aspect ratio openings to avoid a seam or void defect. In some embodiments, in order to avoid diffusion of metal from the TSV metal into the silicon substrate, a barrier layer (not shown) is used between the insulation layer and the TSV metal. The barrier layer may line the TSV opening 210a and/or 210b. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Then, the wafer W1 may be transferred to a plating tool, such as an electrochemical plating (ECP) tool, and a conductive layer is plated on the wafer W1 by the plating process to fill the TSV opening 210a and/or 210b. While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may comprise various materials, such as tungsten, ruthenium, aluminum, gold, silver, and the like. In some embodiments, the conductive layer is a copper-containing layer formed over the copper seed layer.

Subsequently, the excess portions of the conductive layer, the metal seed layer, and the barrier layer are removed, either through etching, chemical mechanical polishing (CMP), or the like, forming the upper surface of the metal-filled opening substantially coplanar with the backside surface 210d of the substrate 210. The remaining portions of the conductive layer and the barrier layer in the TSV opening 210a and/or 210b forms the TSV 298a and/or 298b.

The TSV 298a is in contact with the P-type well region 216 and the TSV 298b is in contact with the N-type well region 218. When an ESD event occurs, the TSVs 298a and/or 298b is configured to provide a conductive path, which in turn allows for relieving the high currents and current densities during the ESD event, so as to avoid breakdown of the circuits. In some embodiments, the TSVs 298a and/or 298b may also be referred to as an electrostatic discharge (ESD) protection circuit.

Figure 36:
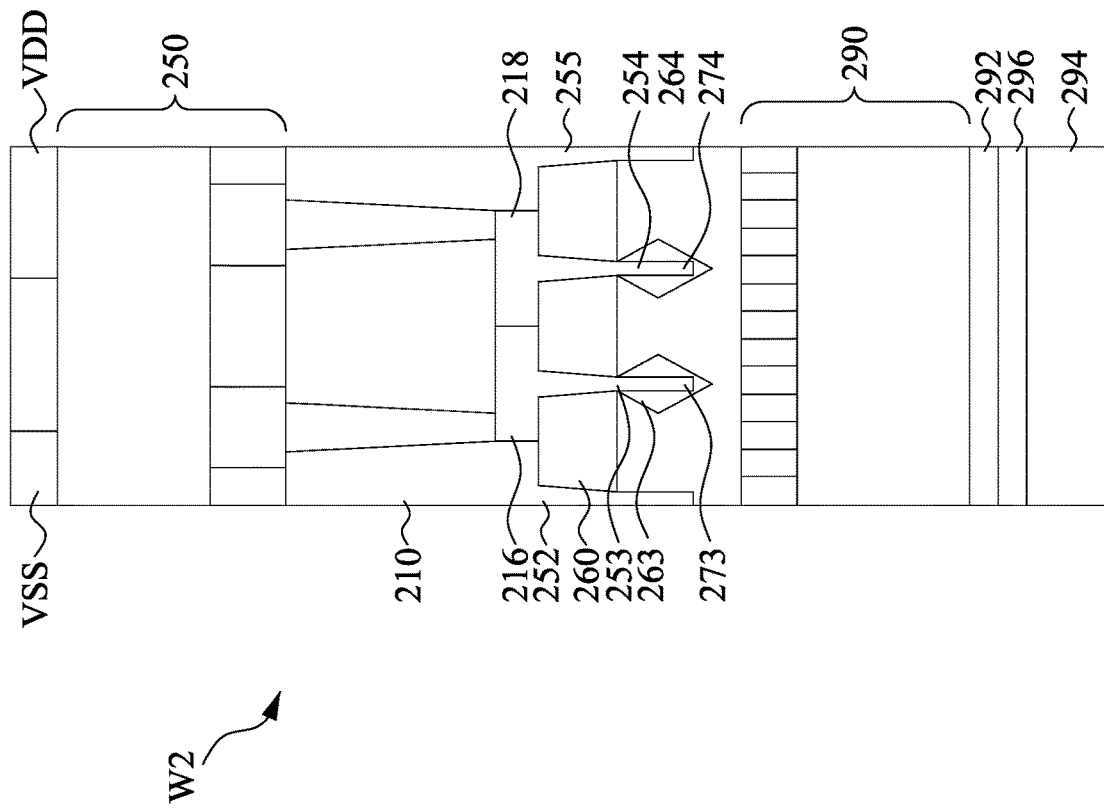

Returning to FIG. 24, the method M2 then proceeds to block S212 where a BEOL-type interconnect stack and terminals over the BEOL-type interconnect stack are formed to connect the TSVs. With reference to FIG. 36, in some embodiments of block S212, a BEOL-type interconnect stack 250 and terminals VDD and VSS over the BEOL-type interconnect stack 250 are formed to connect the TSVs 298a and/or 298b. In greater detail, a series of damascene process steps are performed for producing a BEOL-type interconnect stack 250 that connects the TSVs 298a and 298b through a low resistive circuit to terminals VDD and VSS on the backside of the wafer W2. In some embodiments, BEOL-type interconnect stack 250 may be also referred to as a power delivery network of the wafer W2.

Figure 37:
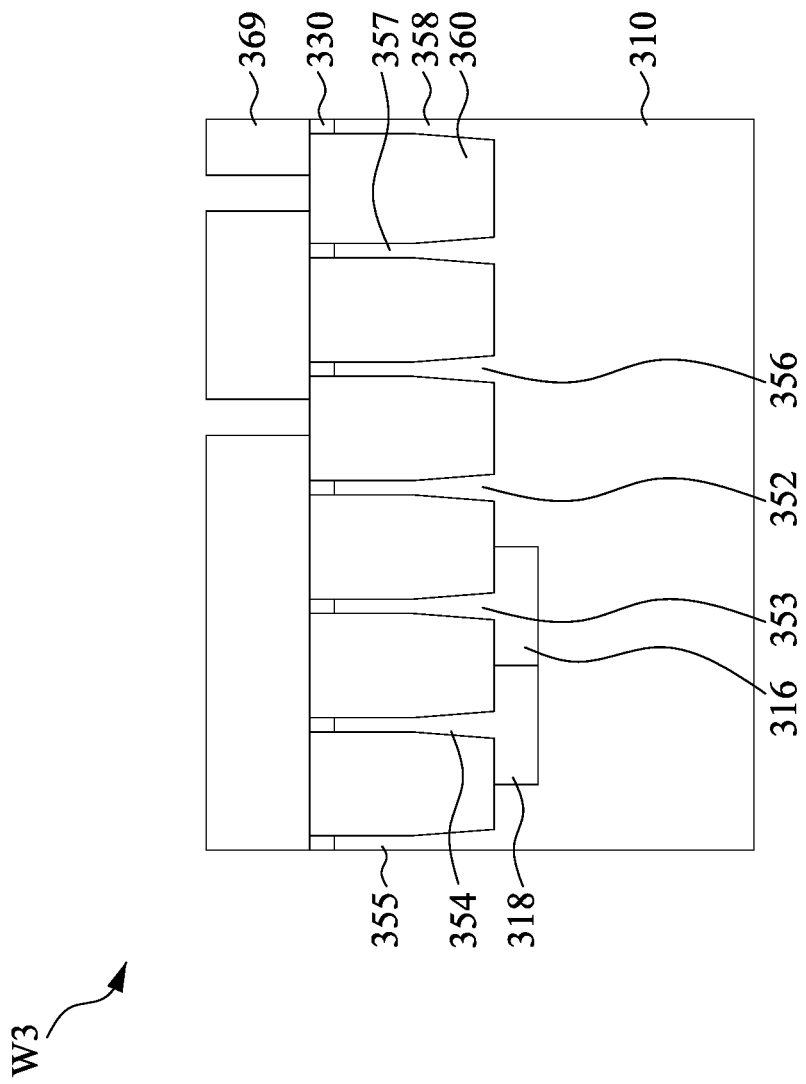
FIGS. 37-45, 46A, and 47-50 illustrate a method for manufacturing a semiconductor device at various stages in accordance with some embodiments of the present disclosure.

FIGS. 37 to 50 illustrate a method in various stages of fabricating a wafer W3 in accordance with some embodiments of the present disclosure. Operations for forming the wafer W3 prior to the structure shown in FIG. 37 are substantially the same as the operations for forming the wafer W2 shown in FIGS. 25-27 at stages S201-S203 of the method M2, and reference may be made to the foregoing paragraphs for the related detailed descriptions and such descriptions are not provided again herein. For example, material and manufacturing method of a substrate 310, a P-type well region 316, an N-type well region 318, semiconductor fins 352, 353, 354, and 355, a mask layer 330, and an isolation dielectric 360 may be substantially the same as that of the substrate 210, the P-type well region 216, the N-type well region 218, semiconductor fins 252, 253, 254, and 255, the mask layer 230, and the isolation dielectric 260 as shown in FIGS. 25-27, and the related detailed descriptions may refer to the foregoing paragraphs, and are not described again herein. The difference between the present embodiment and the embodiment in FIGS. 25-27 is that additional semiconductor fins 356, 357, and 358 of the present embodiment extend upwardly from the substrate 310, and material and manufacturing method of the semiconductor fins 356, 357, and 358 may be substantially the same as the semiconductor fins 352, 353, 354, and 355.

Reference is made to FIG. 37. A patterned mask layer 369 is formed over the isolation dielectric 360. In some embodiments, the mask layer 369 is formed by spin coating a resist material (e.g., the mask layer may be also referred to as a photo resist layer), followed by a process, such as a soft baking process and a hard baking process (may be also referred to as a pre-exposure baking). In some embodiments, the mask layer 369 is a DUV resist such as a krypton fluoride (KrF) resist or an argon fluoride (ArF) resist. In some embodiments, the mask layer 369 is an I-line resist, a EUV resist, an electron beam (e-beam) resist, or an ion beam resist. In some embodiments, the mask layer 369 is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer 369 is a negative resist. The negative resist is soluble in a developer but becomes insoluble upon radiation.

After coating the mask layer 369 over the isolation dielectric 360, the mask layer 369 is exposed to a radiation through a mask. After exposing the mask layer 369 to the radiation is complete, the exposed mask layer 369 undergoes one or more post-exposure baking (PEB) processes. Then, a developing process is performed, such that portions of the exposed mask layer 369 are removed to expose portions of the isolation dielectric 360 between the semiconductor fins 352 and 356 and between the semiconductor fins 357 and 358. The mask layer 369 may act as an etch mask to protect the rest of the isolation dielectric 360 from the subsequent etching process.

Figure 38:
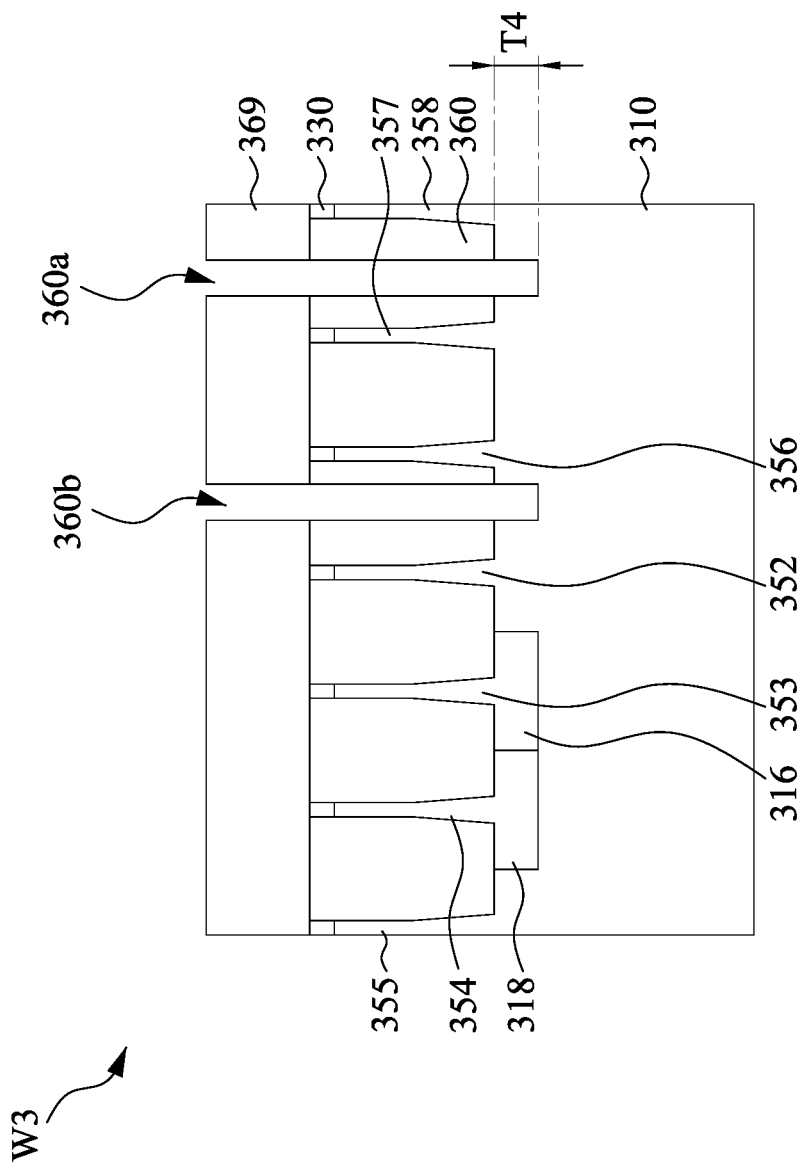

Reference is made to FIG. 38. An etching process is performed to the isolation dielectric 360 through the mask layer 369, such that trenches 360a and 360b are formed to extend through the isolation dielectric 360 into the substrate 310. When the etching process is complete, the trenches 360a and 360b are formed to have bottoms at positons in the substrate 310 and level with lowermost boundaries of the P-type well region 316 and the N-type well region 318. In some embodiments, the trenches 360a and 360b may have bottoms at positons lower than the lowermost boundaries of the P-type well region 316 and the N-type well region 318. In some embodiments, the trenches 360a and 360b may have bottoms at positons higher than the lowermost boundaries of the P-type well region 316 and the N-type well region 318. By way of example but not limitation, the trench 360a and/or 360b in the well region 316 and/or 318 has a depth T4 in a range from about 30 nm to about 200 nm.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 39:
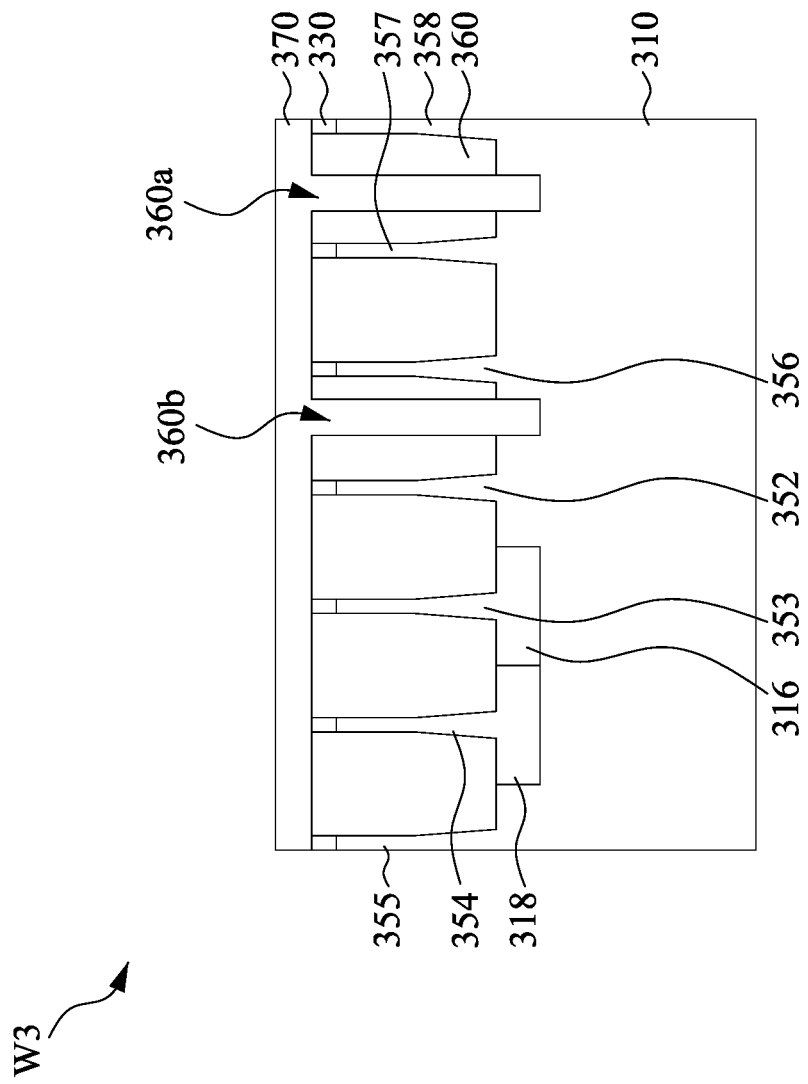

Reference is made to FIG. 39. A conductive material 370 is formed over the isolation dielectric 360 and filled in the trenches 360a and 360b. In some embodiments, the conductive material 370 may include metal, such as tungsten (W), ruthenium (Ru), aluminum (Al), copper (Cu), or other suitable conductive material. In some embodiments, the conductive material 370 may be deposited by CVD, physical vapor deposition (PVD), sputter deposition, or other techniques suitable for depositing conductive materials.

Figure 40:
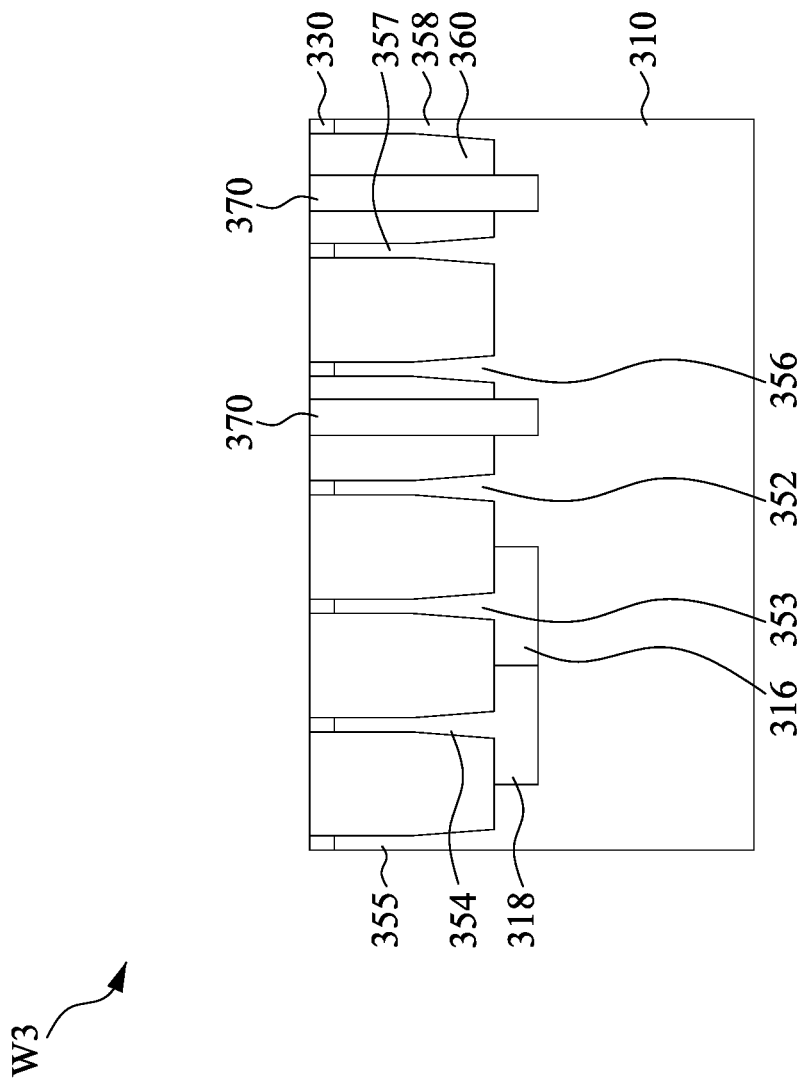

Reference is made to FIG. 40. A planarization process is performed to the conductive material 370. In some embodiments, the planarization process such as chemical mechanical polish (CMP) may be performed to remove the excess conductive material 370 over the isolation dielectric 130. In some other embodiments, the planarization process stops when the isolation dielectric 360 is exposed. In such embodiments, the isolation dielectric 360 may act as the CMP stop layer in the planarization.

Figure 41:
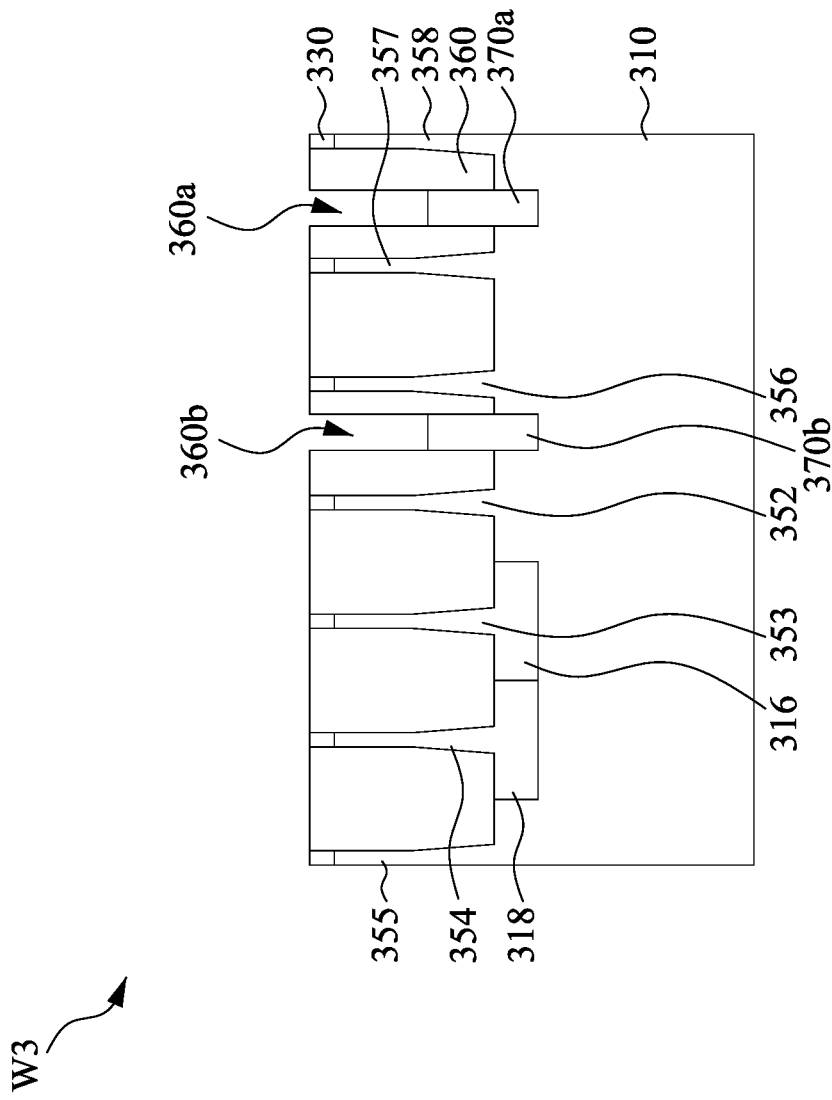

Reference is made to FIG. 41. The conductive material 370 is etched in the trenches 360a and 360b down to a given depth, leaving a portion of conductive material 370 in the trenches 360a and 360b thus forming buried power rails 370a and 370b of this height. In some embodiments, the buried power rails 370a and 370b may also be referred to as conductive rails 370a and 370b. In some embodiments, the buried power rail 370a and/or 370b may also be referred to as a supply power rail and/or ground reference rail. For example, the buried power rail 370a may be referred to as a ground reference rail and the buried power rail 370b may be referred to as a supply power rail. The buried power rail 370a and/or 370b extends along a lengthwise direction of the semiconductor fins 352-358 as the buried power rail 170a and/or 170b shown in FIG. 2. In some embodiments, the thinning down of the conductive material 370 may include a dry etching process or other suitable etching processes. In some embodiments, the etch process include using a technique and etchant selected to etch the conductive material 370 without significant etching of the surrounding structures (i.e., isolation dielectric 360).

In FIG. 41, the buried power rail 370a and/or 370b is formed to have a bottom surface at a position level with a lowermost boundary of the P-type well region 316 and/or the N-type well region 318. In some embodiments, the buried power rail 370a and/or 370b may have a bottom surface at a position lower than the lowermost boundaries of the P-type well region 316 and/or the N-type well region 318. In some embodiments, the buried power rail 370a and/or 370*b* may have a bottom at a position higher than the lowermost boundaries of the P-type well region 316 and/or the N-type well region 318.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 42:
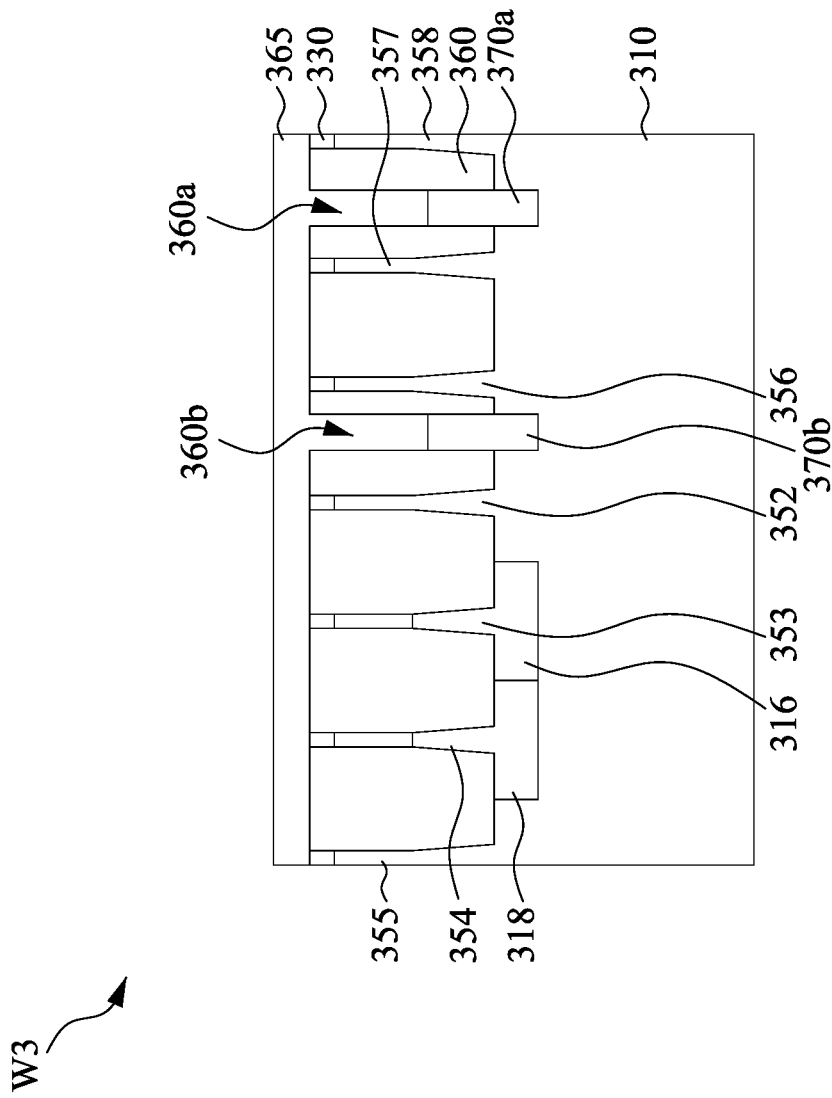

Reference is made to FIG. 42. An isolation dielectric 365 is formed over the isolation dielectric 360 and filled in the trenches 360*a* and 360*b* to land on the buried power rails 370*a* and 370*b*. The isolation dielectric 365 in the trenches 360*a* and 360*b* can be referred to as a shallow trench isolation (STI) structure. In some embodiments, the isolation dielectric 365 is made of silicon oxide, silicon nitride, silicon oxynitride, fluoride-doped silicate glass (FSG), or other low-K dielectric materials. In some embodiments, the isolation dielectric 365 has a material different than the isolation dielectric 360. In some embodiments, the isolation dielectric 365 has a material the same as the isolation dielectric 360.

In some embodiments, the isolation dielectric 365 may be formed using a high-density-plasma (HDP) chemical vapor deposition (CVD) process, using silane ($SiH_4$) and oxygen ($O_2$) as reacting precursors. In some other embodiments, the isolation dielectric 365 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 365 may be formed using a spin-on-dielectric (SOD) process, such as hydrogen silsesquioxane (HSQ) or methyl silsesquioxane (MSQ). Other processes and materials may be used. In some embodiments, the isolation dielectric 365 can have a multi-layer structure, for example, a thermal oxide liner layer with silicon nitride formed over the liner. Thereafter, a thermal annealing may be optionally performed to the isolation dielectric 365.

Figure 43:
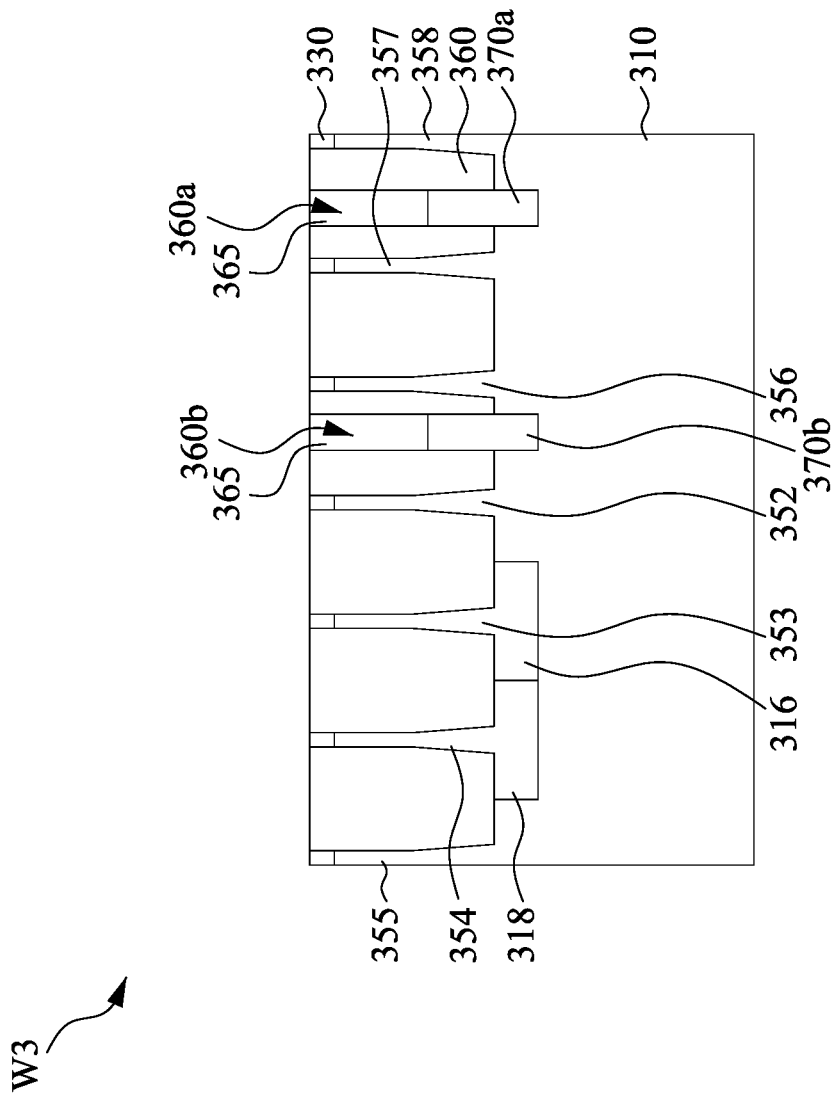

Reference is made to FIG. 43. The isolation dielectric 365 over the isolation dielectric 360 is removed. In some embodiments, a planarization process such as chemical-mechanical polish (CMP) may be performed to remove the excess isolation dielectric 365 over the isolation dielectric 360. In some other embodiments, the planarization process stops when the isolation dielectric 360 is exposed. In such embodiments, the isolation dielectric 360 may act as the CMP stop layer in the planarization. In some other embodiments, the planarization process stops when the mask layer 330 is exposed. In such embodiments, the mask layer 330 may act as the CMP stop layer in the planarization. In some embodiments, the planarization process may also remove the mask layer 330 such that top surfaces of the semiconductor fins 352-358 are exposed.

Figure 44:
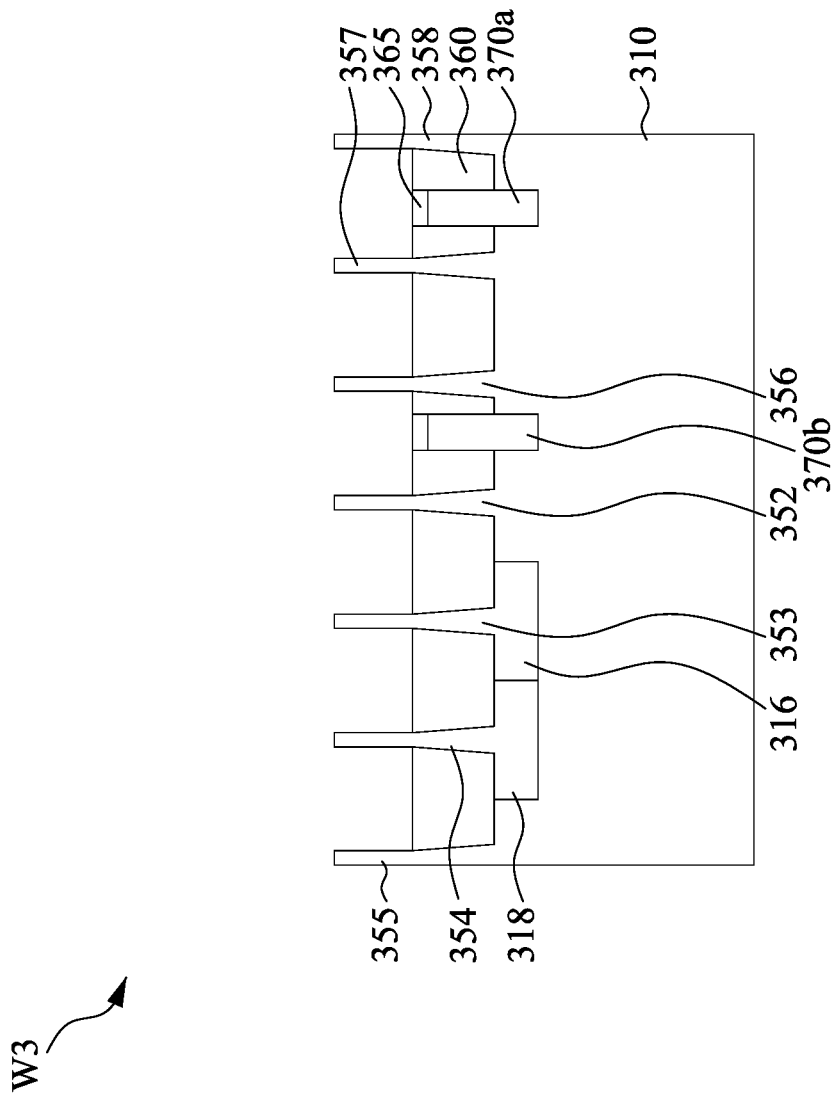

Reference is made to FIG. 44. The isolation dielectrics 360 and 365 are recessed, for example, through an etching operation, in which diluted HF, SiCoNi (including HF and $NH_3$), or the like, may be used as the etchant. After recessing the isolation dielectric 365, portions of the semiconductor fins 352-358 are higher than a top surface of the isolation dielectric 360 and higher than a top surface of the isolation dielectric 365. This is followed by the gate formation (not shown, e.g., gate structures 182 and 184 shown in FIG. 2), and which may be done by a technique, for example a replacement gate technique. The gate formations are formed perpendicularly to the semiconductor fins 352-358.

Figure 45:
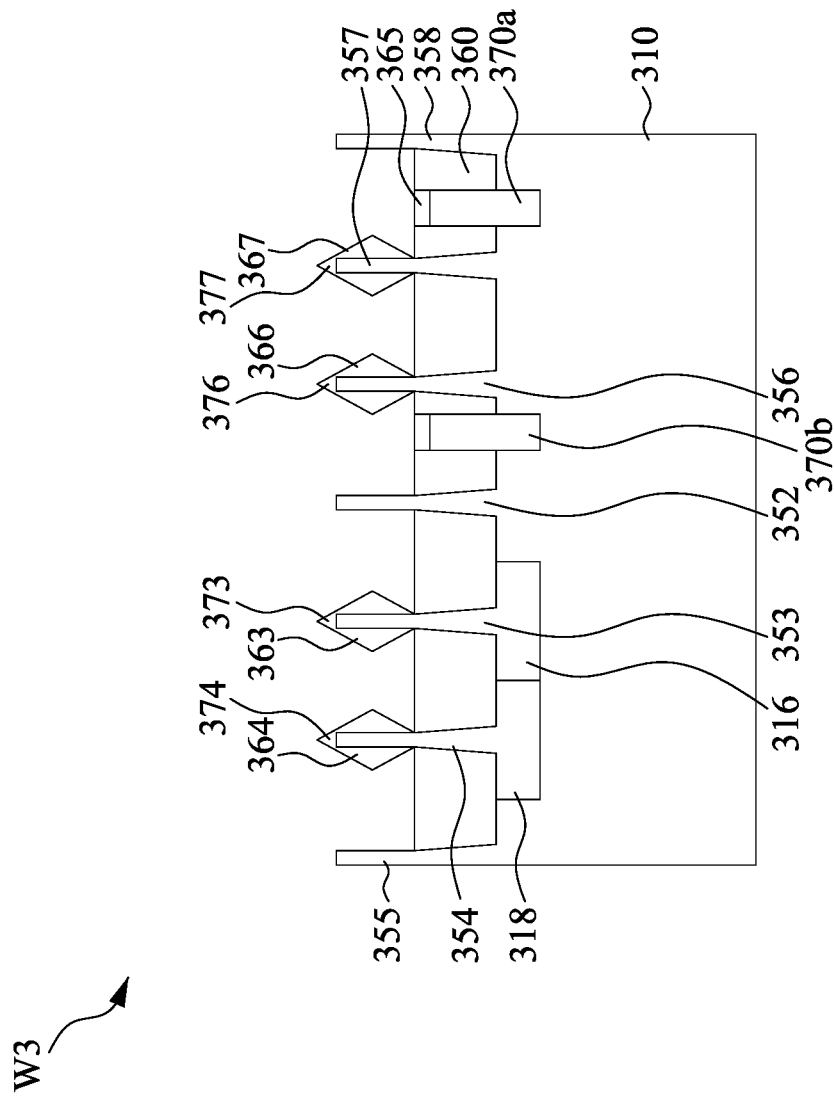

Reference is made to FIG. 45. Source/drain features 373, 374, 376, and 377 are formed on the semiconductor fins 353, 354, 356, and 357. In greater detail, a patterned mask layer (not shown) is formed over the semiconductor fins 352-358. In some embodiments, the mask layer is formed by spin coating a resist material (e.g., the mask layer may be also referred to as a photo resist layer), followed by a process, such as a soft baking process and a hard baking process (may be also referred to as a pre-exposure baking). In some embodiments, the mask layer is a DUV resist such as a krypton fluoride (KrF) resist or an argon fluoride (ArF) resist. In some embodiments, the mask layer is an I-line resist, a EUV resist, an electron beam (e-beam) resist, or an ion beam resist. In some embodiments, the mask layer is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer is a negative resist. The negative resist is soluble in a developer but becomes insoluble upon radiation.

After coating the mask layer over the semiconductor fins 352-358, the mask layer is exposed to a radiation through a mask. After exposing the mask layer to the radiation is complete, the exposed mask layer undergoes one or more post-exposure baking (PEB) processes. Then, a developing process is performed, such that portions of the exposed mask layer are removed, and the mask layer acts as a mask to protect the semiconductor fins 352, 355, and 358 from a subsequent epitaxial growth process. When the etching process is complete, a trench is formed to run through the mask layer and to expose the semiconductor fins 353, 354, 356, and 357 and the top surface of the isolation dielectric 360. In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Then, the source/drain features 373, 374, 376, and 377 may be formed by performing an epitaxial growth process that provides epitaxy materials 363, 364, 366, and 367 cladding the portions of the semiconductor fins 353, 354, 356, and 357. The source/drain features 373, 374, 376, and 377 include materials 363, 364, 366, and 367 formed by epitaxially growing a semiconductor material on the exposed semiconductor fins 353, 354, 356, and 357. In other words, the materials 363, 364, 366, and 367 are formed around the semiconductor fins 353, 354, 356, and 357; this may be referred to as forming a "cladding" around the semiconductor fins 353, 354, 356, and 357. Thus, the source/drain features 373, 374, 376, and 377 include the semiconductor fins 353, 354, 356, and 357 and the epitaxially grown materials 363, 364, 366, and 367 are formed. It is noted that these features may be formed without recessing the semiconductor fins 353, 354, 356, and 357. After forming the source/drain features 373, 374, 376, and 377, the patterned mask layer covering the semiconductor fins 353, 354, 356, and 357 is removed.

In various embodiments, the grown semiconductor materials 363, 364, 366, and 367 may include Ge, Si, GaAs, AlGaAs, SiGe, GaAsP, SiP, or other suitable material. In some embodiments, the materials 363, 364, 366, and 367 may be in-situ doped during the epi process. For example, in some embodiments, epitaxially grown materials 363, 364, 366, and 367 may be doped with boron. In some embodiments, epitaxially grown materials 363, 364, 366, and 367 may be doped with carbon to form Si:C source/drain features, phosphorous to form Si:P source/drain features, or both carbon and phosphorous to form SiCP source/drain features. In an embodiment, the semiconductor fins 353, 354, 356, and 357 are made of silicon and the epitaxially grown materials 363, 364, 366, and 367 also are silicon. In some embodiments, the semiconductor fins 353, 354, 356, and 357 and the epitaxially grown materials 363, 364, 366, and 367 may comprise a similar material, but be differently doped. In other embodiments, the semiconductor fins 353, 354, 356, and 357 include a first semiconductor material, the epitaxially grown materials 363, 364, 366, and 367 include a second semiconductor different than the first semiconductor material. In some embodiments, the epitaxially grown materials 363, 364, 366, and 367 are not in-situ doped, and, for example, instead an implantation process is performed to dope the epitaxially grown materials 363, 364, 366, and 367.

In some embodiments, a dummy gate structure (not shown) including a gate dielectric and a gate electrode over the gate dielectric is formed to extend across the semiconductor fins 352-358 prior to forming the source/drain features 373, 374, 376, and 377. In some embodiments, in order to form the dummy gate structure, a gate dielectric layer is formed over the semiconductor fins 353, 354, 356, and 357, followed by a dummy gate electrode layer. The gate dielectric layer and the dummy gate electrode layer are then patterned, respectively forming the gate dielectric and the gate electrode. Hard masks may be formed on the dummy gate structure for process reasons, in which the hard masks may include silicon nitride. The channel portions of the semiconductor fins 353, 354, 356, and 357 are covered by the dummy gate structure, and the source/drain portions of the semiconductor fins 353, 354, 356, and 357 are uncovered by the dummy gate structure. In other words, the dummy gate structure is formed over the channel portions of the semiconductor fins 353, 354, 356, and 357.

Figure 46A:
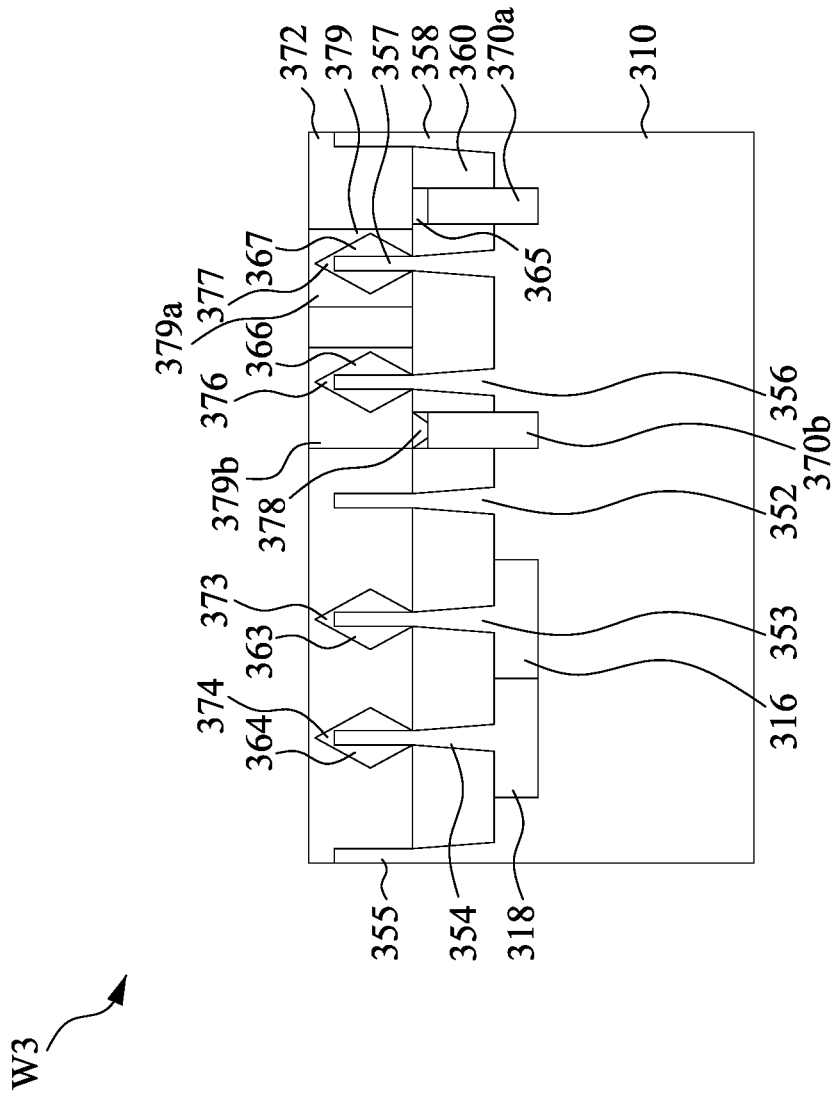

Reference is made to FIG. 46A. An interlayer dielectric (ILD) layer 372 is formed over the source/drain features 373, 374, 376, and 377 and the dummy gate structure. That is, the source/drain features 373, 374, 376, and 377 are covered and protected by the ILD layer 372 during process(es) performed later. Moreover, the ILD layer 372 is formed over the dummy gate structure. Then, a chemical mechanical planarization (CMP) process is performed to remove portions of the ILD layer 372. During the CMP process, the dummy gate structures are exposed. The remaining portions of the ILD layer 372 cover the source/drain features 373, 374, 376, and 377. The ILD layer 372 may include silicon oxide, oxynitride or other suitable materials.

In some embodiments, a replacement gate (RPG) process scheme is employed. In the RPG process scheme, a dummy gate structures are formed in advance and is replaced by a metal gate. The dummy gate structure may be removed by dry etch, wet etch, or a combination of dry and wet etch. For example, a wet etch process may include exposure to a hydroxide containing solution (e.g., ammonium hydroxide), deionized water, and/or other suitable etchant solutions. The metal gate may include a metal, metal alloy, and/or metal silicide. Additionally, the formation of the metal gate may include depositions to form various gate materials, one or more liner layers, and one or more CMP processes to remove excessive gate materials and thereby planarizing top surfaces of the metal gate.

In FIG. 46A, a conductive via 378 is formed to land on the buried power rail 370b through the isolation dielectric 365. Conductive contacts 379a and 379b are formed to land on the source/drain features 377 and 376. As shown in FIG. 46A, the conductive contact 379b formed in the ILD layer 372 is further connected to the buried power rail 370b through the conductive via 378. The conductive contacts 379a is further connected to the buried power rail 370a in another view.

Figure 46B:
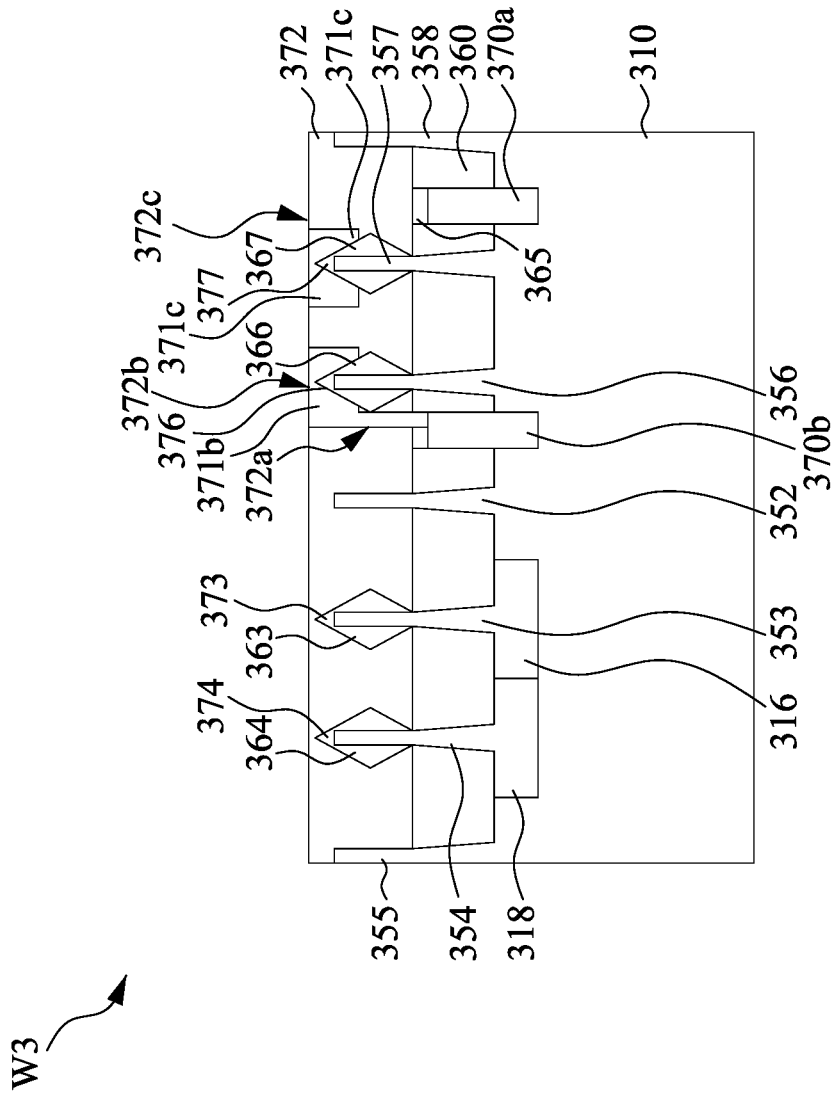
FIG. 46B illustrates another semiconductor device at a stage corresponding to FIG. 46A according to some alternative embodiments of the present disclosure.

FIG. 46B illustrates another wafer at a stage corresponding to FIG. 46A according to some alternative embodiments of the present disclosure to illustrate a different profile of an interconnect between the source/drain features 376 and the buried power rail 370b. As shown in FIG. 46B, a trench 372a is formed to extend from the top surface of the ILD layer 372 straightly downwardly to the buried power rail 370b and is formed by etching the ILD layer 372 and the isolation dielectric 365 with a first patterned mask layer. Further, trenches 372b and 372c are formed to extend from the top surface of the ILD layer 372 downwardly to the source/drain features 376 and 377 and is formed by etching the ILD layer 372 with a second patterned mask layer. In FIG. 46B, bottoms of the trenches 372b and 372c are at a position higher than maximal widths of the source/drain features 376 and 377. In some embodiments, the bottoms of the trenches 372b and 372c may be at a position lower than maximal widths of the source/drain features 376 and 377 and higher than a top surface of the isolation dielectric 360. In some embodiments, the bottoms of the trenches 372b and 372c may be level with the top surface of the isolation dielectric 360. Then, a conductive material is formed to fill in the trenches 372a, 372b, and 372c of the ILD layer 372 to form an interconnect 371b that connects the source/drain feature 376 and to the buried power rail 370b and an interconnect 371c that connects the source/drain feature 377 and to the buried power rail 370a.

Figure 47:
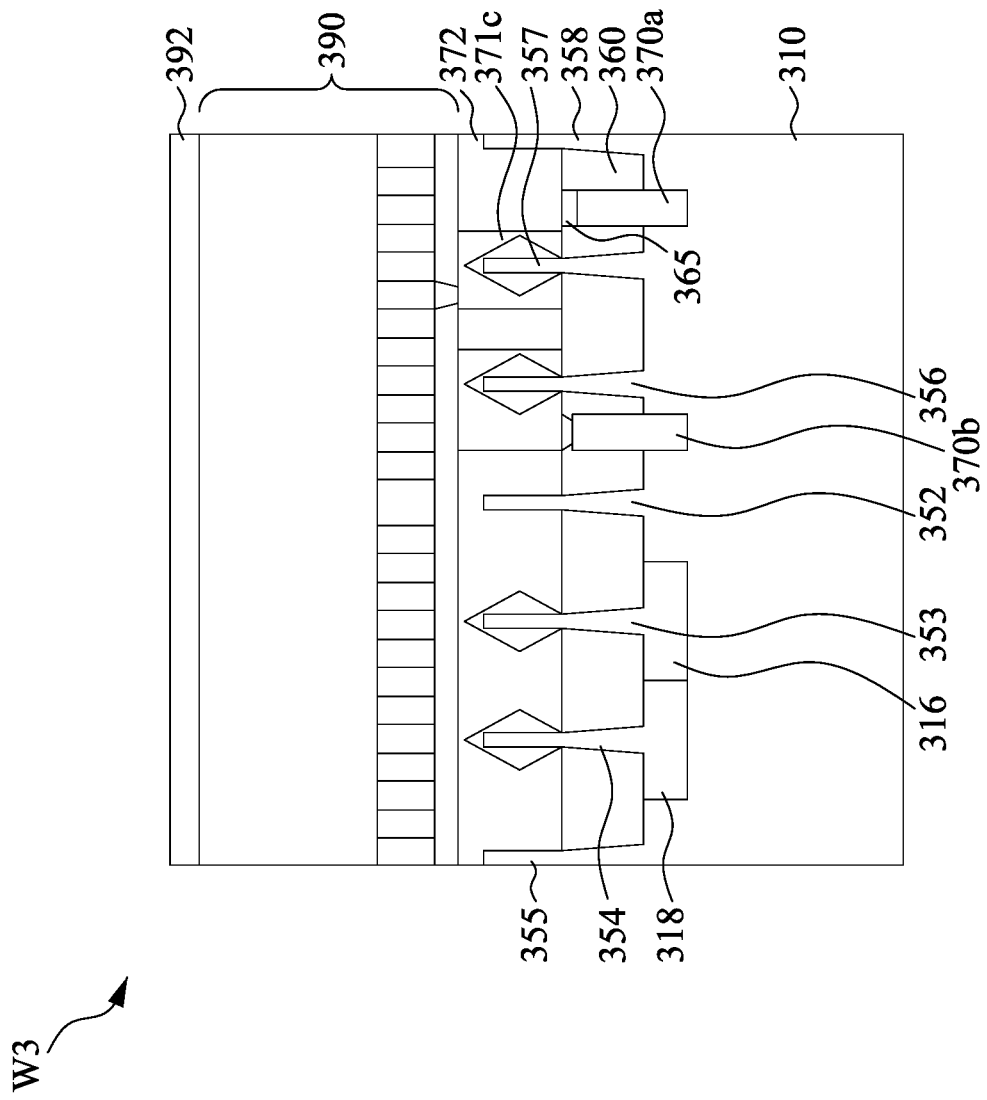

Reference is made to FIG. 47. The wafer W3 is fabricated by FEOL (front end of line) and BEOL (back end of line) processing on a semiconductor wafer, the FEOL process including the above-described steps. The buried power rails 370a/370b which is to be connected to VDD, VSS, the conductive via 378, and the conductive contacts 379a and 379b as described above. A BEOL stack 390 is formed over the substrate 310 and is illustrated in a schematic manner, without detailing the interconnections. The BEOL stack 190 is formed using a BEOL process. The BEOL process involves forming the metal wiring between the device structures in the wafer W1 in order to interconnect them including forming contacts, interconnect wires, via structures, and dielectric structures. Then, a bonding layer 392 is formed over the BEOL stack 390. In some embodiments, the bonding layer 392 may include silicon oxide, SiCN, or any other material applicable in the direct bonding technology applied in state of the art packaging techniques.

Figure 48:
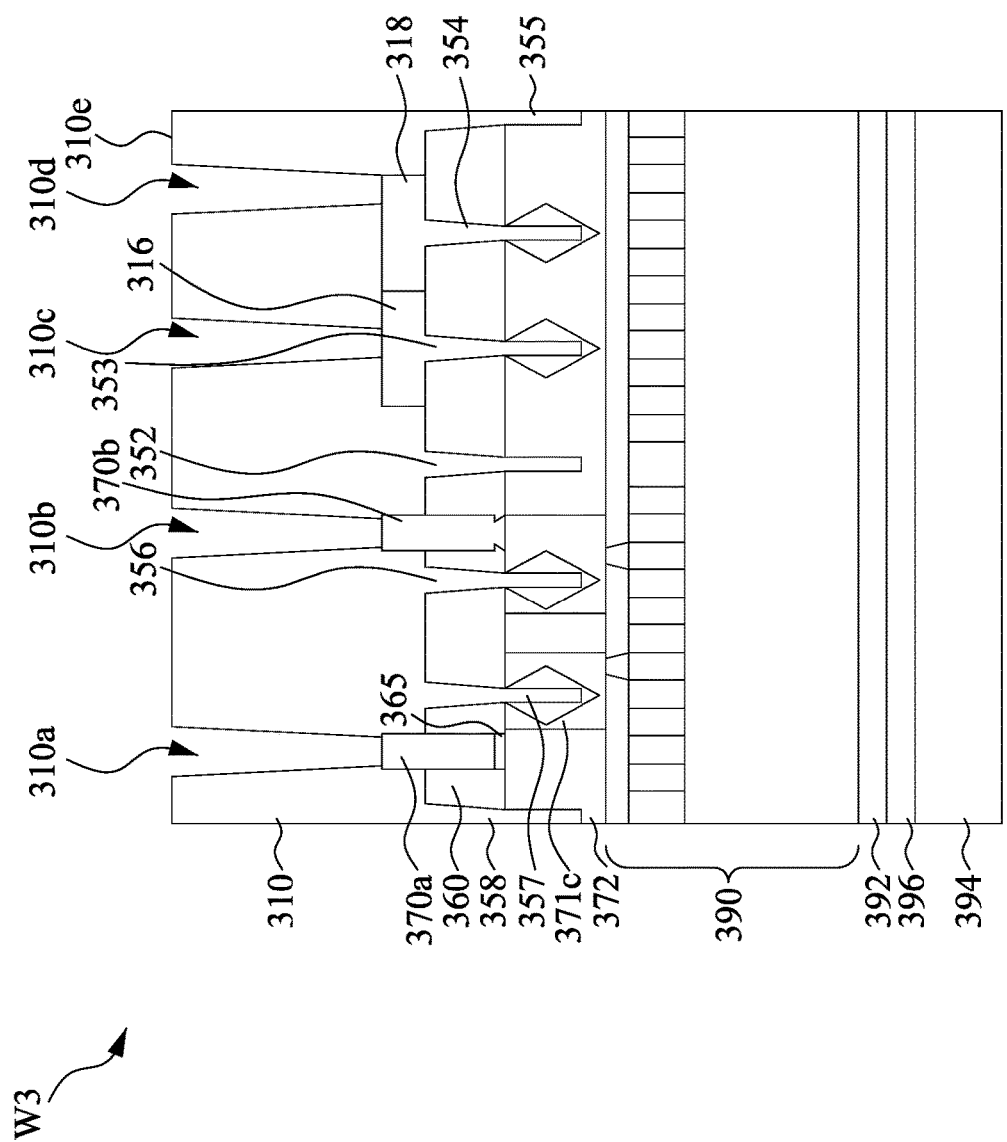

Reference is made to FIG. 48. The wafer W3 is bonded to an carrier substrate 394 through the bonding layer 392. In some embodiments, the carrier substrate 394 substrate is also provided with a bonding layer 396 thereon. The bonding layer 396 may include silicon oxide, SiCN, or any other material applicable in the direct bonding technology applied in state of the art packaging techniques. Bonding of the wafer W3 to the carrier substrate 394 takes place by a direct bonding techniques, thus obtaining a bonded wafer stack as shown in FIG. 48.

In some embodiment, after bonding of the wafer W3, the substrate 310 of the wafer W3 may be thinned using grinding and/or wet or dry etching techniques by way of example but not limitation. The remaining substrate thickness is in a range from about 50 nm to about 500 nm, by way of example but not limitation. In some embodiments, further reduction of the thickness is then performed, down to a semiconductor thickness of about 1 µm, by way of example but not limitation. In some embodiments, the thinning may be achieved by incorporating in the device wafer a doped layer which can act as an etch stop layer. A selective wet etching step stopping on the doped layer is then applied for thinning the semiconductor wafer to the required thickness of about 1 µm by way of example but not limitation.

In FIG. 48, the TSV opening 310a and/or 310b is formed through the substrate 310 until reaching the buried power rail 370a and/or 370b that is connected to power or ground. The TSV opening 310c and/or 310d is formed through the substrate 310 until reaching the P-type well region 316 and/or the N-type well region 318 and may be used act as a conduction path to relieve the high currents and current densities during an electrostatic discharge (ESD) event to avoid breakdown of the circuits.

In greater detail, the TSV opening 310a, 310b, 310c, and/or 310d is formed with a high aspect ratio greater than about 5 in the substrate 310 by way of example but not limitation. In defining the TSV opening 310a, 310b, 310c, and/or 310d, a hard mask layer (not shown) is formed over the substrate 310 followed by forming a patterned photoresist layer (not shown) thereon. The hard mask layer may be a silicon nitride layer, a silicon oxynitride layer or the like by way of example but not limitation. The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 310, forming the TSV opening 310a, 310b, 310c, and/or 310d passing through the substrate 310. The buried power rails 370a and 370b may also act as an etch stop layer for etching the substrate 310 until the buried power rails 370a and 370b are exposed. Because the TSV opening 310a, 310b, 310c, and/or 310d are formed simultaneously, a bottom of the TSV opening 310c and/or 310d may be level with a bottom of the TSV opening 310a and/or 310b and level with a surface of the power rail 370a and/or 370b exposing by the TSV opening 310a and/or 310b.

In some embodiments, the TSV opening 310a, 310b, 310c, and/or 310d may be etched using any suitable etching method including, for example, a plasma etch, a chemical wet etch, a laser drill, and/or other processes. In some embodiments, the etching process includes a deep reactive ion etching (RIE) process to etch the substrate 310. The etching process may be such that the TSV opening 310a, 310b, 310c, and/or 310d is etched from a backside surface 310e of the wafer W3 to reach approximately from tens of micron to hundreds of micron in depth. In some embodiments, the etching process may result in a series of etched macro-scallops on the substrate 310 adjacent to a sidewall of the TSV opening 310a, 310b, 310c, and/or 310d. The micro-scallop sidewalls will be smoothened in subsequent process. By way of example but not limitation, the TSV opening 310a, 310b, 310c, and/or 310d has a depth in a range from about 1 µm to about 100 µm, and a diameter in a range from about 0.1 µm to about 10 µm. By way of example but not limitation, the TSV opening 110a, 110b, and/or 110c has an aspect ratio in a range from about 5 to about 10. In some embodiments, the aspect ratio of the TSV opening 310a, 310b, 310c, and/or 310d may be greater than about 10. In some embodiments, in creating the TSV opening 310a, 310b, 310c, and/or 310d with a high aspect ratio in the substrate 310, a series of etched macro-scallops (not shown) may be created on the sidewall of the substrate 310, which can vary in size depending on process parameter. The micro-scallop sidewalls will be smoothened in subsequent thermal oxidation process.

In some embodiments, the TSV opening 310a, 310b, 310c, and/or 310d has a rectangular plan-view profile (or top-view profile) as shown in FIG. 2, with a width less than the widths of the buried power rails 370a and 370b. In some embodiments, the TSV opening 310a, 310b, 310c, and/or 310d is formed with a width greater than the width of the buried power rails 370a and 370b. Alternatively, the TSV opening 310a, 310b, 310c, and/or 310d may have a circular plan-view profile, with a diameter that is less than the widths of the buried power rails 370a and 370b. In some embodiments, the TSV opening 310a, 310b, 310c, and/or 310d is formed with a diameter greater than the width of the buried power rails 370a and 370b.

Figure 49:
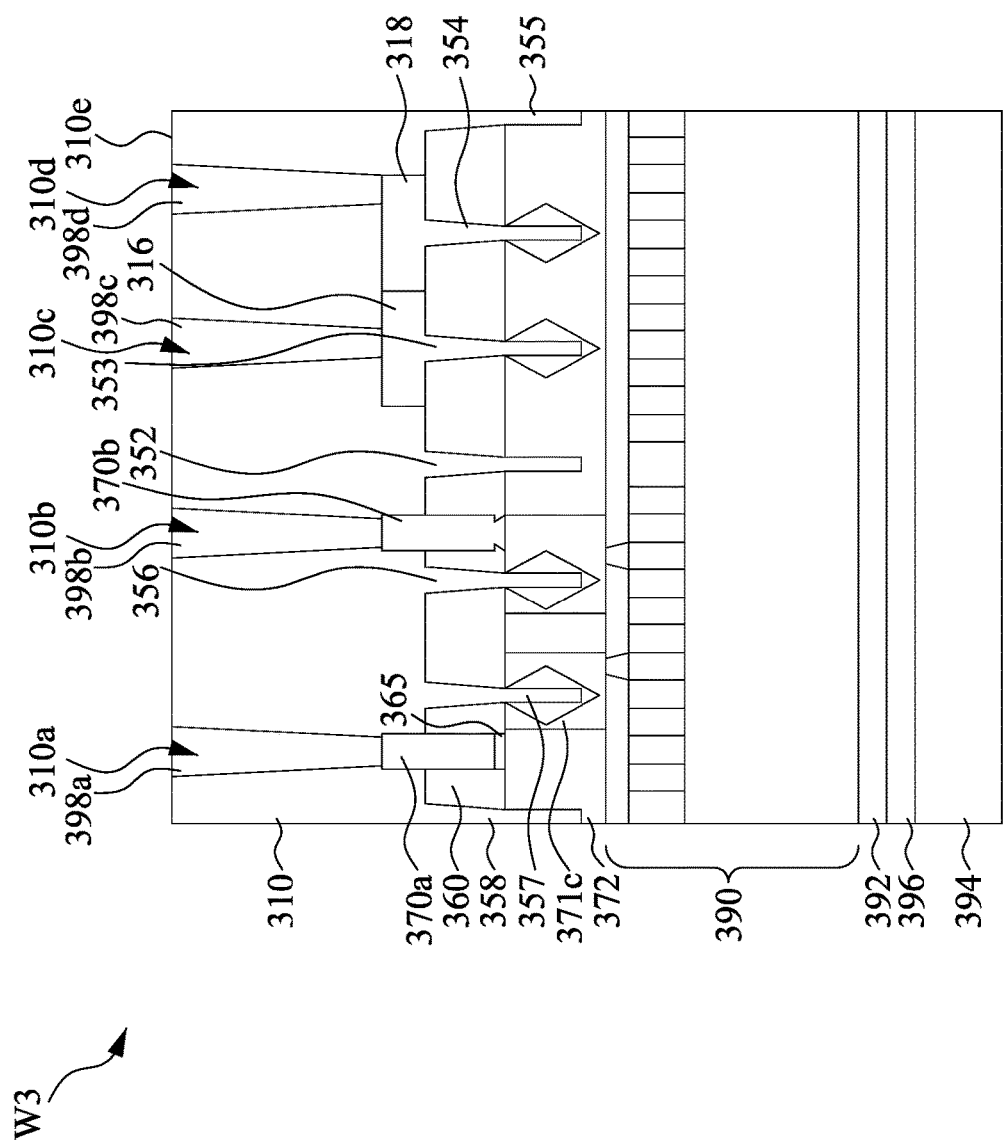

Reference is made to FIG. 49. Through substrate vias (TSVs) 398a, 398b, 398c, and 398d are formed in the TSV openings 398a, 398b, 398c, and 389d of the substrate 310. As shown in FIG. 49, the TSV 398a and/or 398b are formed in the TSV opening 110a and/or 110b of the substrate 310 and in contact with the buried power rail 370a and/or 370b to connect to the power or ground. The TSVs 398c and/or 398d is formed in the TSV opening 310c and/or 310d and in contact with the P-type well region 316 and/or the N-type well region 318. In some embodiments, the TSVs 398c and/or 398d may be used act as a conduction path to relieve the high currents and current densities during the ESD event to avoid breakdown of the circuits. Thus, the functional density can be increased while geometry size can be decreased due to without forming an ESD device on the front side of the wafer W3. In some embodiments, the TSVs 398c and/or 398d may be used act as a heat sink for the wafer W3 to discharge the heat generated by the semiconductor device from the well region to outside of the wafer W3.

In greater detail, the TSVs 398a, 398b, 398c, and/or 398d is formed by using a metallization process as well as the use of metal electroplating techniques to fill high aspect ratio openings to avoid a seam or void defect. In some embodiments, in order to avoid diffusion of metal from the TSV metal into the silicon substrate, a barrier layer (not shown) is used between the insulation layer and the TSV metal. The barrier layer may line the TSV opening 310a, 310b, 310c, and/or 310d. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Then, the wafer W3 may be transferred to a plating tool, such as an electrochemical plating (ECP) tool, and a conductive layer is plated on the wafer W3 by the plating process to fill the TSV opening 310a, 310b, 310c, and/or 310d. While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may comprise various materials, such as tungsten, ruthenium, aluminum, gold, silver, and the like. In some embodiments, the conductive layer is a copper-containing layer formed over the copper seed layer.

Subsequently, the excess portions of the conductive layer, the metal seed layer, and the barrier layer are removed, either through etching, chemical mechanical polishing (CMP), or the like, forming the upper surface of the metal-filled opening substantially coplanar with the backside surface 310e of the substrate 310. The remaining portions of the conductive layer and the barrier layer in the TSV opening 310a, 310b, 310c, and/or 310d forms the TSV 398a, 398b, 398c, and/or 398d.

The TSV 398c and/or 398d is in contact with the P-type well region 316 and/or the N-type well region 318 and electrically coupled between the buried power rails 370a and 370b. When an ESD event occurs on the buried power rails 370b, the TSV 398c and/or 398d is configured to provide a conductive path between the buried power rails 370a and 370b, which in turn allows for relieving the high currents and current densities during the ESD event, so as to avoid breakdown of the circuits. In some embodiments, the TSV 398c and/or 398d may also be referred to as an electrostatic discharge (ESD) protection circuit.

Figure 50:
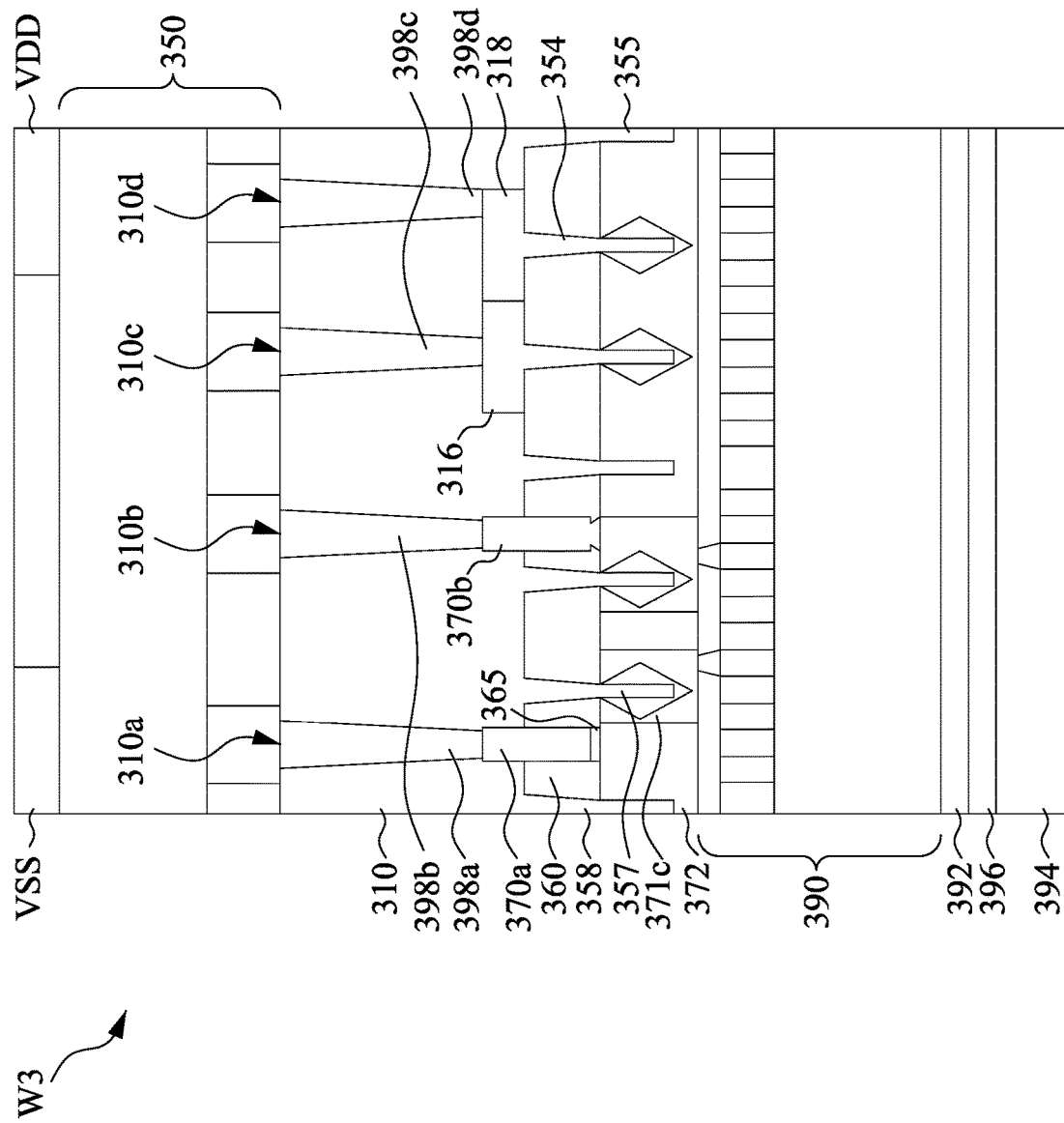

Reference is made to FIG. 50. A BEOL-type interconnect stack 350 and terminals VDD and VSS over the BEOL-type interconnect stack 350 are formed to connect the buried power rails 370a and 370b and the TSV 398c and/or 398d. In greater detail, a series of damascene process steps are performed for producing a BEOL-type interconnect stack 350 that connects the TSVs 398a, 398b, 398c, and 398d through a low resistive circuit to terminals VDD and VSS on the backside of the wafer W3. In some embodiments, BEOL-type interconnect stack 350 may be also referred to as a power delivery network of the wafer W3.

Figure 51:
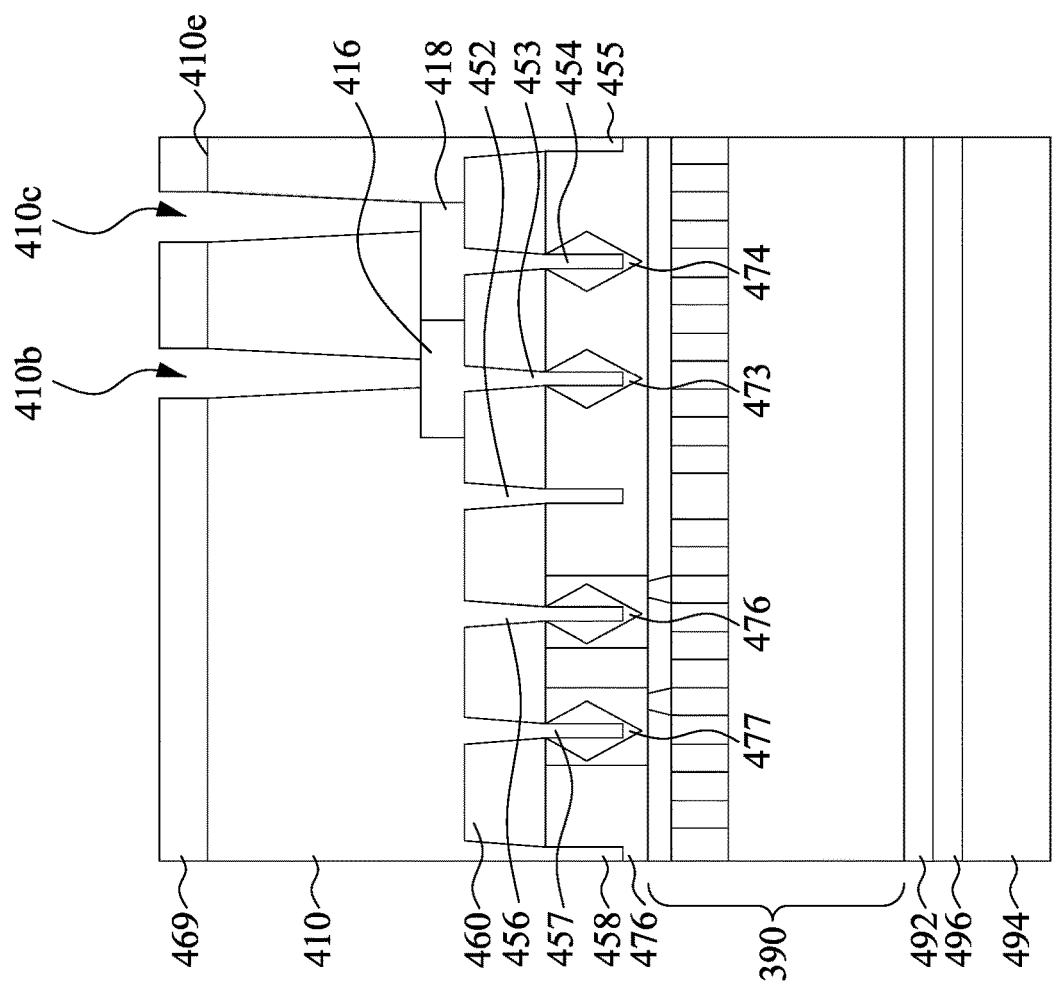
FIGS. 51-56 illustrate a method for manufacturing a semiconductor device at various stages in accordance with some embodiments of the present disclosure.

FIGS. 51 to 56 illustrate a method in various stages of fabricating a wafer W4 in accordance with some embodiments of the present disclosure. Operations for forming the wafer W4 prior to the structure shown in FIG. 51 are substantially the same as the operations for forming the wafer W3 shown in FIGS. 37-47, and reference may be made to the foregoing paragraphs for the related detailed descriptions and such descriptions are not provided again herein. For example, material and manufacturing method of a substrate 410, a P-type well region 416, an N-type well region 418, semiconductor fins 452-458, and an isolation dielectric 460, a source/drain features 473, 474, 476, and 477, an ILD layer 476, a BEOL stack 490, a bonding layer 492, and an carrier substrate 494 may be substantially the same as that of the substrate 310, the P-type well region 316, the N-type well region 318, semiconductor fins 352-358, and the isolation dielectric 360, the source/drain features 373, 374, 376, and 377, the ILD layer 372, the BEOL stack 390, the bonding layer 392, and the carrier substrate 394 as shown in FIGS. 37-47, and the related detailed descriptions may refer to the foregoing paragraphs, and are not described again herein. The difference between the present embodiment and the embodiment in FIGS. 37-47 is that the buried power rails 370a and 370b, the conductive via 378, and the conductive contacts 379a and 379b of the wafer W3 shown in FIGS. 37-47 are omitted in the present embodiment.

Reference is made to FIG. 51. A patterned mask layer 469 is formed over a backside surface 410e of the substrate 410. In some embodiments, the mask layer 469 is formed by spin coating a resist material (e.g., the mask layer may be also referred to as a photo resist layer), followed by a process, such as a soft baking process and a hard baking process (may be also referred to as a pre-exposure baking). In some embodiments, the mask layer 469 is a DUV resist such as a krypton fluoride (KrF) resist or an argon fluoride (ArF) resist. In some embodiments, the mask layer 469 is an I-line resist, a EUV resist, an electron beam (e-beam) resist, or an ion beam resist. In some embodiments, the mask layer 469 is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer 469 is a negative resist. The negative resist is soluble in a developer but becomes insoluble upon radiation.

After coating the mask layer 469 over the substrate 410, the mask layer 469 is exposed to a radiation through a mask. After exposing the mask layer 469 to the radiation is complete, the exposed mask layer 469 undergoes one or more post-exposure baking (PEB) processes. Then, a developing process is performed, such that portions of the exposed mask layer 469 are removed to expose portions of the substrate 310 directly above the P-type well region 416 and the N-type well region 418. The mask layer 469 may act as an etch mask to protect the rest of the substrate 410 from the subsequent etching process.

Then, the TSV opening 410b and/or 410c are formed in the substrate 410 through the mask layer 469 until reaching the P-type well region 416 and the N-type well region 418 and may be used act as a conduction path to relieve the high currents and current densities during an electrostatic discharge (ESD) event to avoid breakdown of the circuits. In greater detail, the TSV opening 410b and/or 410c is formed with a high aspect ratio greater than about 5 in the substrate 410 by way of example but not limitation.

In some embodiments, the TSV opening 410b and/or 410c may be etched using any suitable etching method including, for example, a plasma etch, a chemical wet etch, a laser drill, and/or other processes. In some embodiments, the etching process includes a deep reactive ion etching (RIE) process to etch the substrate 410. The etching process may be such that the TSV opening 410b and/or 410c is etched from a backside surface 410e of the wafer W4 to reach approximately from tens of micron to hundreds of micron in depth. In some embodiments, the etching process may result in a series of etched macro-scallops on the substrate 410 adjacent to a sidewall of the TSV opening 410b and/or 410c. The micro-scallop sidewalls will be smoothened in subsequent process. By way of example but not limitation, the TSV opening 410b and/or 410c has a depth in a range from about 1 µm to about 100 µm, and a diameter in a range from about 0.1 µm to about 10 µm. By way of example but not limitation, the TSV opening 410b and/or 410c has an aspect ratio in a range from about 5 to about 10. In some embodiments, the aspect ratio of the TSV opening 410*b* and/or 410*c* may be greater than about 10. In some embodiments, in creating the TSV opening 410*b* and/or 410*c* with a high aspect ratio in the substrate 410, a series of etched macro-scallops (not shown) may be created on the sidewall of the substrate 410, which can vary in size depending on process parameter. The micro-scallop sidewalls will be smoothened in subsequent thermal oxidation process. In some embodiments, the TSV opening 410*b* and/or 410*c* has a rectangular plan-view profile (or top-view profile) as shown in FIG. 2. Alternatively, the TSV opening 410*b* and/or 410*c* may have a circular cross-section. After the forming of the TSV opening 410*b* and/or 410*c*, the mask layer 469 is removed.

Figure 52:
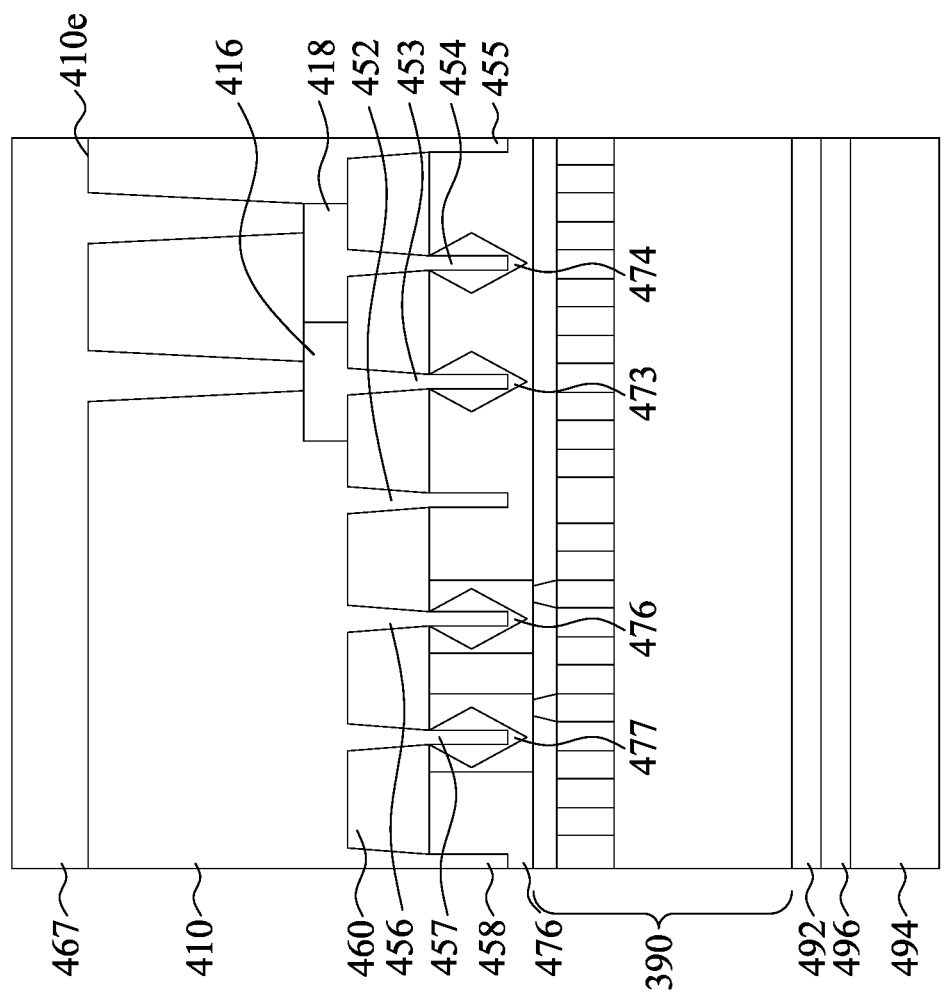

Reference is made to FIG. 52. A dielectric material 467, e.g. spin-on-glass (SOG), can be formed, covering the backside surface 410*e* of the substrate 410 and filling the TSV opening 410*c* and/or 410*d*. The dielectric material 467 can be defined by, for example, a spin-on process, a photolithographic process, and an etching process. In some embodiments, the dielectric material 467 may be made of silicon oxide, silicon nitride, silicon oxynitride, fluoride-doped silicate glass (FSG), or other low-K dielectric materials. In some embodiments, the dielectric material 467 may be formed using a high-density-plasma (HDP) chemical vapor deposition (CVD) process, using silane ($SiH_4$) and oxygen (02) as reacting precursors. In some other embodiments, the dielectric material 467 may be formed using a sub-atmospheric CVD (SACVD) process or high aspect-ratio process (HARP), in which process gases may include tetraethylorthosilicate (TEOS) and ozone ($O_3$). In yet other embodiments, the dielectric material 467 may be formed using a spin-on-dielectric (SOD) process, such as hydrogen silsesquioxane (HSQ) or methyl silsesquioxane (MSQ). Other processes and materials may be used. In some embodiments, the dielectric material 467 can have a multi-layer structure, for example, a thermal oxide liner layer with silicon nitride formed over the liner. Thereafter, a thermal annealing may be optionally performed to the dielectric material 467.

Figure 53:
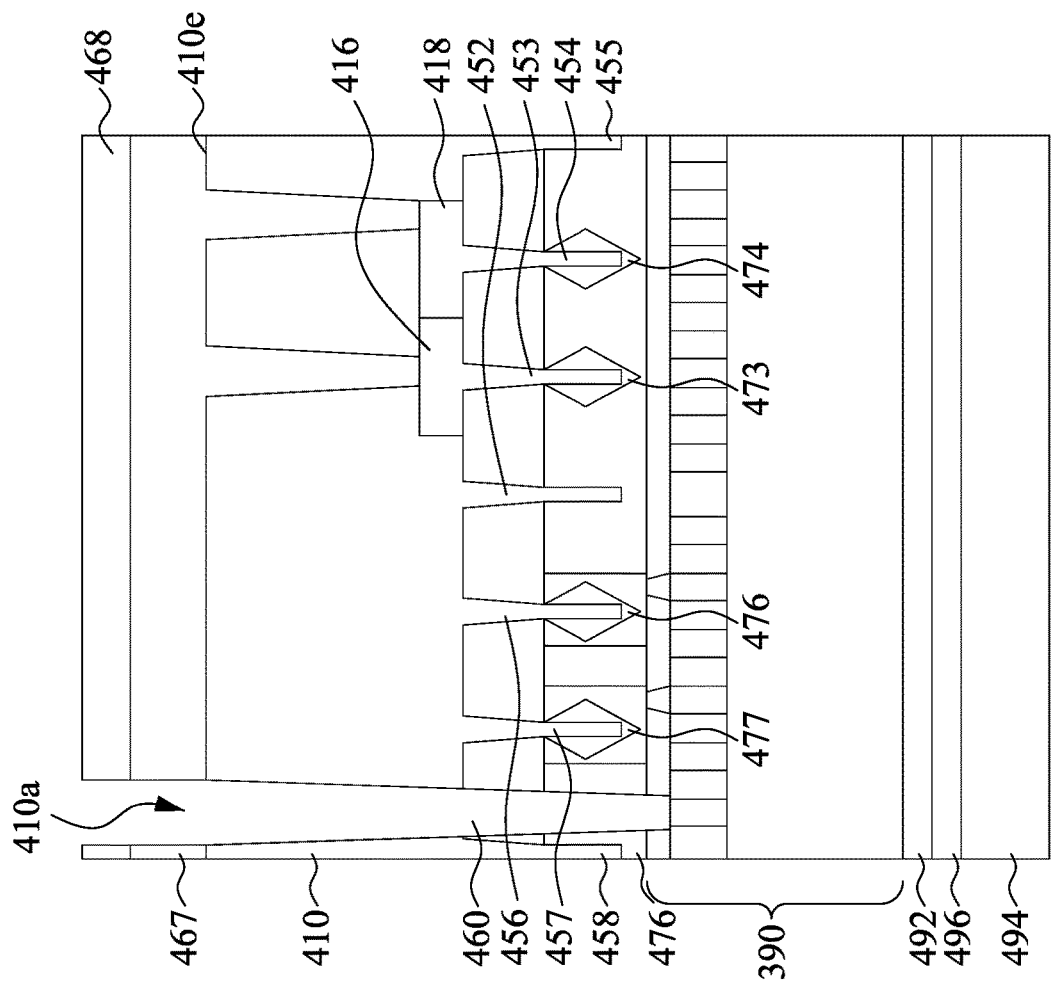

Reference is made to FIG. 53. A patterned photoresist layer 468 is formed on the dielectric material 467. Then, an etching process is performed through the patterned photoresist layer 468, such that a TSV opening 410*a* is formed to pass through the substrate 410 and the isolation dielectric 460 to reach an interconnect in the BEOL stack 490. In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 54:
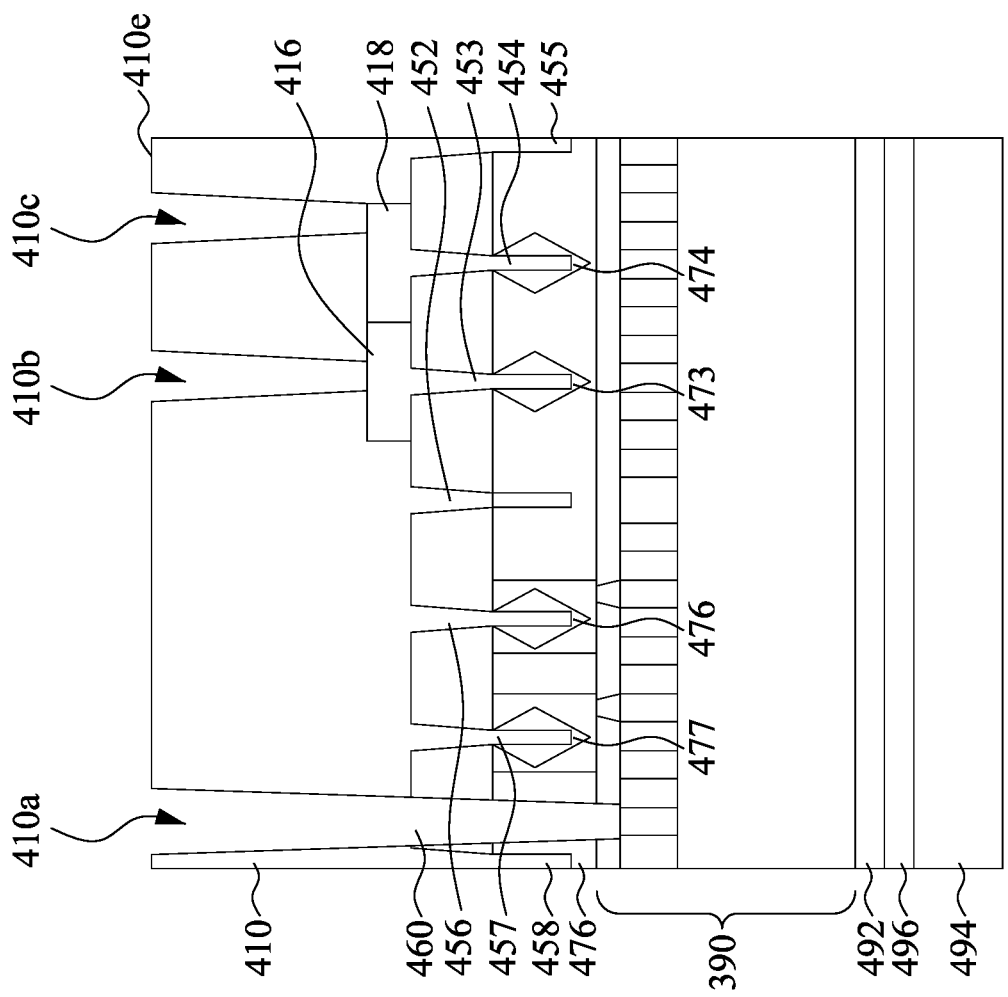

Reference is made to FIG. 54. After forming the TSV opening 410*a*, the dielectric material 467 and the photoresist layer 468 are removed.

Figure 55:
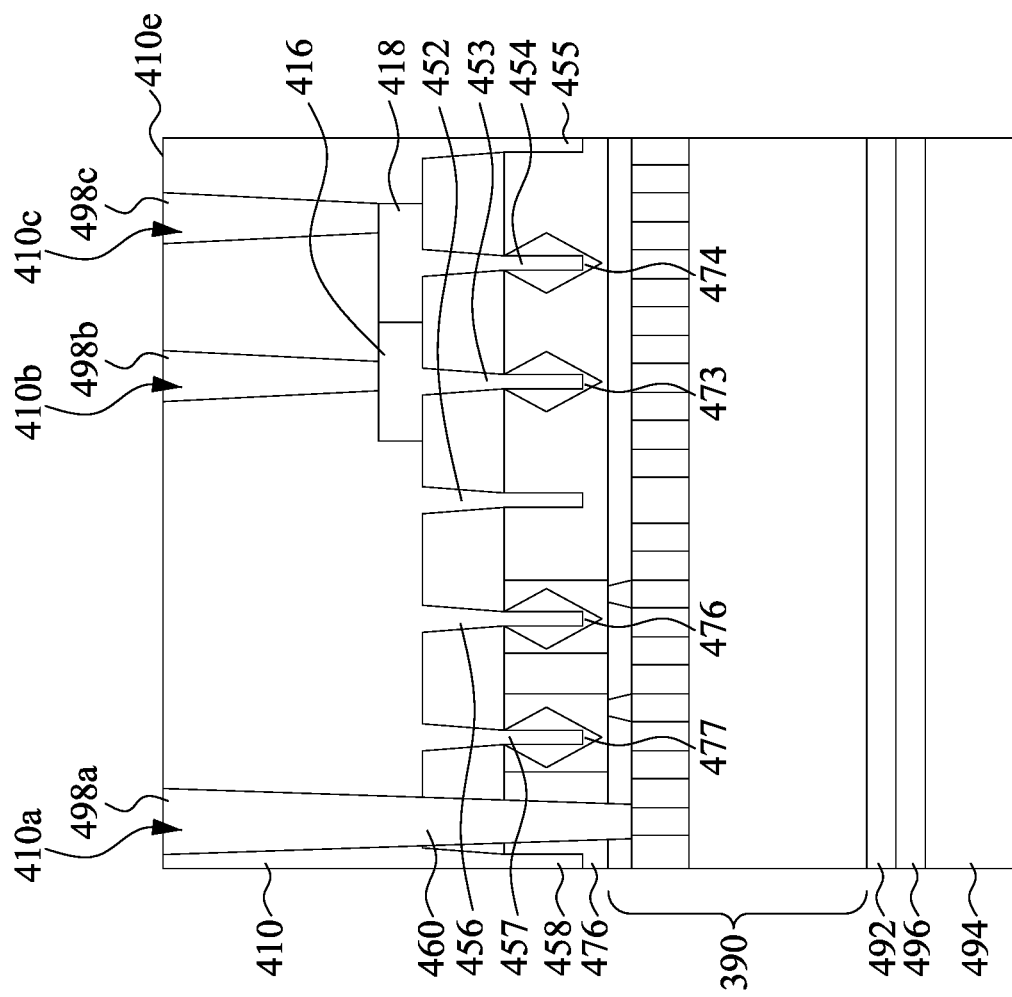

Reference is made to FIG. 55. Through substrate vias (TSVs) 498*a*, 498*b*, or 498*c* are formed in the TSV openings 410*a*, 410*b*, and 410*c*. As shown in FIG. 55, the TSV 498*a* is formed in the TSV opening 410*a* of the substrate 410 and in contact with the interconnect in the BEOL stack 490. The TSVs 498*b* and/or 498*c* is formed in the TSV opening 410*b* and/or 410*c* and in contact with the P-type well region 416 and/or the N-type well region 418. In some embodiments, the TSVs 498*b* and/or 498*c* may be used act as a conduction path to relieve the high currents and current densities during the ESD event to avoid breakdown of the circuits. Thus, the functional density can be increased while geometry size can be decreased due to without forming an ESD device on the front side of the wafer W4. In some embodiments, the TSVs 498*b* and/or 498*c* may be used act as a heat sink for the wafer W4 to discharge the heat generated by the semiconductor device from the well region to outside of the wafer W4.

In greater detail, the TSV 498*a*, 498*b*, and/or 498*c* is formed by using a metallization process as well as the use of metal electroplating techniques to fill high aspect ratio openings to avoid a seam or void defect. In some embodiments, in order to avoid diffusion of metal from the TSV metal into the silicon substrate, a barrier layer (not shown) is used between the insulation layer and the TSV metal. The barrier layer may line the TSV opening 410*a*, 410*b*, and/or 410*c*. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Then, the wafer W4 may be transferred to a plating tool, such as an electrochemical plating (ECP) tool, and a conductive layer is plated on the wafer W4 by the plating process to fill the TSV opening 410*a*, 410*b*, and/or 410*c*. While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may comprise various materials, such as tungsten, ruthenium, aluminum, gold, silver, and the like. In some embodiments, the conductive layer is a copper-containing layer formed over the copper seed layer.

Subsequently, the excess portions of the conductive layer, the metal seed layer, and the barrier layer are removed, either through etching, chemical mechanical polishing (CMP), or the like, forming the upper surface of the metal-filled opening substantially coplanar with the backside surface 410*e* of the substrate 410. The remaining portions of the conductive layer and the barrier layer in the TSV opening 410*a*, 410*b*, and/or 410*c* forms the TSV 498*a*, 498*b*, and/or 498*c*.

The TSV 498*b* and/or 498*c* is in contact with the P-type well region 416 and/or the N-type well region 418 and electrically connected to the TSV 498*a* that is connected to the BEOL stack 490. When an ESD event occurs on the TSV 498*a*, the TSV 498*b* and/or 498*c* is configured to provide a conductive path to the TSV 498*a*, which in turn allows for relieving the high currents and current densities during the ESD event, so as to avoid breakdown of the circuits. In some embodiments, the TSV 498*b* and/or 498*c* may also be referred to as an electrostatic discharge (ESD) protection circuit.

Figure 56:
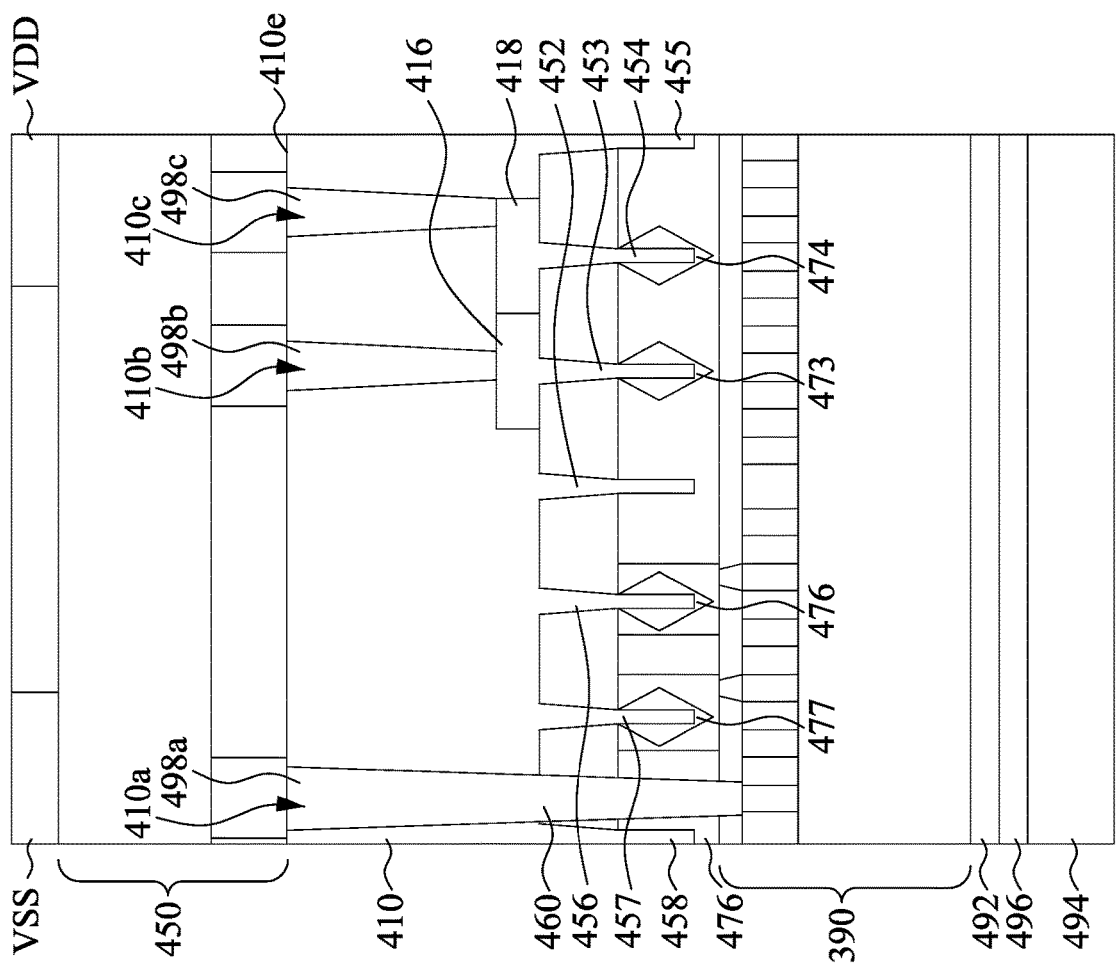

Reference is made to FIG. 56. A BEOL-type interconnect stack 450 and terminals VDD and VSS over the BEOL-type interconnect stack 450 are formed to connect the TSVs 498a, 498b, and 498c. In greater detail, a series of damascene process steps are performed for producing a BEOL-type interconnect stack 450 that connects the TSVs 498a, 498b, and 498c through a low resistive circuit to terminals VDD and VSS on the backside of the wafer W4. In some embodiments, BEOL-type interconnect stack 450 may be also referred to as a power delivery network of the wafer W4.

Figure 57:
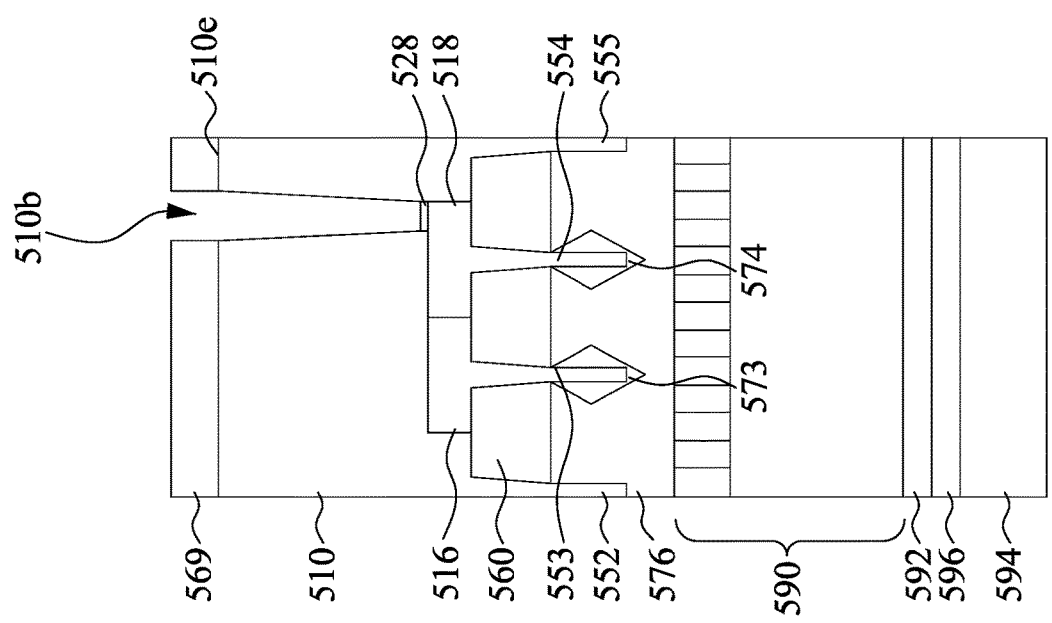
FIGS. 57-63 illustrate a method for manufacturing a semiconductor device at various stages in accordance with some embodiments of the present disclosure.

FIGS. 57 to 63 illustrate a method in various stages of fabricating a wafer W5 in accordance with some embodiments of the present disclosure. Operations for forming the wafer W5 prior to the structure shown in FIG. 57 are substantially the same as the operations for forming the wafer W2 shown in FIGS. 25-33 at stages S201-S209 of the method M2, and reference may be made to the foregoing paragraphs for the related detailed descriptions and such descriptions are not provided again herein. For example, material and manufacturing method of a substrate 510, a P-type well region 516, an N-type well region 518, semiconductor fins 552, 553, 554, and 555, an isolation dielectric 560, source/drain features 573 and 574, an ILD layer 576, a BEOL stack 590, a bonding layer 592, an carrier substrate 594, and a bonding layer 596 may be substantially the same as that of the substrate 210, the P-type well region 216, the N-type well region 218, semiconductor fins 252, 253, 254, and 255, the isolation dielectric 260, the source/drain features 273 and 274, the ILD layer 276, the BEOL stack 290, the bonding layer 292, the carrier substrate 294, and the bonding layer 296 as shown in FIGS. 25-33, and the related detailed descriptions may refer to the foregoing paragraphs, and are not described again herein.

Reference is made to FIG. 57. A patterned mask layer 569 is formed over a backside surface 510e of the substrate 510. In some embodiments, the mask layer 569 is formed by spin coating a resist material (e.g., the mask layer may be also referred to as a photo resist layer), followed by a process, such as a soft baking process and a hard baking process (may be also referred to as a pre-exposure baking). In some embodiments, the mask layer 569 is a DUV resist such as a krypton fluoride (KrF) resist or an argon fluoride (ArF) resist. In some embodiments, the mask layer 569 is an I-line resist, a EUV resist, an electron beam (e-beam) resist, or an ion beam resist. In some embodiments, the mask layer 569 is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer 569 is a negative resist. The negative resist is soluble in a developer but becomes insoluble upon radiation.

After coating the mask layer 569 over the substrate 510, the mask layer 569 is exposed to a radiation through a mask. After exposing the mask layer 569 to the radiation is complete, the exposed mask layer 469 undergoes one or more post-exposure baking (PEB) processes. Then, a developing process is performed, such that portions of the exposed mask layer 569 are removed to expose portions of the substrate 510 directly above the N-type well region 518. The mask layer 569 may act as an etch mask to protect the rest of the substrate 510 from the subsequent etching process.

Then, the TSV opening 510b is formed in the substrate 510 through the mask layer 569 until reaching the N-type well region 518 and may be used act as a conduction path to relieve the high currents and current densities during an electrostatic discharge (ESD) event to avoid breakdown of the circuits. In greater detail, the TSV opening 510b is formed with a high aspect ratio greater than about 5 in the substrate 510 by way of example but not limitation.

In some embodiments, the TSV opening 510b may be etched using any suitable etching method including, for example, a plasma etch, a chemical wet etch, a laser drill, and/or other processes. In some embodiments, the etching process includes a deep reactive ion etching (RIE) process to etch the substrate 510. The etching process may be such that the TSV opening 510b is etched from a backside surface 510e of the wafer W5 to reach approximately from tens of micron to hundreds of micron in depth. In some embodiments, the etching process may result in a series of etched macro-scallops on the substrate 510 adjacent to a sidewall of the TSV opening 510b. The micro-scallop sidewalls will be smoothened in subsequent process. By way of example but not limitation, the TSV opening 510b has a depth in a range from about 1 μm to about 100 μm, and a diameter in a range from about 0.1 μm to about 10 μm. By way of example but not limitation, the TSV opening 510b has an aspect ratio in a range from about 5 to about 10. In some embodiments, the aspect ratio of the TSV opening 510b may be greater than about 10. In some embodiments, in creating the TSV opening 510b with a high aspect ratio in the substrate 510, a series of etched macro-scallops (not shown) may be created on the sidewall of the substrate 510, which can vary in size depending on process parameter. The micro-scallop sidewalls will be smoothened in subsequent thermal oxidation process. In some embodiments, the TSV opening 510b has a rectangular plan-view profile (or top-view profile) as shown in FIG. 2. Alternatively, the TSV opening 510b may have a circular cross-section.

After the forming of the TSV opening 510b, a doping layer 528 is formed on the N-type well region 518 exposed by the TSV opening 510b, which in turn allows for having an improved ohmic contact for a TSV that will be formed in the TSV opening 510b. In some embodiments, the doping layer 528 is formed by an ion implantation process. By way of example and not limitation, the doping layer 528 may be formed by an implantation process having a dose that may be in a range from about 1e14 atoms/centimeter$^2$ to about 5e15 atoms/centimeter$^2$, and other dose ranges are within the scope of the disclosure. By way of example and not limitation, the doping layer 528 may be formed by an implantation process having a dose concentration that may be in a range from about 1e19 atoms/centimeter$^3$ to about 2e21 atoms/centimeter$^3$, and other dose ranges are within the scope of the disclosure. In some embodiments, the doping layer 528 is formed by selective diffusion. By way of example and not limitation, the doping layer 528 may include n-type dopants, such as phosphorus (P), arsenic (As), Antimony (Sb), or combinations thereof. After the forming of the doping layer 528, the mask layer 469 is removed.

Figure 58:
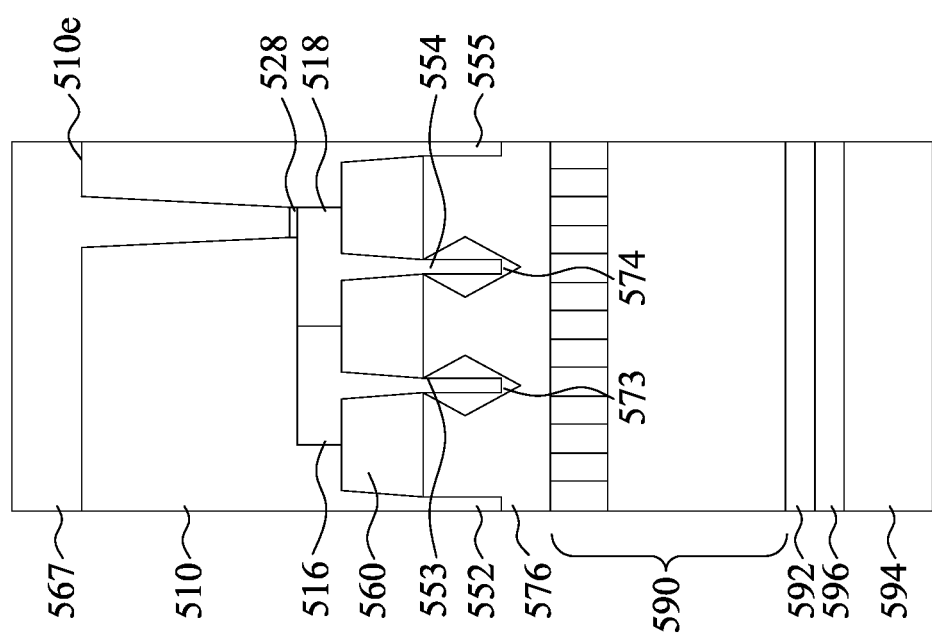

Reference is made to FIG. 58. A dielectric material 567, e.g. spin-on-glass (SOG), can be formed, covering the backside surface 510e of the substrate 510 and filling the TSV opening 510b. The dielectric material 567 can be defined by, for example, a spin-on process, a photolithographic process, and an etching process. In some embodiments, the dielectric material 567 may be made of silicon oxide, silicon nitride, silicon oxynitride, fluoride-doped silicate glass (FSG), or other low-K dielectric materials. In some embodiments, the dielectric material 567 may be formed using a high-density-plasma (HDP) chemical vapor deposition (CVD) process, using silane ($SiH_4$) and oxygen ($O_2$) as reacting precursors. In some other embodiments, the dielectric material 467 may be formed using a sub-atmospheric CVD (SACVD) process or high aspect-ratio process (HARP), in which process gases may include tetraethylorthosilicate (TEOS) and ozone ($O_3$). In yet other embodiments, the dielectric material 567 may be formed using a spin-on-dielectric (SOD) process, such as hydrogen silsesquioxane (HSQ) or methyl silsesquioxane (MSQ). Other processes and materials may be used. In some embodiments, the dielectric material 567 can have a multi-layer structure, for example, a thermal oxide liner layer with silicon nitride formed over the liner. Thereafter, a thermal annealing may be optionally performed to the dielectric material 567.

Figure 59:
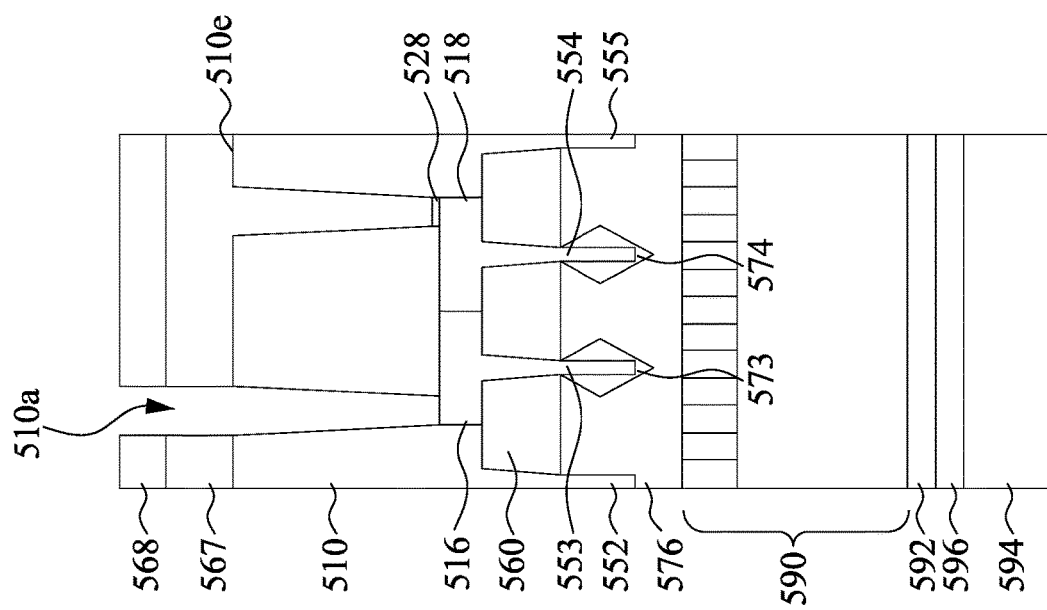

Reference is made to FIG. 59. A patterned photoresist layer 568 is formed on the dielectric material 567. Then, an etching process is performed through the patterned photoresist layer 568, such that a TSV opening 510a is formed in the substrate 510 through the photoresist layer 568 until reaching the P-type well region 516 and may be used act as a conduction path to relieve the high currents and current densities during an electrostatic discharge (ESD) event to avoid breakdown of the circuits. In greater detail, the TSV opening 510a is formed with a high aspect ratio greater than about 5 in the substrate 510 by way of example but not limitation.

In some embodiments, the TSV opening 510a may be etched using any suitable etching method including, for example, a plasma etch, a chemical wet etch, a laser drill, and/or other processes. In some embodiments, the etching process includes a deep reactive ion etching (RIE) process to etch the substrate 510. The etching process may be such that the TSV opening 510a is etched from a backside surface 510e of the wafer W5 to reach approximately from tens of micron to hundreds of micron in depth. In some embodiments, the etching process may result in a series of etched macro-scallops on the substrate 510 adjacent to a sidewall of the TSV opening 510a. The micro-scallop sidewalls will be smoothened in subsequent process. By way of example but not limitation, the TSV opening 510a has a depth in a range from about 1 μm to about 100 μm, and a diameter in a range from about 0.1 μm to about 10 μm. By way of example but not limitation, the TSV opening 510a has an aspect ratio in a range from about 5 to about 10. In some embodiments, the aspect ratio of the TSV opening 510a may be greater than about 10. In some embodiments, in creating the TSV opening 510a with a high aspect ratio in the substrate 510, a series of etched macro-scallops (not shown) may be created on the sidewall of the substrate 510, which can vary in size depending on process parameter. The micro-scallop sidewalls will be smoothened in subsequent thermal oxidation process. In some embodiments, the TSV opening 510a has a rectangular plan-view profile (or top-view profile) as shown in FIG. 2. Alternatively, the TSV opening 510a may have a circular cross-section.

Figure 60:
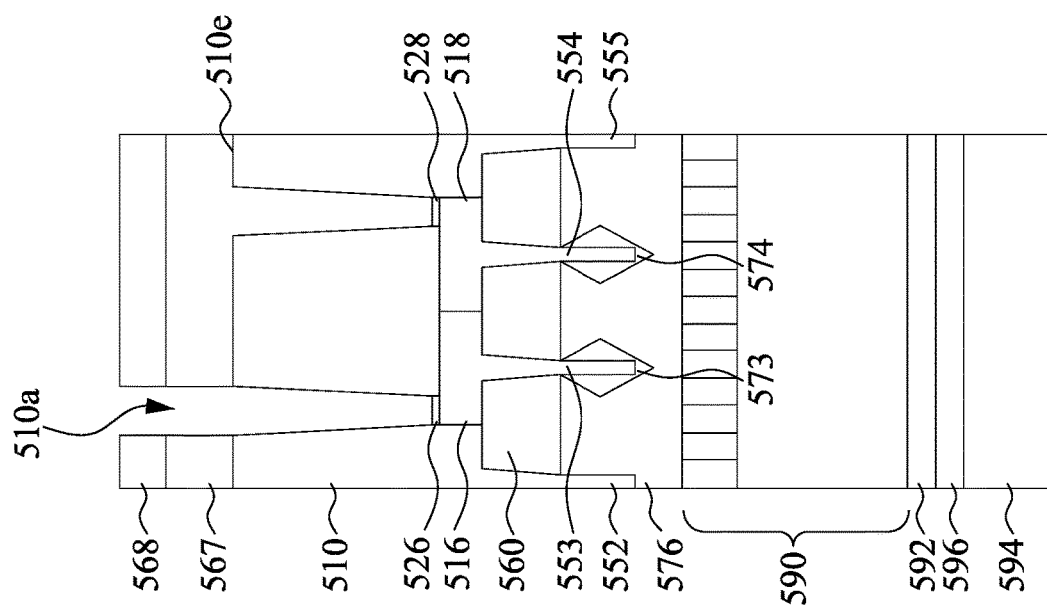

Reference is made to FIG. 60. After the forming of the TSV opening 510a, a doping layer 526 is formed on the P-type well region 516 exposed by the TSV opening 510a, which in turn allows for having an improved ohmic contact for a TSV that will be formed in the TSV opening 510a. In some embodiments, the doping layer 526 is formed by an ion implantation process. By way of example and not limitation, the doping layer 526 may be formed by an implantation process having a dose that may be in a range from about 1e14 atoms/$centimeter^2$ to about 5e15 atoms/$centimeter^2$, and other dose ranges are within the scope of the disclosure. By way of example and not limitation, the doping layer 526 may be formed by an implantation process having a dose concentration that may be in a range from about 1e19 atoms/$centimeter^3$ to about 2e21 atoms/$centimeter^3$, and other dose concentration ranges are within the scope of the disclosure. In some embodiments, the doping layer 526 is formed by selective diffusion. By way of example and not limitation, the doping layer 526 may include p-type dopants, such as boron (B), gallium (Ga), or combinations thereof. After the forming of the doping layer 526, the dielectric material 567 and the photoresist layer 568 are removed.

Figure 61:
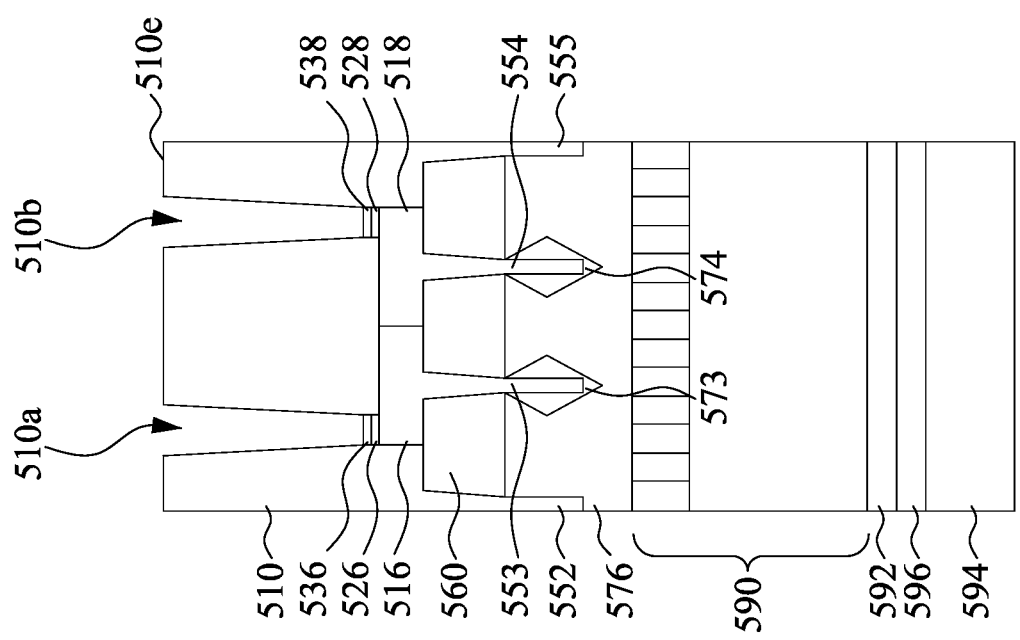

Reference is made to FIG. 61. A silicide layer 536 and/or 538 is formed on the doping layer 526 and/or the 528 by a metal silicidation process. The metal silicidation process is to make a reaction between metal and silicon (or polycrystalline silicon). In FIG. 61, a metal layer is formed on the doping layer 526 and the 528. Then, regarding the metal silicidation process, a first rapid thermal annealing (RTA) process may be performed in, for example, Ar, He, $N_2$ or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming a stable silicide layer 536 and/or 538 with low resistance. In some embodiments, the silicide layer 536 and/or 538 may include titanium silicide (TiSi), nickel silicide (NiSi), cobalt silicide (CoSi), Ni—Pt, or combinations thereof.

Figure 62:
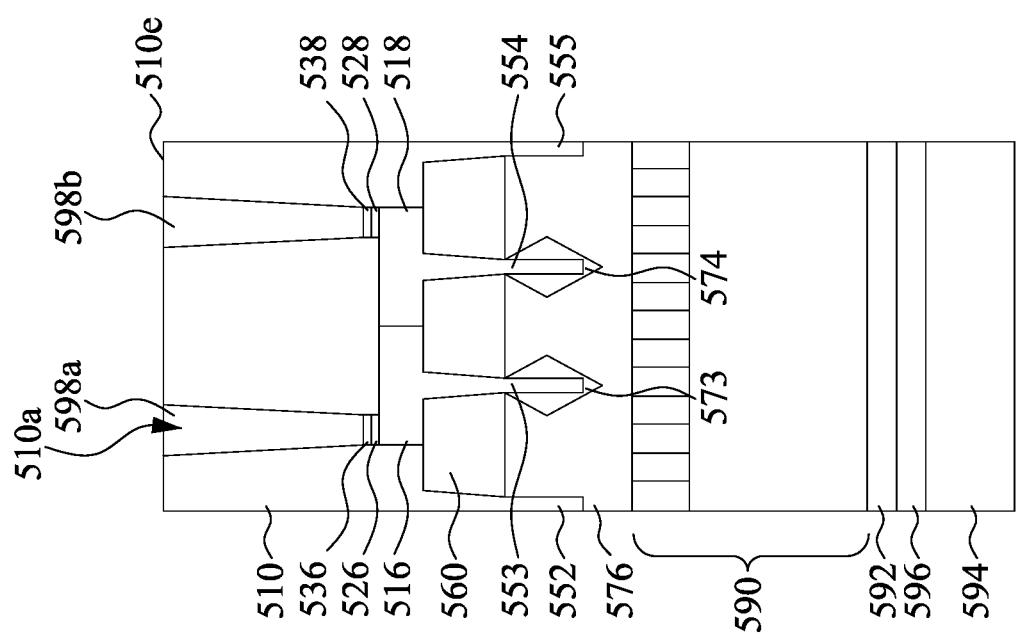

Reference is made to FIG. 62. Through substrate vias (TSVs) 598a and 598b are formed in the TSV openings 510a and 510b of the substrate 510 and in contact with the silicide layers 536 and 538. In some embodiments, the TSVs 598a and 598b may be used act as a conduction path to relieve the high currents and current densities during the ESD event to avoid breakdown of the circuits. Thus, the functional density can be increased while geometry size can be decreased due to without forming an ESD device on the front side of the wafer W5. In some embodiments, the TSVs 598a and 598b may be used act as a heat sink for the wafer W5 to discharge the heat generated by the semiconductor device to outside of the wafer W5.

In greater detail, the TSV 598a and/or 598b is formed by using a metallization process as well as the use of metal electroplating techniques to fill high aspect ratio openings to avoid a seam or void defect. In some embodiments, in order to avoid diffusion of metal from the TSV metal into the silicon substrate, a barrier layer (not shown) is used between the insulation layer and the TSV metal. The barrier layer may line the TSV opening 510a and/or 510b. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Then, the wafer W5 may be transferred to a plating tool, such as an electrochemical plating (ECP) tool, and a conductive layer is plated on the wafer W1 by the plating process to fill the TSV opening 510a and/or 510b. While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may comprise various materials, such as tungsten, ruthenium, aluminum, gold, silver, and the like. In some embodiments, the conductive layer is a copper-containing layer formed over the copper seed layer.

Subsequently, the excess portions of the conductive layer, the metal seed layer, and the barrier layer are removed, either through etching, chemical mechanical polishing (CMP), or the like, forming the upper surface of the metal-filled opening substantially coplanar with the backside surface 510e of the substrate 510. The remaining portions of the conductive layer and the barrier layer in the TSV opening 510a and/or 510b forms the TSV 598a and/or 598b.

The TSV 598a and/or 598b is in contact with the P-type well region 516 and/or the N-type well region 518. When an ESD event occurs, the TSV 598a and/or 598b is configured to provide a conductive path, which in turn allows for relieving the high currents and current densities during the ESD event, so as to avoid breakdown of the circuits. In some embodiments, the TSV 598a and/or 598b may also be referred to as an electrostatic discharge (ESD) protection circuit.

Figure 63:
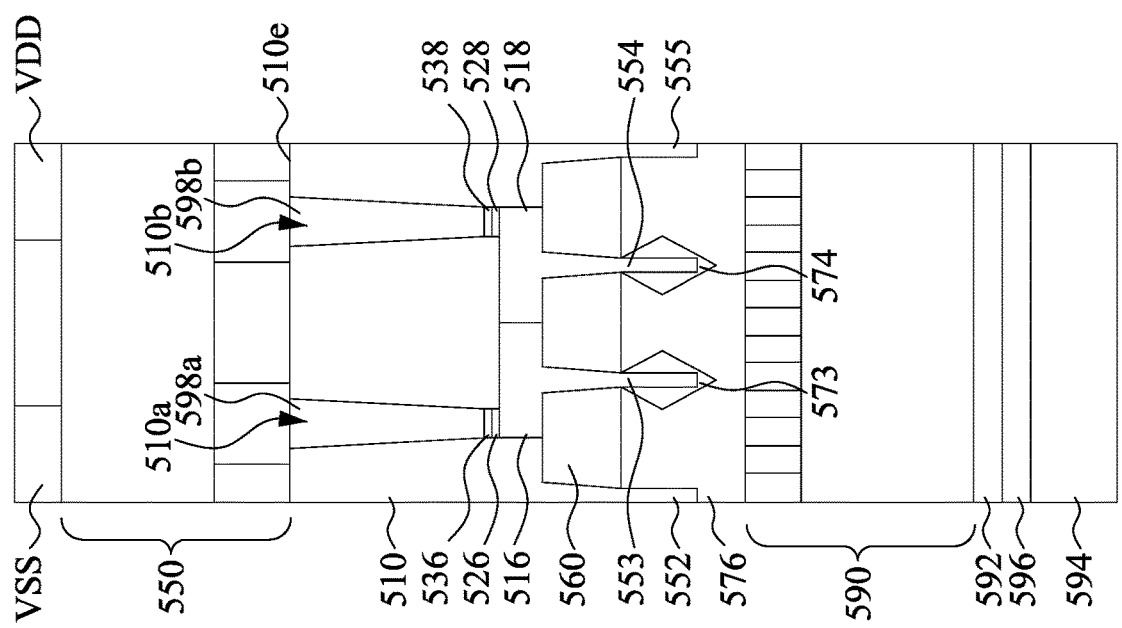

Reference is made to FIG. 63. A BEOL-type interconnect stack 550 and terminals VDD and VSS over the BEOL-type interconnect stack 550 are formed to connect the buried power rails. In greater detail, a series of damascene process steps are performed for producing a BEOL-type interconnect stack 550 that connects the TSVs 598a and 598b through a low resistive circuit to terminals VDD and VSS on the backside of the wafer W5. In some embodiments, BEOL-type interconnect stack 550 may be also referred to as a power delivery network of the wafer W5.

Based on the above discussions, it can be seen that the present disclosure offers advantages. It is understood, however, that other embodiments may offer additional advantages, and not all advantages are necessarily disclosed herein, and that no particular advantage is required for all embodiments. The through silicon via of the present disclosure is formed to extend from the backside of the wafer to embed in the well region. An advantage is that the TSV of the present disclosure may be used act as a conduction path to relieve the high currents and current densities during the ESD event to avoid breakdown of the circuits. Thus, the functional density can be increased while geometry size can be decreased due to without forming an ESD device on the front side of the wafer. Another advantage is that the TSV of the present disclosure may be used act as a heat sink for the wafer to discharge the heat generated by the semiconductor device from the well region to outside of the wafer.

In some embodiments, a semiconductor device includes a substrate, a semiconductor fin, a shallow trench isolation (STI) structure, a source/drain structure, a first buried power line, a contact, a first through substrate via (TSV), and a second TSV. The substrate has a well region extending a frontside surface of the substrate into the substrate. The semiconductor fin is on the well region. The STI structure laterally surrounds a lower portion of the semiconductor fin. The source/drain structure is on the semiconductor fin. The first buried power line is electrically coupled to the source/drain structure on the first semiconductor fin. The first buried power line has a length extending along a lengthwise direction of the first semiconductor fin and a height extending from within the STI structure to within the well region. The first TSV extends from a backside surface of the substrate through the substrate to the first buried power line. The second TSV extends from the backside surface of the substrate to the well region. In some embodiments, in a plan view, the second TSV is between the first semiconductor fin and the first buried power line. In some embodiments, the semiconductor device further includes a second semiconductor fin on the well region, wherein in a plan view, the second TSV is between with the first and second semiconductor fins. In some embodiments, the semiconductor device further includes a second buried power line having a length extending along the lengthwise direction of the first semiconductor fin, wherein the first semiconductor fin is between the second buried power line and the first buried power line. In some embodiments, in a plan view, the second TSV non-overlaps the first semiconductor fin. In some embodiments, the semiconductor device further includes a gate structure extending across the first semiconductor fin, wherein in a plan view, the second TSV overlaps the gate structure. In some embodiments, the second TSV has substantially the same depth as the first TSV. In some embodiments, an interface formed by the first TSV and the first buried power line is substantially level with an interface formed by the well region and the second TSV. In some embodiments, the well region is an N-type well region. In some embodiments, the well region is a P-type well region.

In some embodiments, a semiconductor device includes a substrate, a first semiconductor fin, a second semiconductor fin, a first through substrate via (TSV), and a second TSV. The substrate has a P-type well region and an N-type well region adjacent to the P-type well region, wherein the P-type well region and the N-type well region extend form a frontside surface of the substrate into the substrate. The first semiconductor fin is disposed on the P-type well region. The second semiconductor fin is disposed on the N-type well region. The first TSV extends from a backside surface of the substrate to the P-type well region. The second TSV extends from the backside surface of the substrate to the N-type well region. In some embodiments, the semiconductor device further includes a third semiconductor fin, a source/drain structure, a buried power line, a source/drain contact, and a third TSV. The third semiconductor fin is on the substrate. The source/drain structure is on the third semiconductor fin. The buried power line is partially embedded in the substrate. The source/drain contact is electrically connected the source/drain structure to the buried power line. The third TSV extends from the backside surface of the substrate to the buried power line. In some embodiments, the semiconductor device further includes a third semiconductor fin, first and second source/drain structures, a BEOL stack, and a third TSV. The third semiconductor fin is over the substrate. The first and second source/drain structures are respectively on the first and third semiconductor fins. The BEOL stack is over the first and second source/drain structures. The third TSV extends from the backside surface of the substrate to the BEOL stack. In some embodiments, the semiconductor device further includes a doping layer between the first TSV and the P-type well region and doped with a p-type dopant.

In some embodiments, the semiconductor device further includes a doping layer between the second TSV and the N-type well region and doped with an n-type dopant. In some embodiments, the semiconductor device further includes a metal silicide layer between the first TSV and the P-type well region.

In some embodiments, a method for forming a semiconductor device includes: forming a well region extending from a frontside surface of a substrate into the substrate; forming a semiconductor fin on the well region; forming a source/drain structure on the semiconductor fin; etching a trench in the well region; forming a buried power line in the trench of the well region; forming a source/drain contact electrically connecting the source/drain structure to the buried power line; performing an etching process on a backside surface of the substrate to form a plurality of openings that expose the buried power line and the well region; and filling the plurality of openings with a conductive material to form a plurality of through silicon vias. In some embodiments, the buried power line is used as an etch stop layer during the etching process. In some embodiments, the method further includes: after performing the etching process, doping the well region with a dopant through the opening. In some embodiments, after performing the etching process, forming a metal silicide layer on the well region through the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a well region extending from a frontside surface of a substrate into the substrate;
    forming a semiconductor fin on the well region;
    forming a source/drain structure on the semiconductor fin;
    etching a trench in the well region;
    forming a buried power line in the trench of the well region;
    forming a source/drain contact electrically connecting the source/drain structure to the buried power line;
    performing an etching process on a backside surface of the substrate to form a plurality of openings that expose the buried power line and the well region;
    after performing the etching process, doping the well region with a dopant through the openings; and
    filling the plurality of openings with a conductive material to form a plurality of through silicon vias.

2. The method of claim 1, wherein the buried power line is used as an etch stop layer during the etching process.

3. The method of claim 1, further comprising:
    after performing the etching process, forming a metal silicide layer on the well region through the openings.

4. A method for forming a semiconductor device, comprising:
    doping a first conductive type dopant into a semiconductive substrate from a front-side of the semiconductive substrate to form a first conductive type well region;
    doping a second conductive type dopant into the semiconductive substrate from the front-side of the semiconductive substrate to form a second conductive type well region, the second conductive type dopant having an opposite conductive type to the first conductive type dopant;
    forming a first channel pattern on the first conductive type well region, and a second channel pattern on the second conductive type well region;
    forming a gate pattern extending across the first and second channel patterns;
    forming a plurality of first source/drain patterns on the first channel pattern and at opposite sides of the gate pattern, a plurality of second source/drain patterns on the second channel pattern and at opposite sides of the gate pattern;
    forming a first through substrate via (TSV) extending from a back-side of the semiconductive substrate to the first conductive type well region; and
    forming a buried power rail having a lower portion in the first conductive type well region from the front-side of the semiconductive substrate and having a length extending along a lengthwise direction of the first channel pattern from a top view, wherein the first TSV non-overlaps the buried power rail from the top view.

5. The method of claim 4, wherein the first TSV is between the first and second channel patterns from a top view.

6. The method of claim 4, wherein the first TSV overlaps with the gate pattern from a top view.

7. The method of claim 4, wherein the first TSV overlaps an interface formed by the first and second conductive type well regions from a top view.

8. The method of claim 4, further comprising:
    forming a second TSV extending from the back-side of the semiconductive substrate to the second conductive type well region.

9. The method of claim 4, further comprising:
    forming a source/drain contact extending from one of the first source/drain patterns to the buried power rail from the front-side of the semiconductive substrate.

10. The method of claim 4, further comprising:
    forming a second TSV extending from the back-side of the semiconductive substrate to the buried power rail.

11. The method of claim 10, wherein an interface formed by the first TSV and the first conductive type well region is in a same level height as an interface formed by the second TSV and the buried power rail.

12. The method of claim 4, wherein the first TSV non-overlaps the buried power rail.

13. A method for forming a semiconductor device, comprising:
    forming first and second fins on a well region in a semiconductive substrate from a front-side of the semiconductive substrate;
    forming a gate structure extending across the first and second fins;
    growing first epitaxial structures on the first fin, and second epitaxial structures on the second fin;

forming a metal contact on one of the first epitaxial structures from the front-side of the semiconductive substrate;

forming a front-side interconnect stack over the metal contact and electrically connected to the metal contact; and forming a first through substrate via (TSV) extending from a back-side of the semiconductive substrate to the well region underlying the second fin, wherein a front-side surface of the first TSV forms an interface with the well region in the semiconductive substrate.

14. The method of claim 13, further comprising:

forming a buried power rail in the semiconductive substrate from the front-side of the semiconductive substrate, wherein the metal contact extends from the one of the first epitaxial structures to the buried power rail.

15. The method of claim 14, further comprising:

forming a second TSV extending from the back-side of the semiconductive substrate to the buried power rail.

16. The method of claim 13, further comprising:

forming a second TSV extending from the back-side of the semiconductive substrate through the front-side of the semiconductive substrate to the front-side interconnect stack.

17. The method of claim 13, further comprising:

before forming the first TSV, forming a doped silicon layer on a back-side of the well region where the first TSV will be formed thereon.

18. The method of claim 13, further comprising:

before forming the first TSV, forming a metal silicide layer on a back-side of the well region where the first TSV will be formed thereon.

19. The method of claim 14, wherein the first TSV non-overlaps the buried power rail.

20. The method of claim 13, further comprising:

forming a second TSV extending from the back-side of the semiconductive substrate to the well region and adjacent to the first TSV.

* * * * *